United States Patent
Tran et al.

(10) Patent No.: US 11,755,899 B2
(45) Date of Patent: Sep. 12, 2023

(54) PRECISE PROGRAMMING METHOD AND APPARATUS FOR ANALOG NEURAL MEMORY IN AN ARTIFICIAL NEURAL NETWORK

(71) Applicant: Silicon Storage Technology, Inc., San Jose, CA (US)

(72) Inventors: Hieu Van Tran, San Jose, CA (US); Steven Lemke, Boulder Creek, CA (US); Vipin Tiwari, Dublin, CA (US); Nhan Do, Saratoga, CA (US); Mark Reiten, Alamo, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 607 days.

(21) Appl. No.: 16/751,202

(22) Filed: Jan. 23, 2020

(65) Prior Publication Data
US 2021/0142156 A1 May 13, 2021

Related U.S. Application Data

(60) Provisional application No. 62/933,809, filed on Nov. 11, 2019.

(51) Int. Cl.
| | |
|---|---|
| *G11C 16/04* | (2006.01) |
| *G06N 3/065* | (2023.01) |
| *G06F 17/16* | (2006.01) |
| *G11C 16/10* | (2006.01) |
| *G11C 16/34* | (2006.01) |
| *G11C 16/26* | (2006.01) |
| *G11C 11/56* | (2006.01) |
| *G11C 16/14* | (2006.01) |
| *G06N 3/044* | (2023.01) |

(52) U.S. Cl.
CPC ............. *G06N 3/065* (2023.01); *G06F 17/16* (2013.01); *G06N 3/044* (2023.01); *G11C 11/5628* (2013.01); *G11C 11/5635* (2013.01); *G11C 16/0425* (2013.01); *G11C 16/10* (2013.01); *G11C 16/14* (2013.01); *G11C 16/26* (2013.01); *G11C 16/3459* (2013.01); *G11C 2216/04* (2013.01)

(58) Field of Classification Search
CPC .................................................. G11C 11/5628
See application file for complete search history.

(56) References Cited

U.S. PATENT DOCUMENTS

| | | | |
|---|---|---|---|
| 5,029,130 A | 7/1991 | Yeh | |
| 6,747,310 B2 * | 6/2004 | Fan | G11C 16/0425 257/E27.103 |
| 10,079,061 B2 * | 9/2018 | Qian | G11C 16/12 |

(Continued)

FOREIGN PATENT DOCUMENTS

EP 3 086 322 10/2016

*Primary Examiner* — Douglas King
(74) *Attorney, Agent, or Firm* — DLA PIPER LLP US

(57) ABSTRACT

Numerous embodiments of a precision programming algorithm and apparatus are disclosed for precisely and quickly depositing the correct amount of charge on the floating gate of a non-volatile memory cell within a vector-by-matrix multiplication (VMM) array in an artificial neural network. Selected cells thereby can be programmed with extreme precision to hold one of N different values.

15 Claims, 52 Drawing Sheets

(56) References Cited

U.S. PATENT DOCUMENTS

| | | | |
|---|---|---|---|
| 2009/0303792 A1* | 12/2009 | Ho | G11C 11/5628 365/185.18 |
| 2010/0002514 A1* | 1/2010 | Lutze | G11C 16/10 365/185.17 |
| 2010/0118613 A1* | 5/2010 | Chun | G11C 16/344 365/185.33 |
| 2010/0195387 A1* | 8/2010 | Park | G11C 11/5628 365/185.03 |
| 2014/0269058 A1* | 9/2014 | Liu | G11C 16/3459 365/185.03 |
| 2016/0372185 A1* | 12/2016 | Shim | G11C 16/0483 |
| 2017/0337466 A1 | 11/2017 | Bayat et al. | |
| 2019/0164617 A1 | 5/2019 | Tran et al. | |
| 2019/0287621 A1* | 9/2019 | Tran | G11C 16/16 |
| 2019/0341110 A1* | 11/2019 | Tran | G11C 16/30 |
| 2020/0119028 A1* | 4/2020 | Tran | H01L 27/11531 |
| 2021/0118894 A1* | 4/2021 | Tran | H01L 29/7883 |
| 2021/0142156 A1* | 5/2021 | Tran | G11C 16/3459 |
| 2021/0264983 A1* | 8/2021 | Lemke | G11C 16/107 |
| 2021/0295907 A1* | 9/2021 | Tran | G11C 11/54 |
| 2021/0375364 A1* | 12/2021 | Liikanen | G11C 16/10 |
| 2021/0383870 A1* | 12/2021 | Tseng | G11C 16/10 |
| 2022/0215239 A1* | 7/2022 | Tran | G06F 7/523 |

* cited by examiner

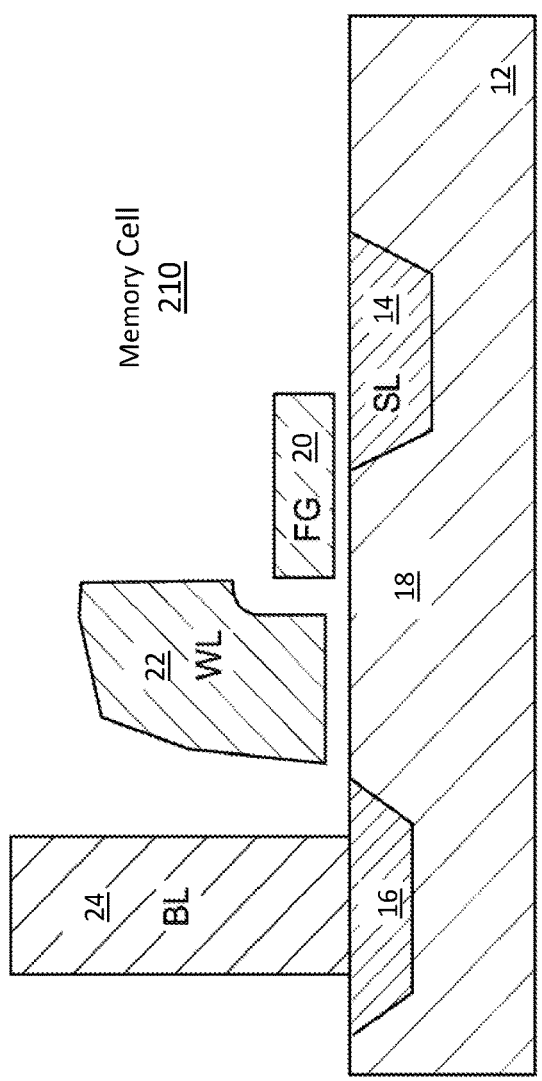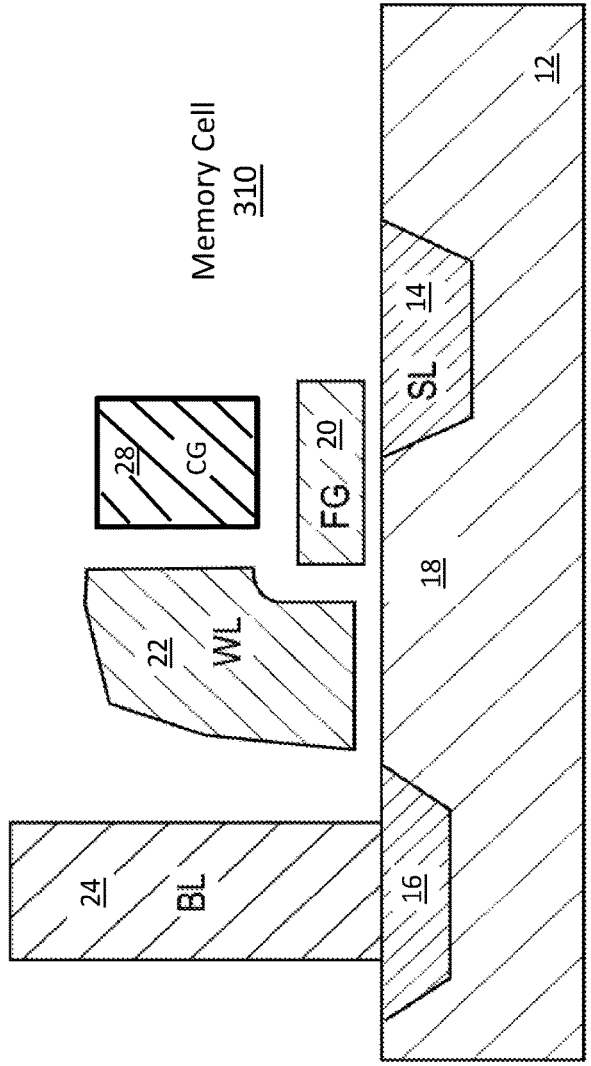
FIGURE 2
(PRIOR ART)
FIGURE 3
(PRIOR ART)

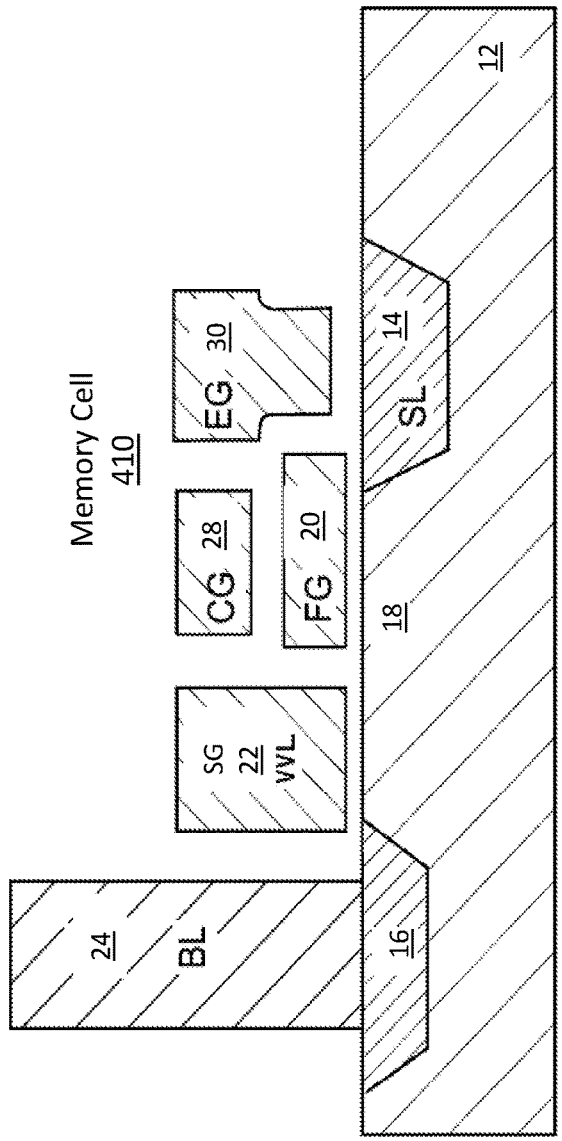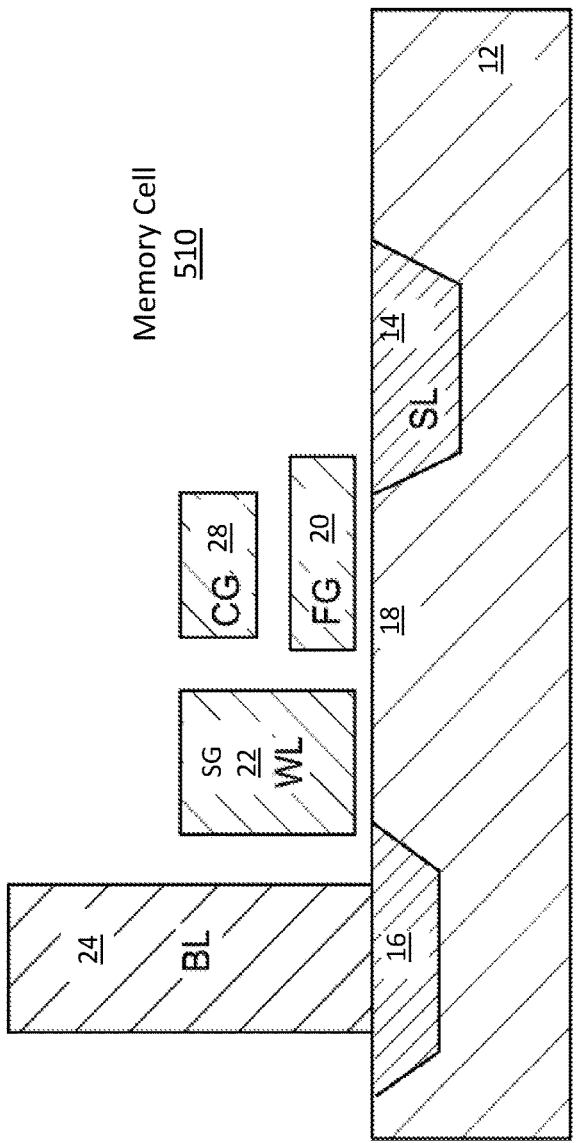
FIGURE 4
(PRIOR ART)
FIGURE 5
(PRIOR ART)

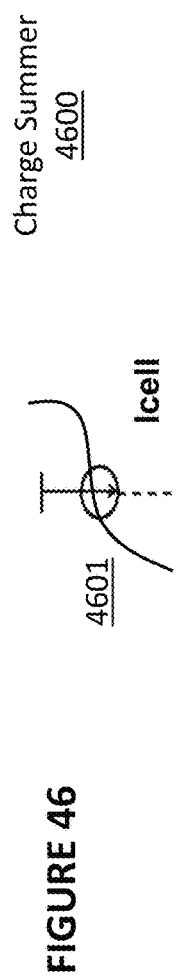
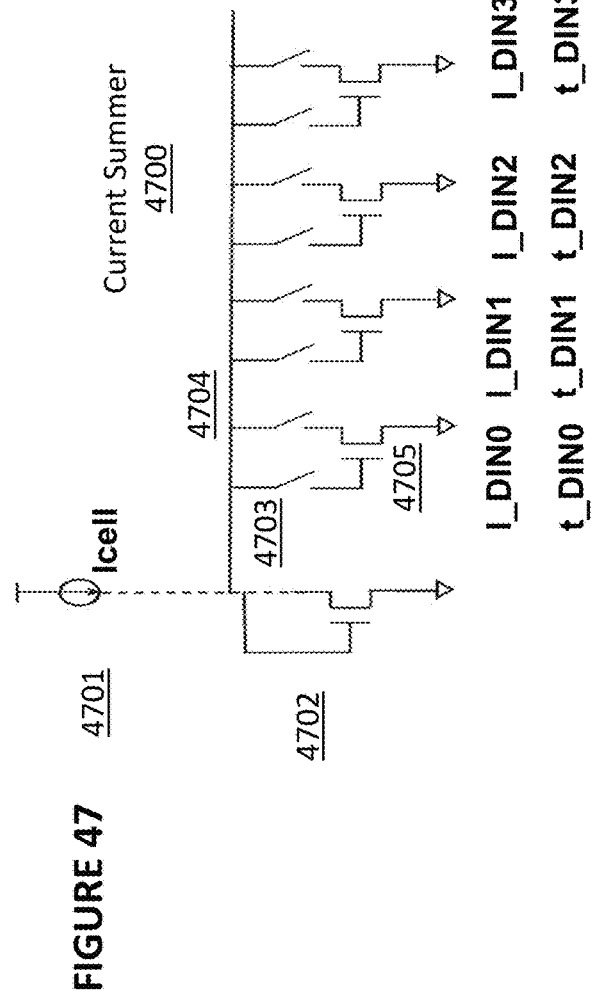
FIGURE 46
FIGURE 47

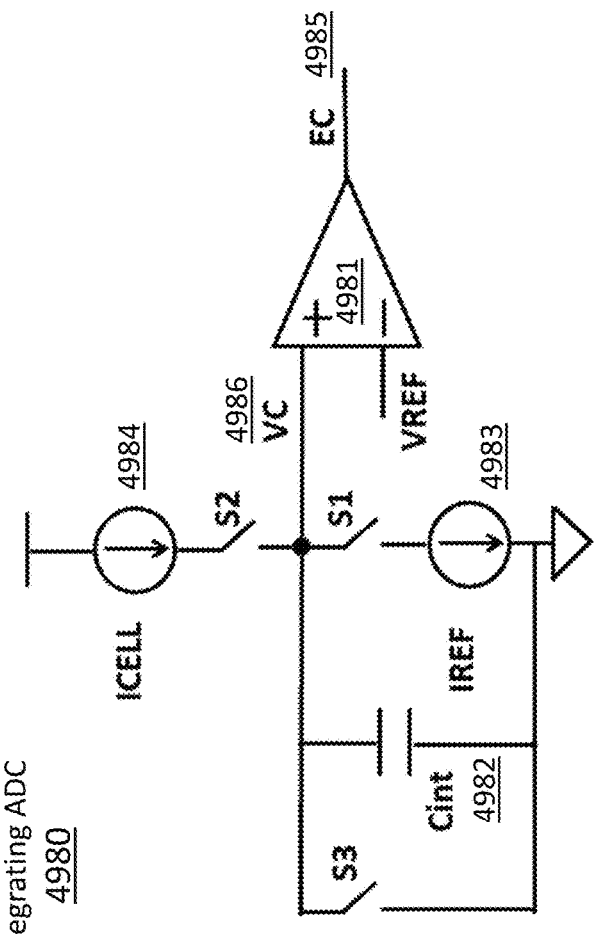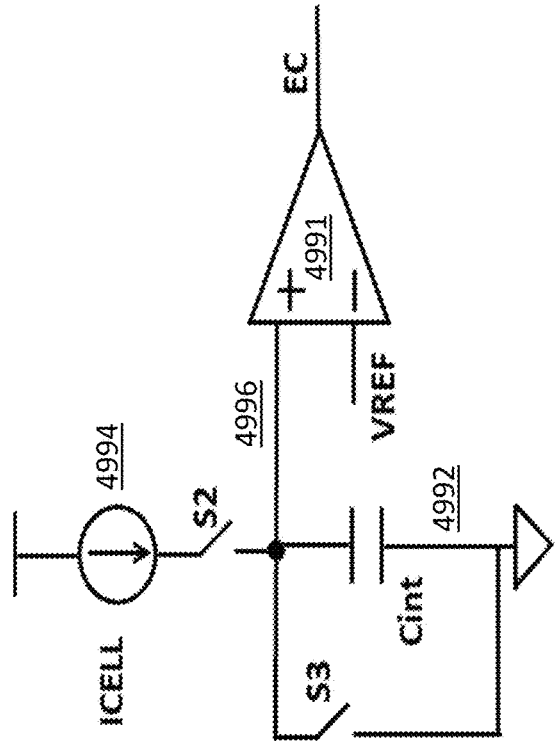
FIGURE 49E
FIGURE 49F

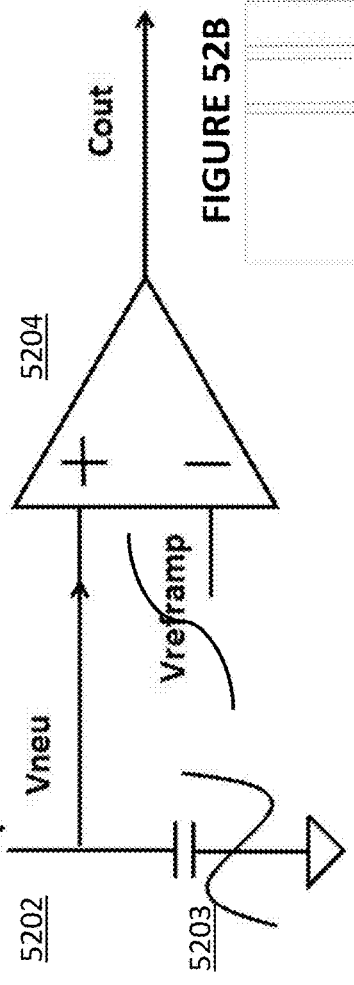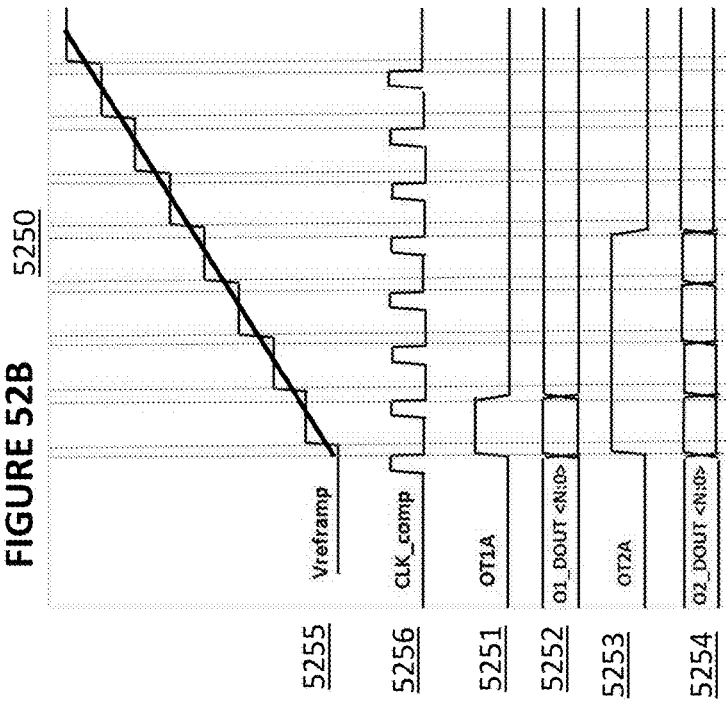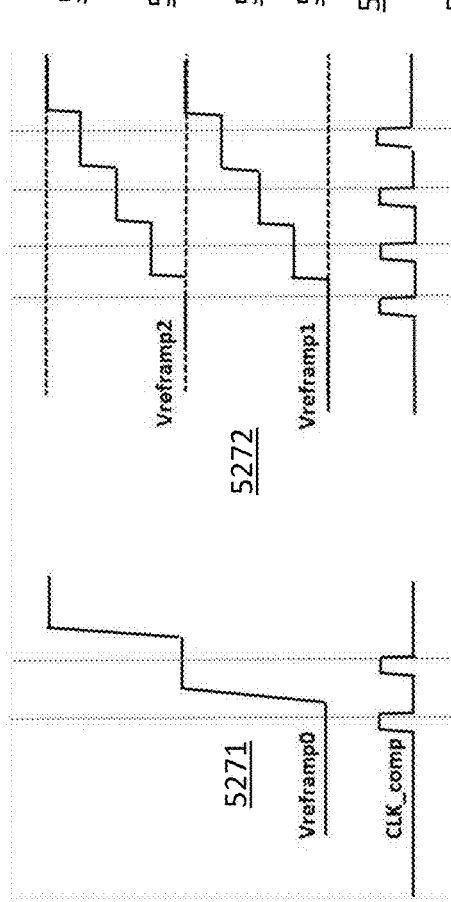

FIGURE 55

Method 5500 of
Programming Logical
Multi-Bit Cell 5400

5501: $j$ of the $i$ physical cells 5401-1, ..., 5401-i are programmed and verified using any of the coarse programming methods 3305 until a coarse current target for the $j$ physical cells or a coarse current target for the $i$ physical cells is achieved.

5502: $k$ of the $i$ physical cells are programmed and verified using any of the precision programming methods 3306 until a precision current target for the $k$ physical cells or a precision current target for the $i$ physical cells is achieved.

PRECISE PROGRAMMING METHOD AND APPARATUS FOR ANALOG NEURAL MEMORY IN AN ARTIFICIAL NEURAL NETWORK

PRIORITY CLAIM

This application claims priority to U.S. Provisional Patent Application No. 62/933,809, filed on Nov. 11, 2019, and titled, "PRECISE PROGRAMMING METHOD AND APPARATUS FOR ANALOG NEURAL MEMORY IN A DEEP LEARNING ARTIFICIAL NEURAL NETWORK," which is incorporated by reference herein.

FIELD OF THE INVENTION

Numerous embodiments of a precision programming algorithm and apparatus are disclosed for precisely and quickly depositing the correct amount of charge on the floating gate of a non-volatile memory cell within a vector-by-matrix multiplication (VMM) array in an artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Each non-volatile memory cell used in the analog neuromorphic memory array must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256. One challenge in an analog neuromorphic memory system is the ability to program selected cells with the precision and granularity required for different values of N.

What is needed are improved programming systems and methods suitable for use with a VMM array in an analog neuromorphic memory.

SUMMARY OF THE INVENTION

Numerous embodiments of a precision programming algorithm and apparatus are disclosed for precisely and quickly depositing the correct amount of charge on the floating gate of a non-volatile memory cell within a vector-by-matrix multiplication (VMM) array in an analog neuromorphic memory. Selected cells thereby can be programmed with extreme precision to hold one of N different values.

BRIEF DESCRIPTION OF THE DRAWINGS

FIG. 2 depicts a prior art split gate flash memory cell.

FIG. 3 depicts another prior art split gate flash memory cell

FIG. 4 depicts another prior art split gate flash memory cell.

FIG. 5 depicts another prior art split gate flash memory cell

FIG. 46 depicts a charge summer circuit.

FIG. 47 depicts a current summer circuit.

FIG. 49E depicts another embodiment of an integrating analog-to-digital converter for a neuron output.

FIG. 49F depicts another embodiment of an integrating analog-to-digital converter for a neuron output.

FIGS. 52A, 52B, and 52C depict an embodiment of a ramp analog-to-digital converter.

FIG. 55 depicts a method of programming the logical multi-bit cell of FIG. 54.

DETAILED DESCRIPTION OF THE INVENTION

Figure 1:
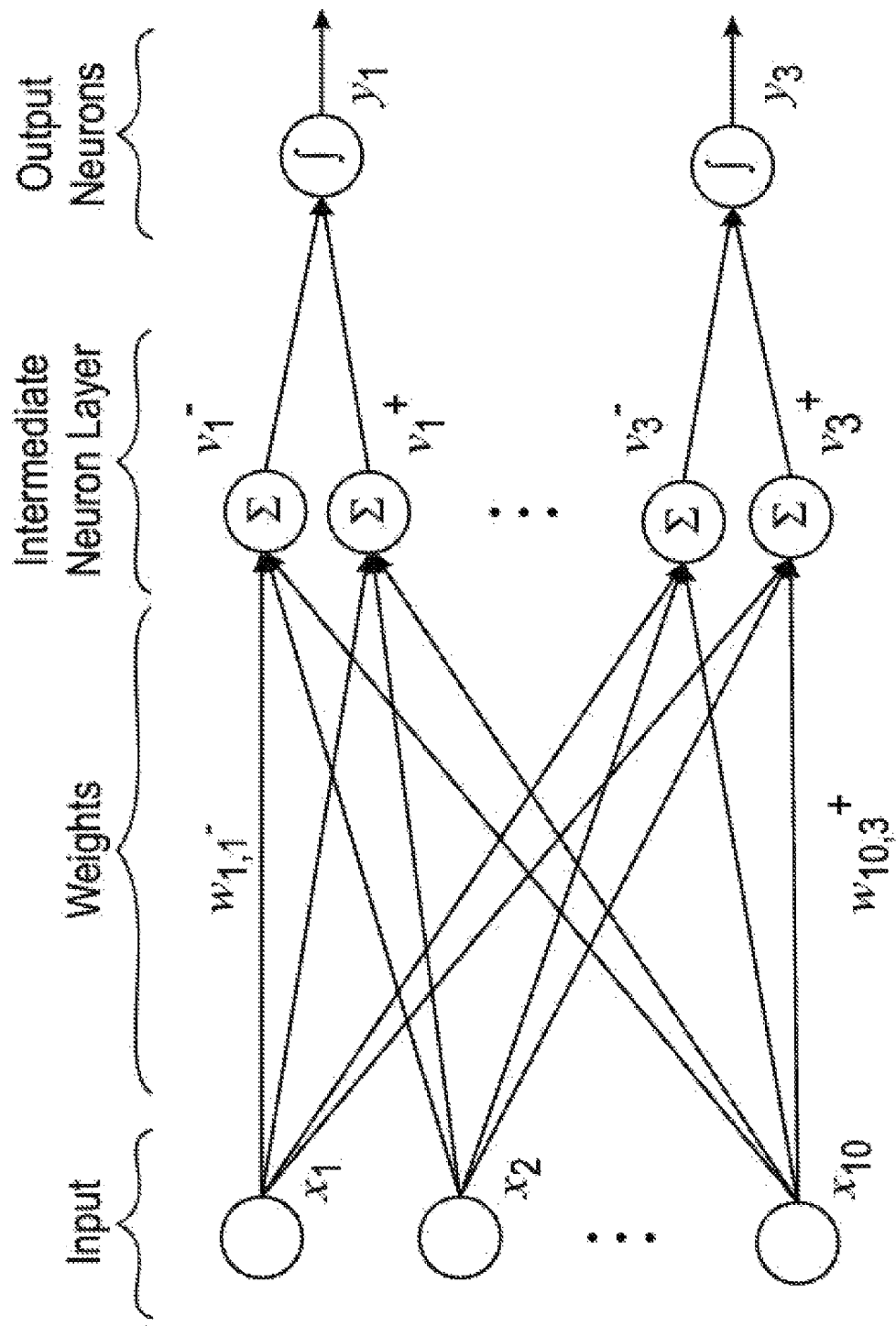
FIG. 1 is a diagram that illustrates a prior art artificial neural network.

The artificial neural networks of the present invention utilize a combination of CMOS technology and non-volatile memory arrays.

Non-Volatile Memory Cells

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 (source line terminal) towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line.
"Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 µA | 8-11 V | 4.5-9 V | 4.5-5 V |

"Read 1" is a read mode in which the cell current is output on the bit line.
"Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

Figures 6, 7:
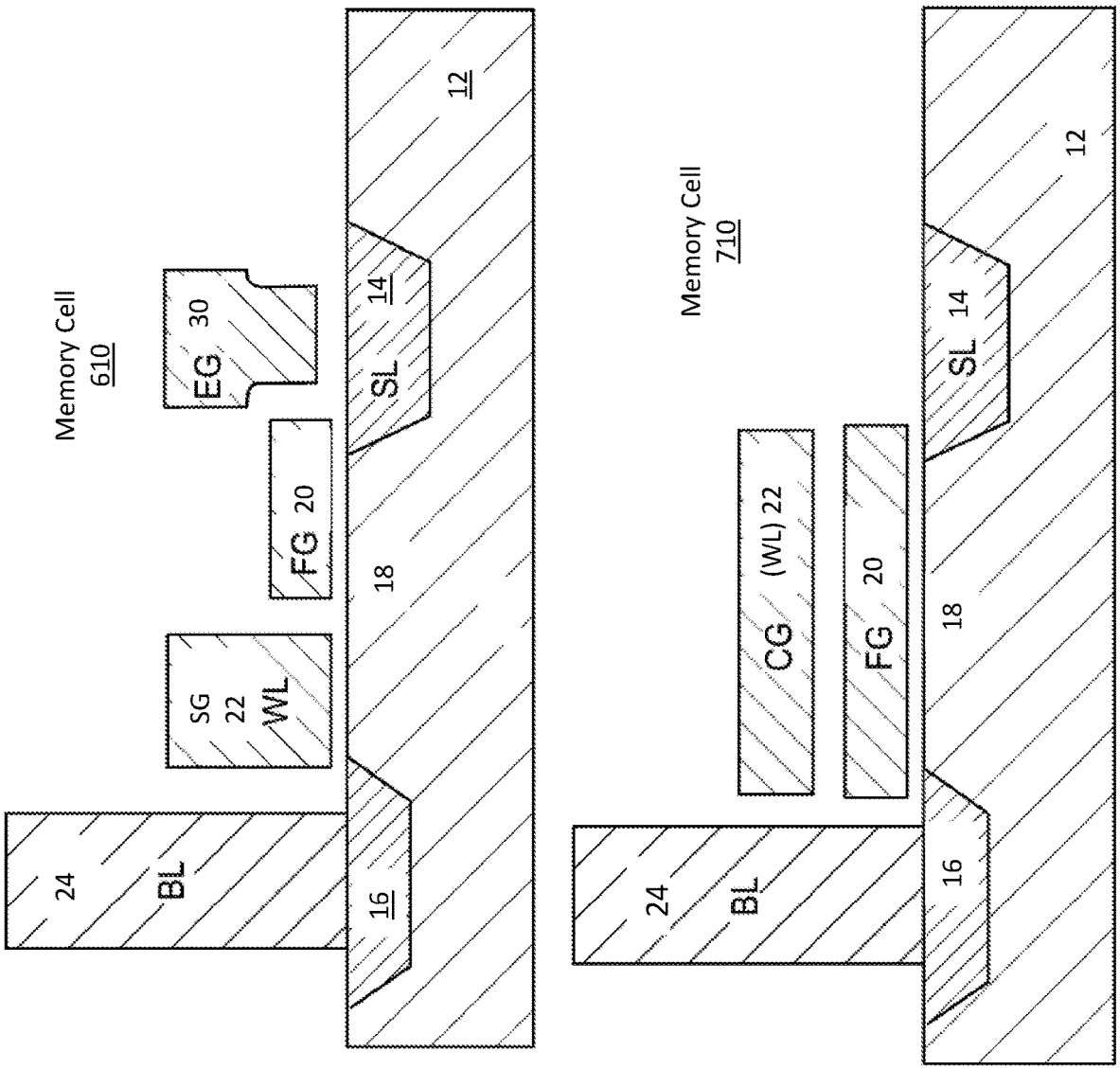
FIG. 6 depicts another prior art split gate flash memory cell.
FIG. 7 depicts a prior art stacked gate flash memory cell.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 µA | 4.5 V | 7-9 V |

"Read 1" is a read mode in which the cell current is output on the bit line.
"Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

| | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line.
"Read 2" is a read mode in which the cell current is output on the source line terminal.

Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

Figure 8:
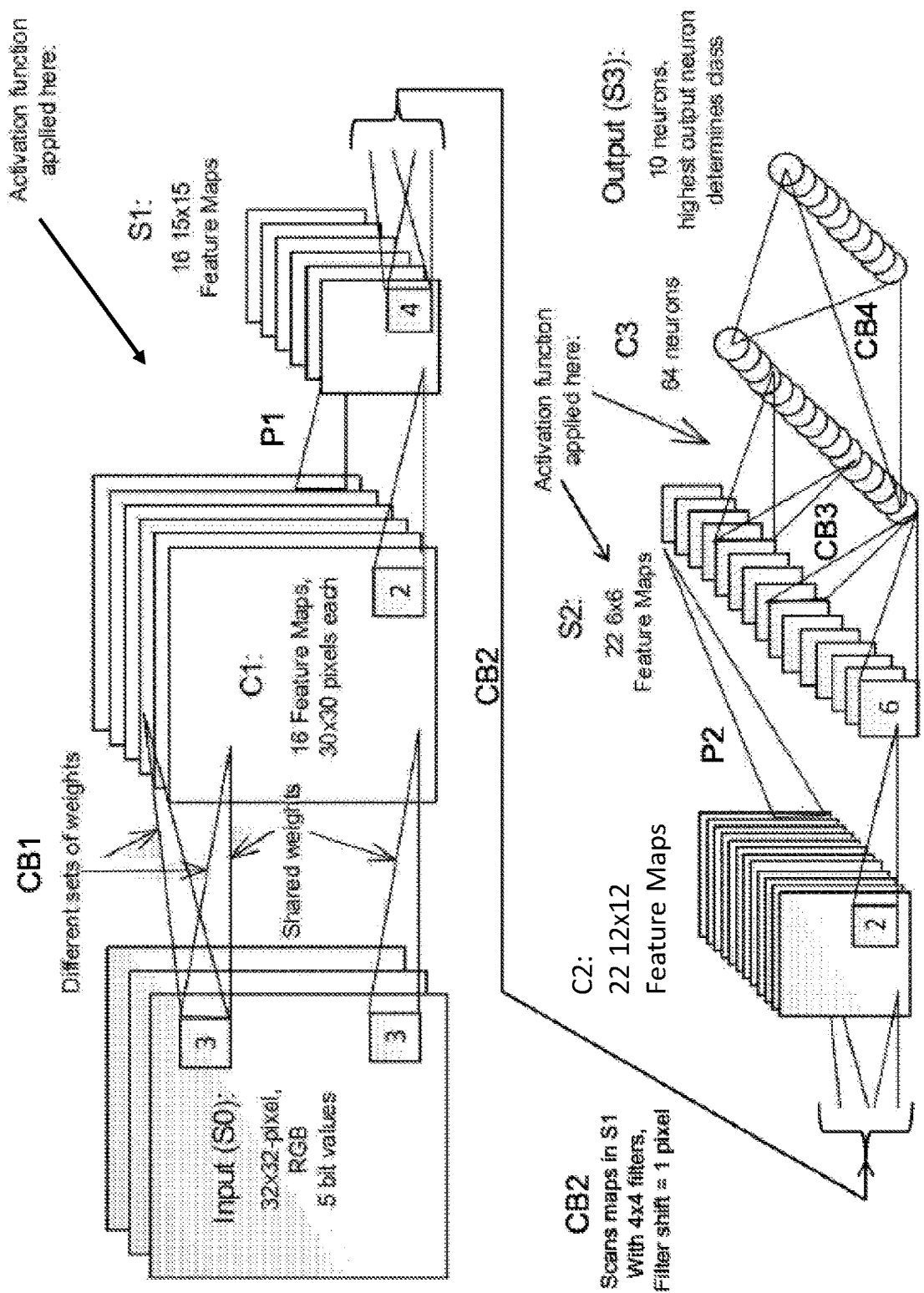
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
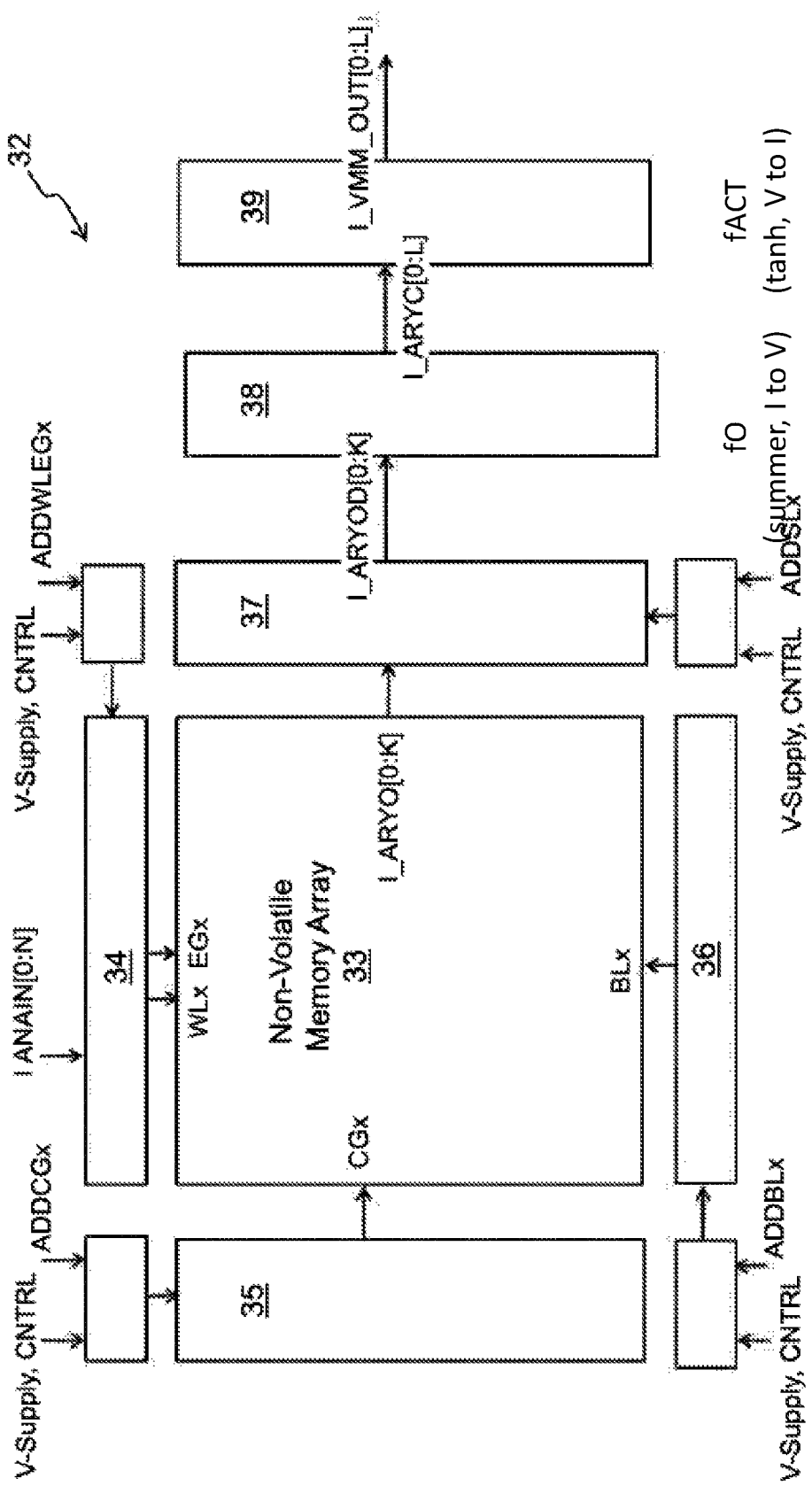
FIG. 9 is a block diagram illustrating a vector-by-matrix multiplication system.

FIG. 9 is a block diagram of a system that can be used for that purpose. Vector-by-matrix multiplication (VMM) system 32 includes non-volatile memory cells and is utilized as the synapses (such as CB1, CB2, CB3, and CB4 in FIG. 6) between one layer and the next layer. Specifically, VMM system 32 includes VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tanh, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
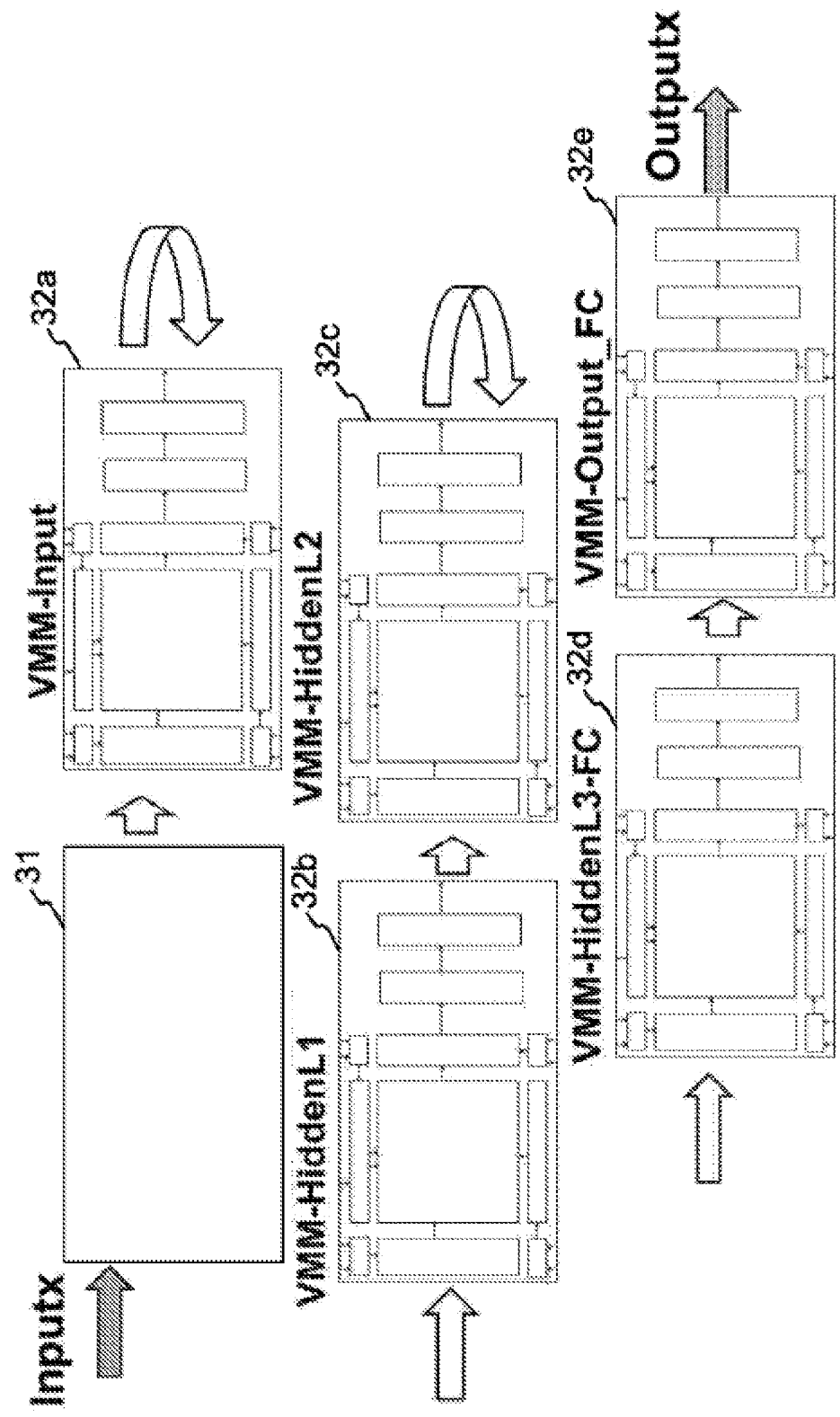
FIG. 10 is a block diagram illustrates an exemplary artificial neural network utilizing one or more a vector-by-matrix multiplication systems.

FIG. 10 is a block diagram depicting the usage of numerous layers of VMM systems 32, here labeled as VMM systems 32a, 32b, 32c, 32d, and 32e. As shown in FIG. 10, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 10 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

VMM Arrays

Figure 11:
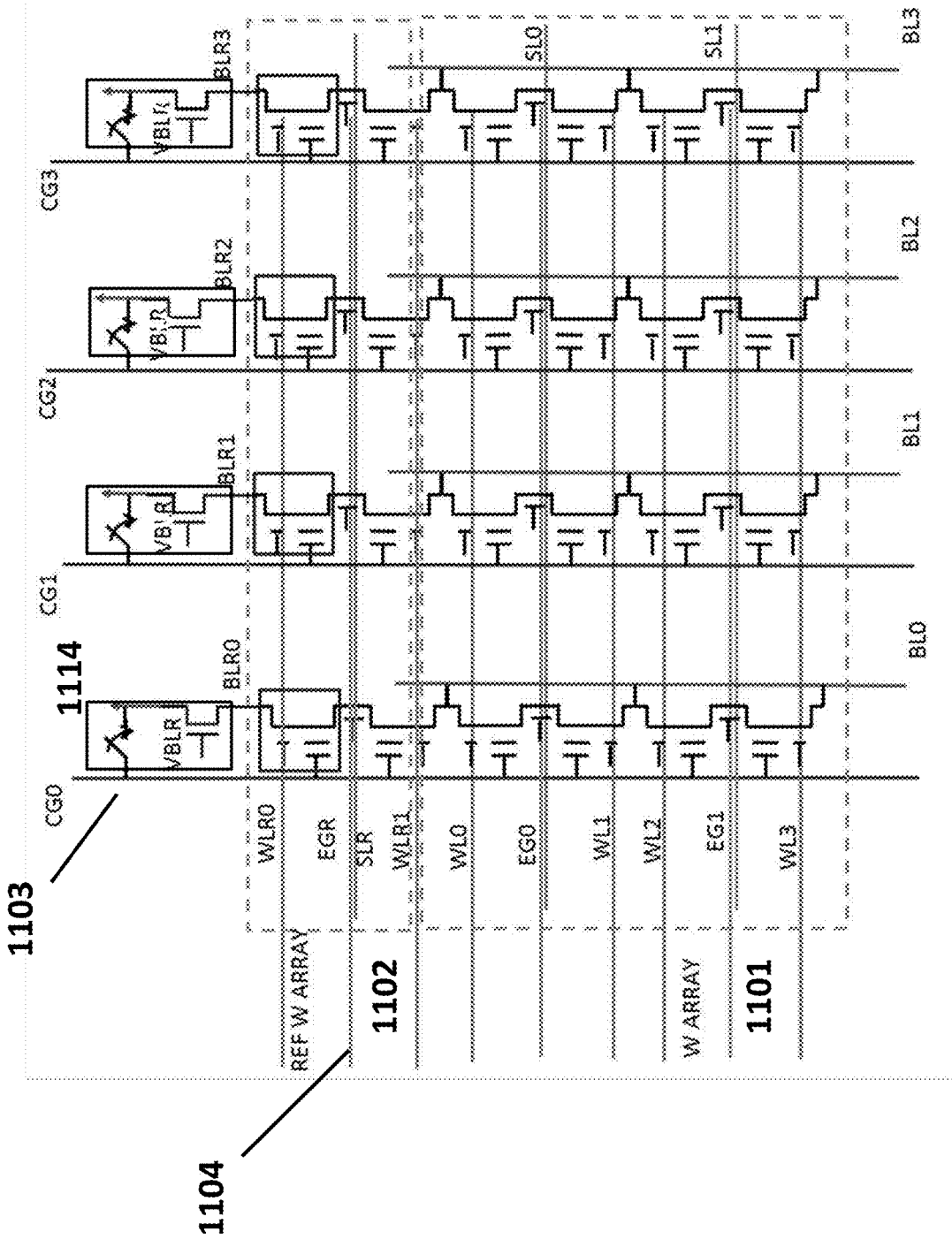
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{Vg-Vth/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to (Wt/L)*u*Cox*(n−1)*Vt² where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For a memory array used as a vector matrix multiplier VMM array, the output current is:

$$Iout = wa*Io*e^{(Vg)/nVt} \text{ namely}$$

$$Iout = (wa/wp)*Iin = W*Iin$$

$$W = e^{(Vthp-Vtha)/nVt}$$

$$Iin = wp*Io*e^{(Vg)/nVt}$$

Here, wa=w of each memory cell in the memory array.

A wordline or control gate can be used as the input for the memory cell for the input voltage.

Alternatively, the non-volatile memory cells of VMM arrays described herein can be configured to operate in the linear region:

$$Ids = \text{beta}*(Vgs-Vth)*Vds; \text{beta}=u*Cox*Wt/L,$$

$$W\alpha(Vgs-Vth),$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = \frac{1}{2}*\text{beta}*(Vgs-Vth)^2; \text{beta}=u*Cox*Wt/L$$

$W\alpha(Vgs-Vth)^2$, meaning weight W is proportional to $(Vgs-Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation).

Other embodiments for VMM array 33 of FIG. 9 are described in U.S. patent application Ser. No. 15/826,345, which is incorporated by reference herein. As described in that application, a sourceline or a bitline can be used as the neuron output (current summation output).

Figure 12:
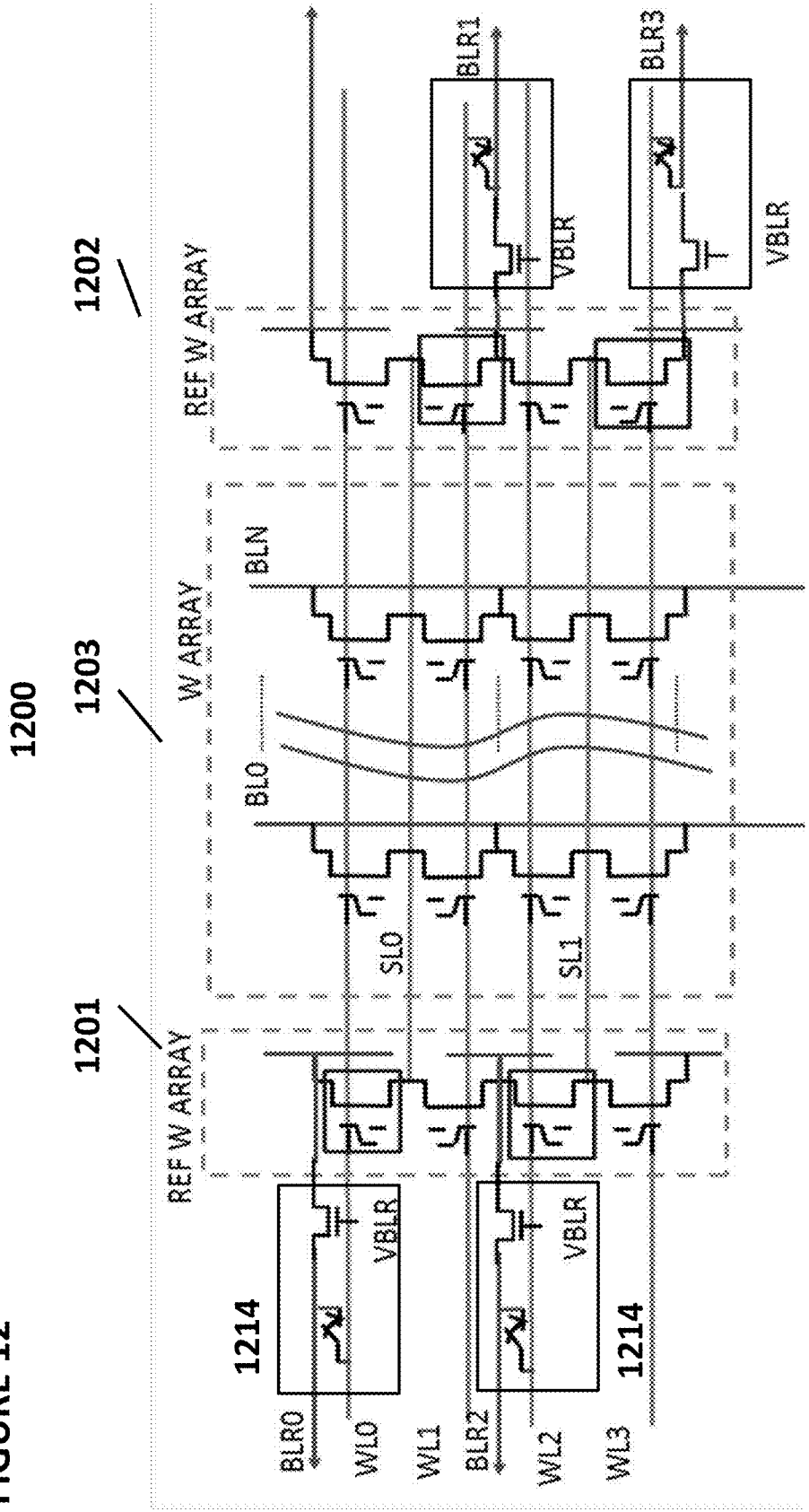
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 5

Operation of VMM Array 1200 of FIG. 12:

|  | WL | WL-unsel | BL | BL-unsel | SL | SL-unsel |
|---|---|---|---|---|---|---|
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 13:
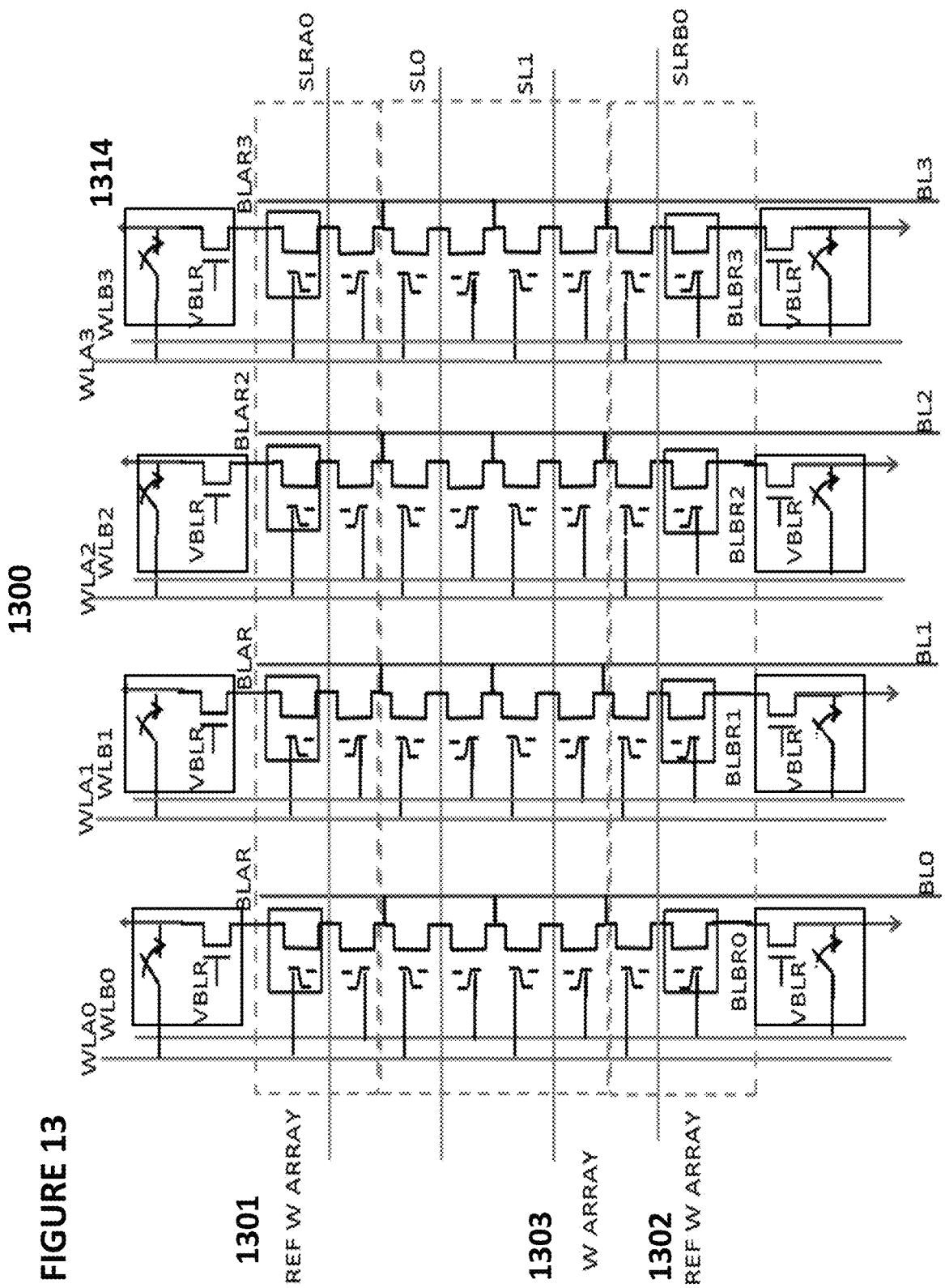
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1300 of FIG. 13

|  | WL | WL-unsel | BL | BL-unsel | SL | SL-unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 14:
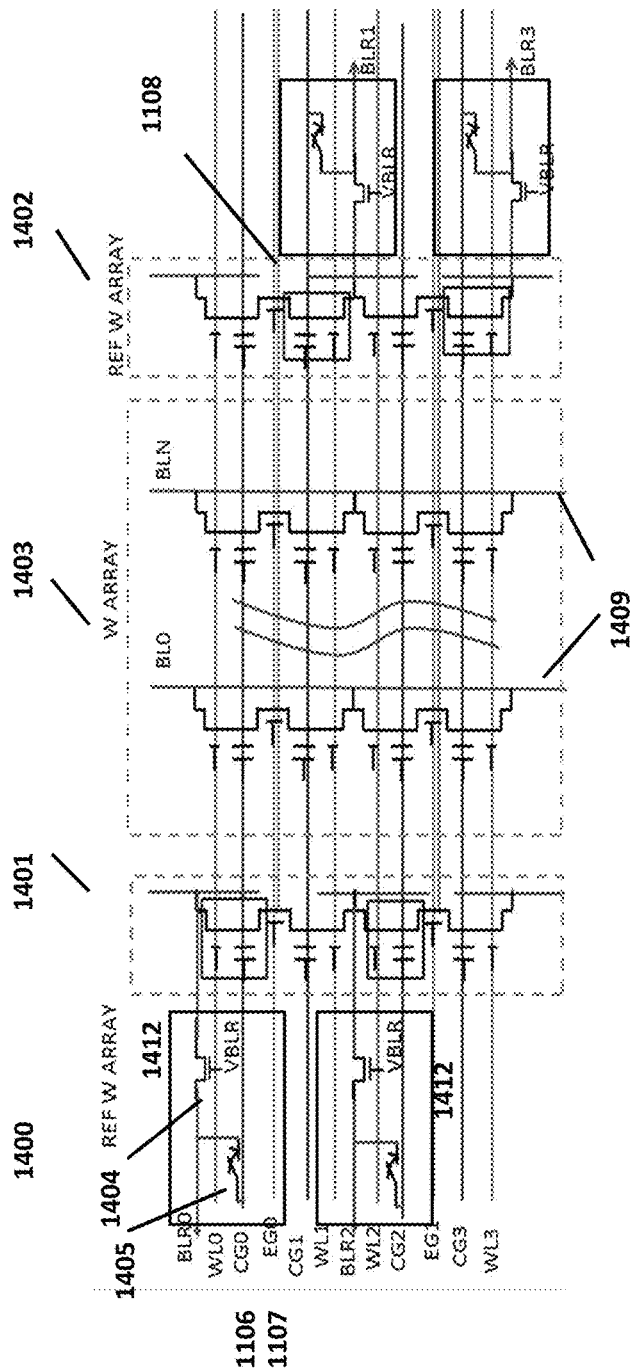
FIG. 14 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400. Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1400 of FIG. 14

|  | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 15:
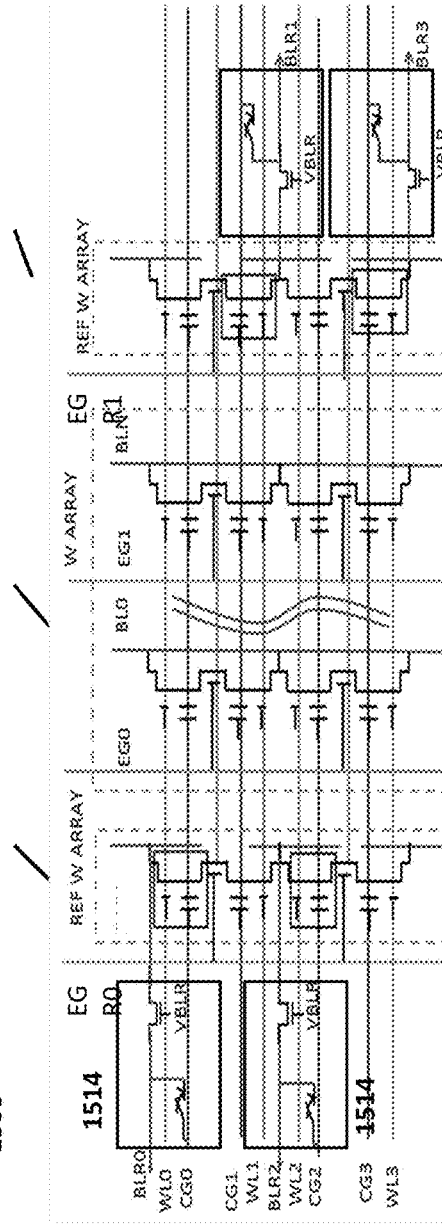
FIG. 15 depicts another embodiment of a vector-by-matrix multiplication system.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 17:
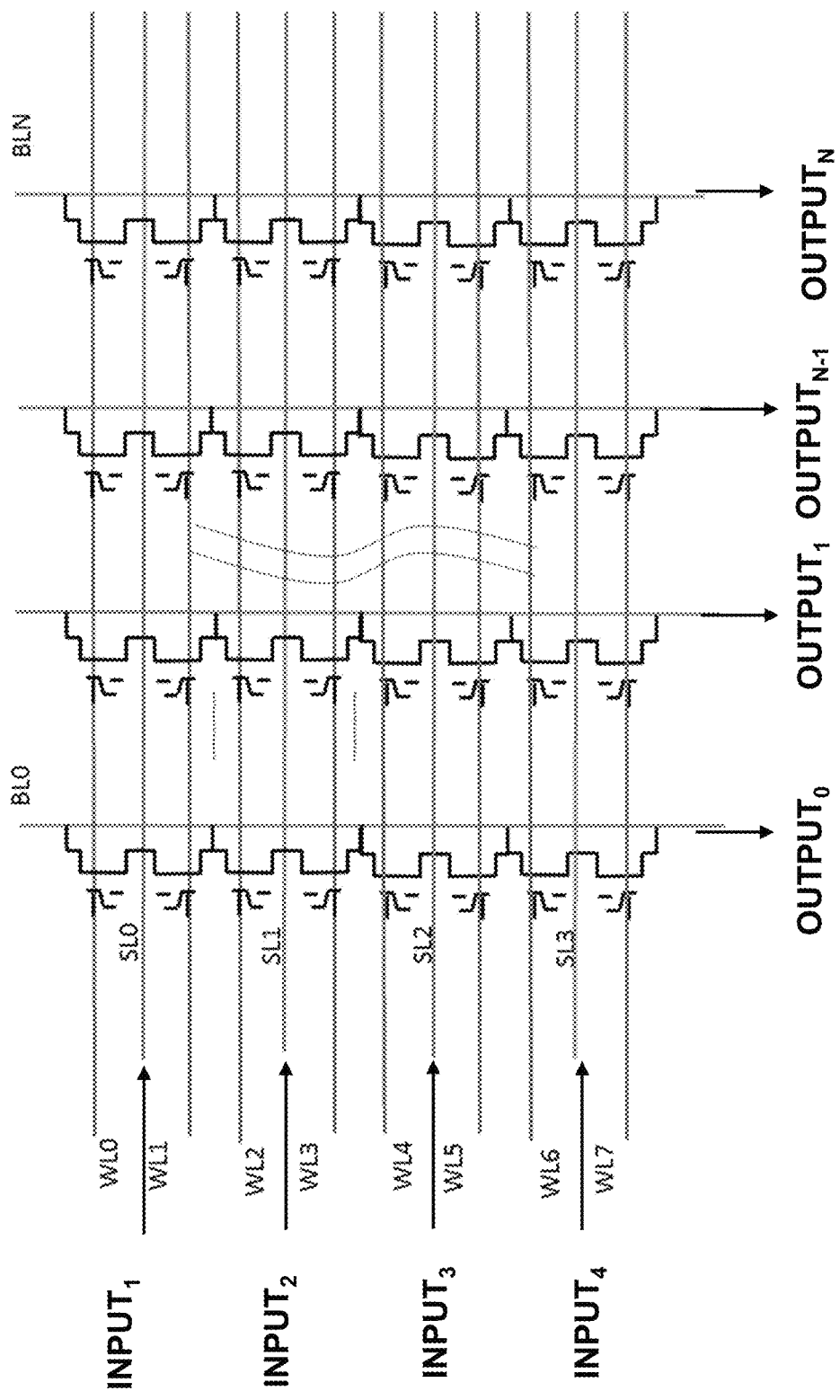
FIG. 17 depicts another embodiment of a vector-by-matrix multiplication system.

FIG. 17 depicts neuron VMM array 1700, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and INPUTS are received on source lines $SL_0$, $SL_1$, $SL_2$, and $SL_3$, respectively, and the outputs $OUTPUT_0$, ... $OUTPUT_N$ are generated on bit lines $BL_0$, ..., $BL_N$.

Figure 18:
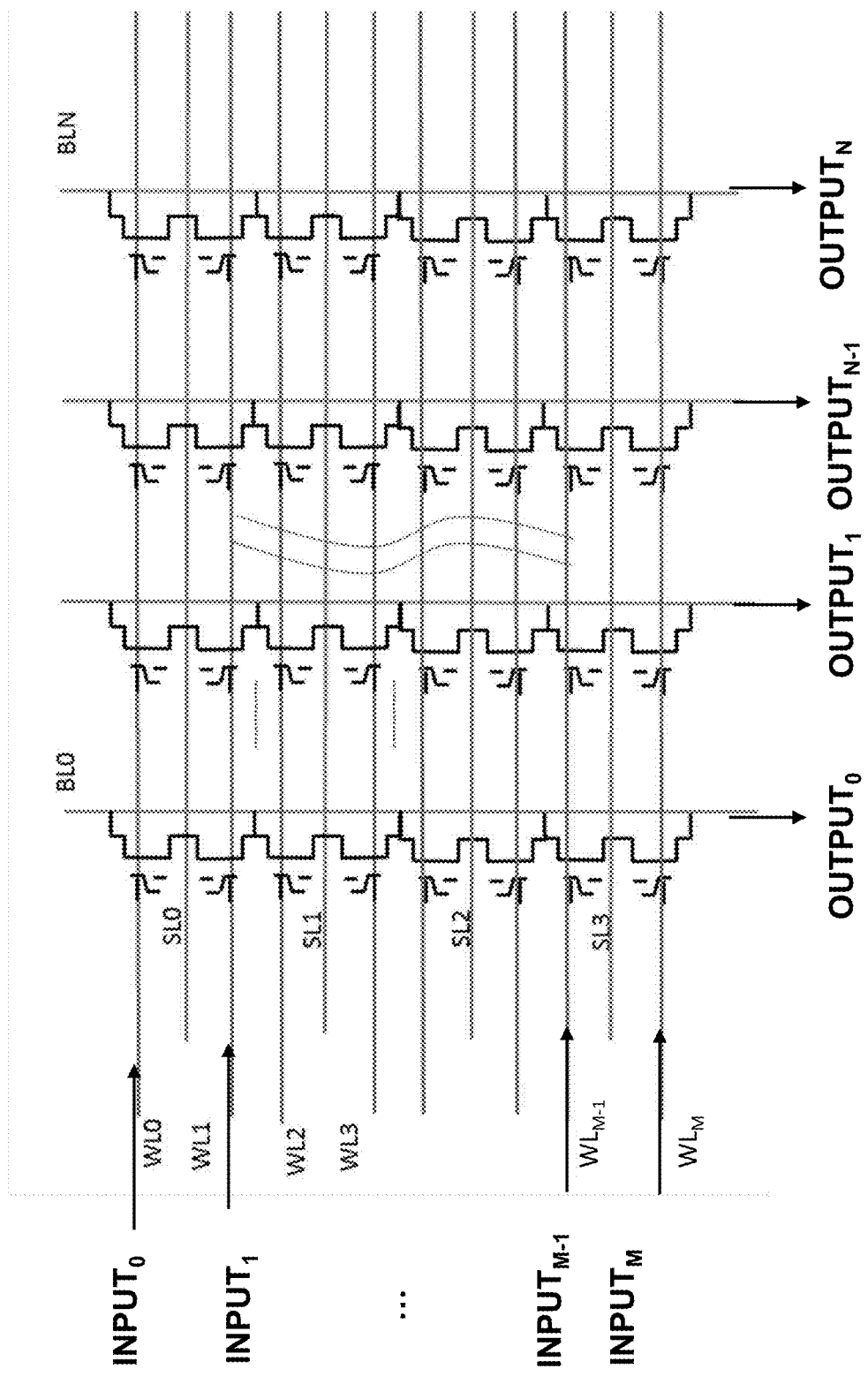
FIG. 18 depicts another embodiment of a vector-by-matrix multiplication system.

FIG. 18 depicts neuron VMM array 1800, which is particularly suited for memory cells 210 as shown in FIG. 2, and is utilized as the synapses and parts of neurons between an input layer and the next layer. In this example, the inputs $INPUT_0$, ..., $INPUT_M$ are received on word lines $WL_0$, ..., $WL_M$, respectively, and the outputs $OUTPUT_0$, ... $OUTPUT_N$ are generated on bit lines $BL_0$, ..., $BL_N$.

Figure 19:
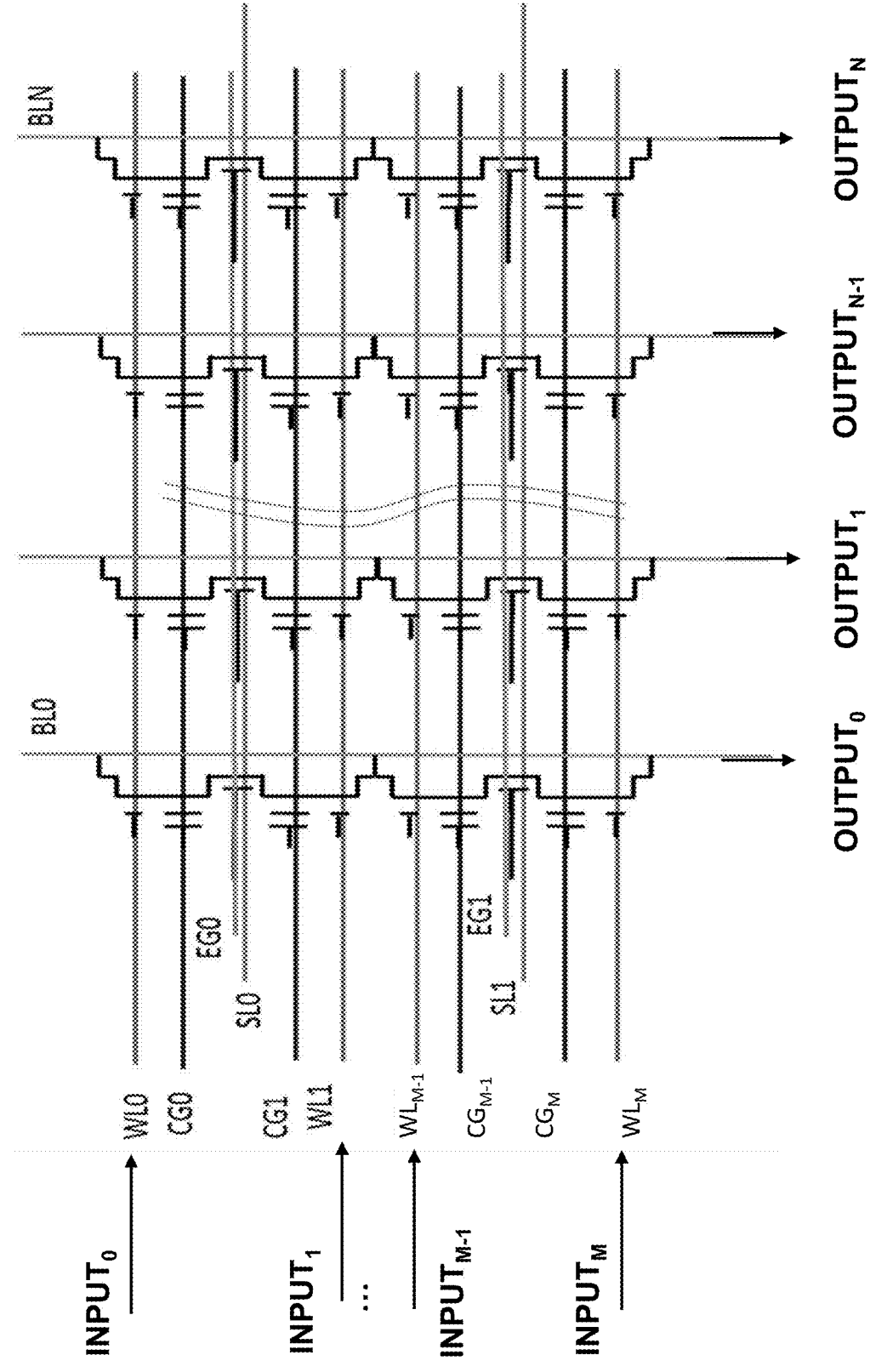
FIG. 19 depicts another embodiment of a vector-by-matrix multiplication system.

FIG. 19 depicts neuron VMM array 1900, which is particularly suited for memory cells 310 as shown in FIG. 3, and is utilized as the synapses and parts of neurons between an input layer and the next layer. In this example, the inputs $INPUT_0$, ..., $INPUT_M$ are received on word lines $WL_0$, ..., $WL_M$, respectively, and the outputs $OUTPUT_0$, ... $OUTPUT_N$ are generated on bit lines $BL_0$, ..., $BL_N$.

Figure 20:
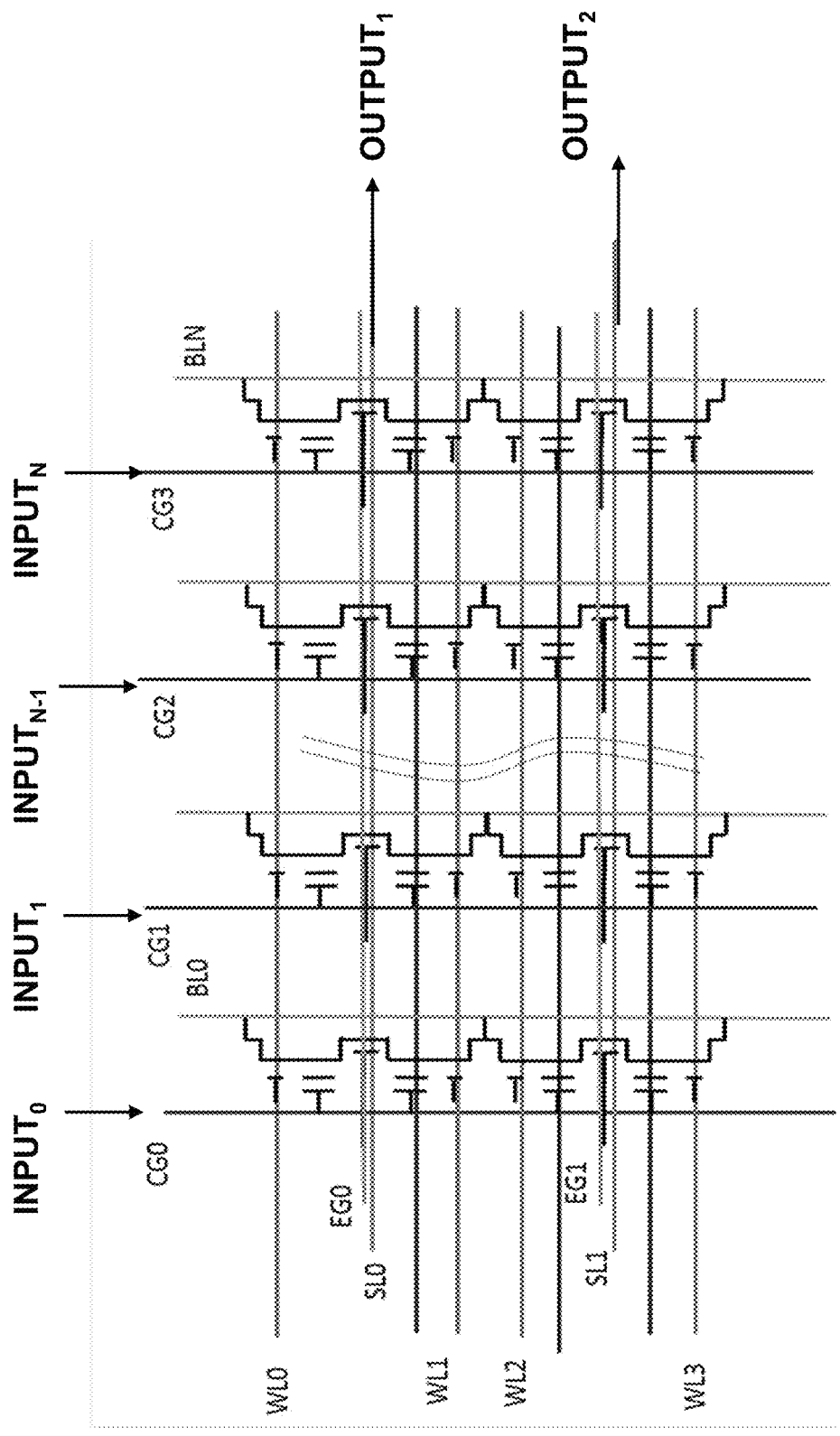
FIG. 20 depicts another embodiment of a vector-by-matrix multiplication system.

FIG. 20 depicts neuron VMM array 2000, which is particularly suited for memory cells 410 as shown in FIG. 4, and is utilized as the synapses and parts of neurons between an input layer and the next layer. In this example, the inputs $INPUT_0$, ..., $INPUT_n$ are received on vertical control gate lines $CG_0$, ..., $CG_N$, respectively, and the outputs $OUTPUT_1$ and $OUTPUT_2$ are generated on source lines $SL_0$ and $SL_1$.

Figure 21:
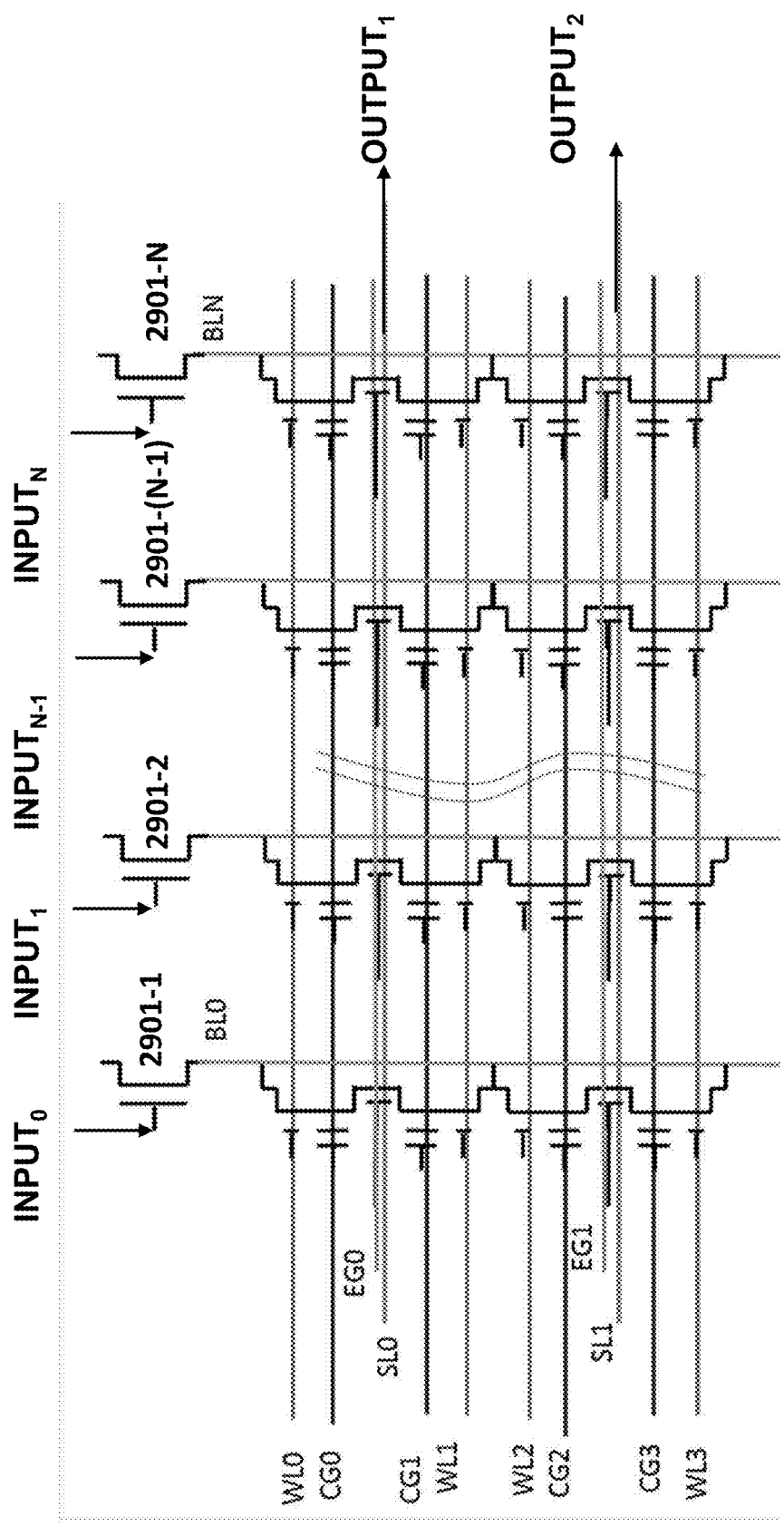
FIG. 21 depicts another embodiment of a vector-by-matrix multiplication system.

FIG. 21 depicts neuron VMM array 2100, which is particularly suited for memory cells 410 as shown in FIG. 4, and is utilized as the synapses and parts of neurons between an input layer and the next layer. In this example, the inputs

TABLE NO. 8

Operation of VMM Array 1500 of FIG. 15

|  | WL | WL -unsel | BL | BL -unsel | CG | CG -unsel same sector | CG -unsel | EG | EG -unsel | SL | SL -unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 16:
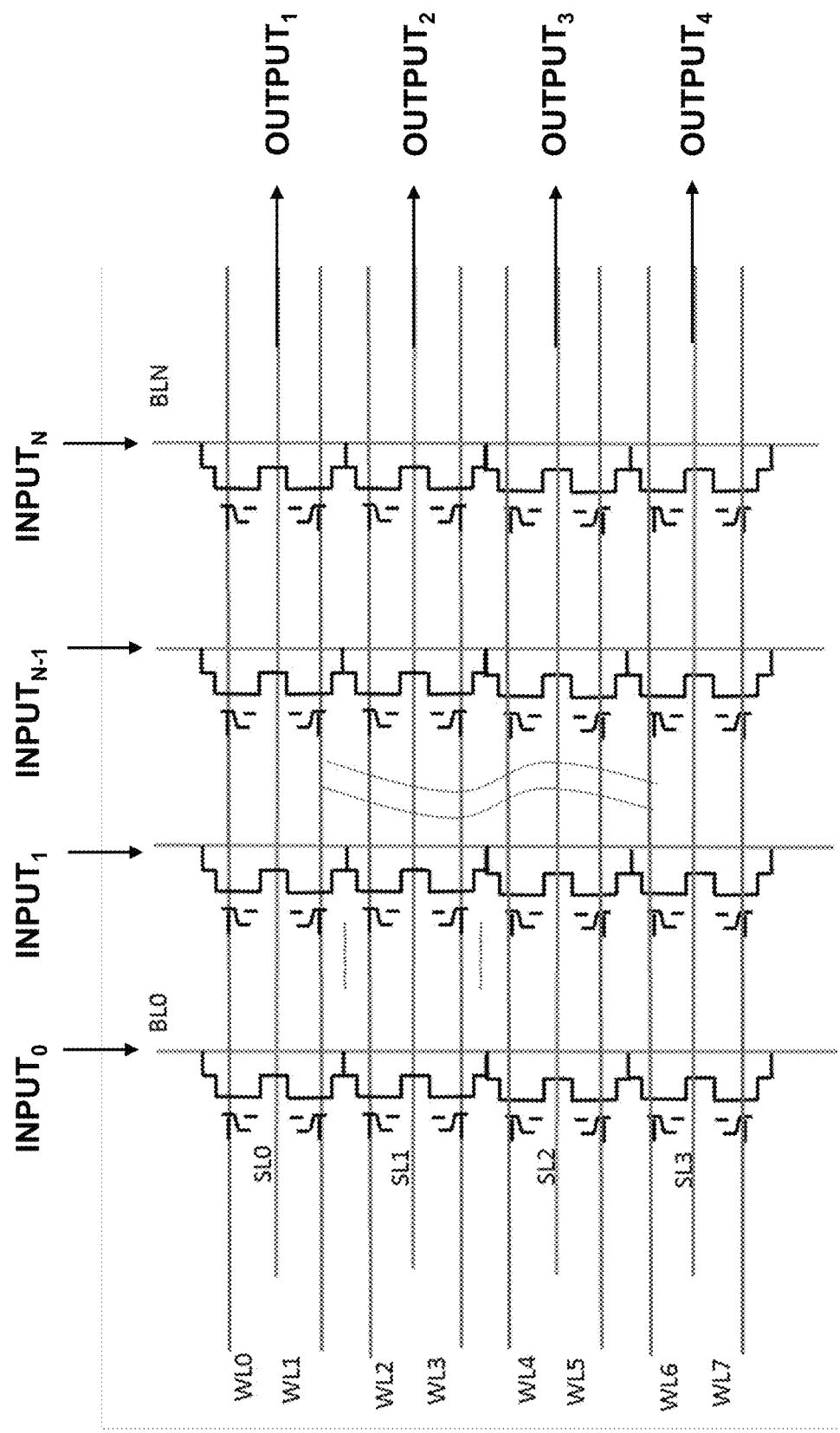
FIG. 16 depicts another embodiment of a vector-by-matrix multiplication system.

FIG. 16 depicts neuron VMM array 1600, which is particularly suited for memory cells 210 as shown in FIG. 2, and is utilized as the synapses and parts of neurons between an input layer and the next layer. In VMM array 1600, the inputs $INPUT_0$ ..., $INPUT_N$ are received on bit lines $BL_0$, ... $BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

$INPUT_0$, ..., $INPUT_N$ are received on the gates of bit line control gates 2901-1, 2901-2, ..., 2901-(N-1), and 2901-N, respectively, which are coupled to bit lines $BL_0$, ..., $BL_N$, respectively. Exemplary outputs $OUTPUT_1$ and $OUTPUT_2$ are generated on source lines $SL_0$ and $SL_1$.

Figure 22:
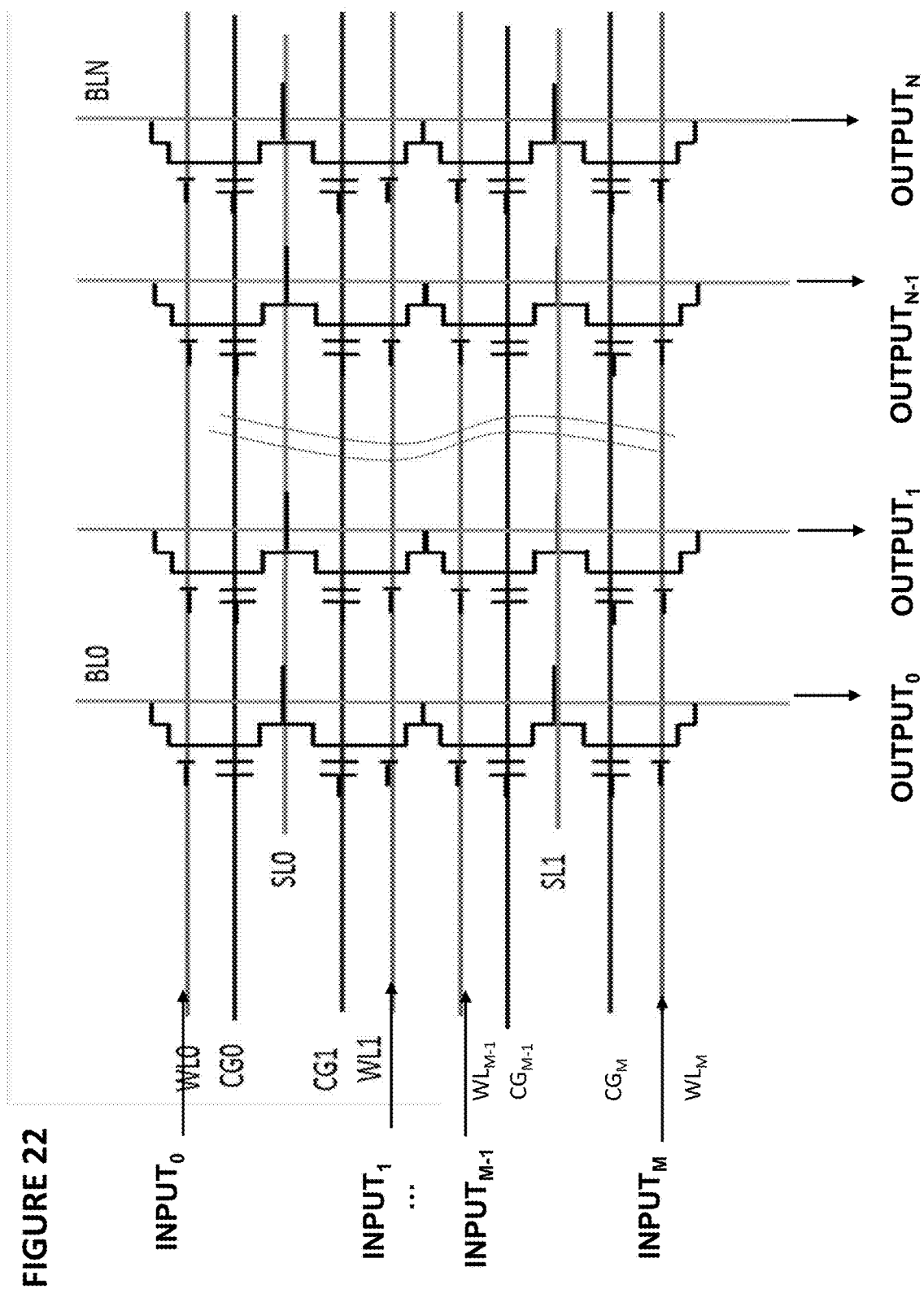
FIG. 22 depicts another embodiment of a vector-by-matrix multiplication system.

FIG. 22 depicts neuron VMM array 2200, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

Figure 23:
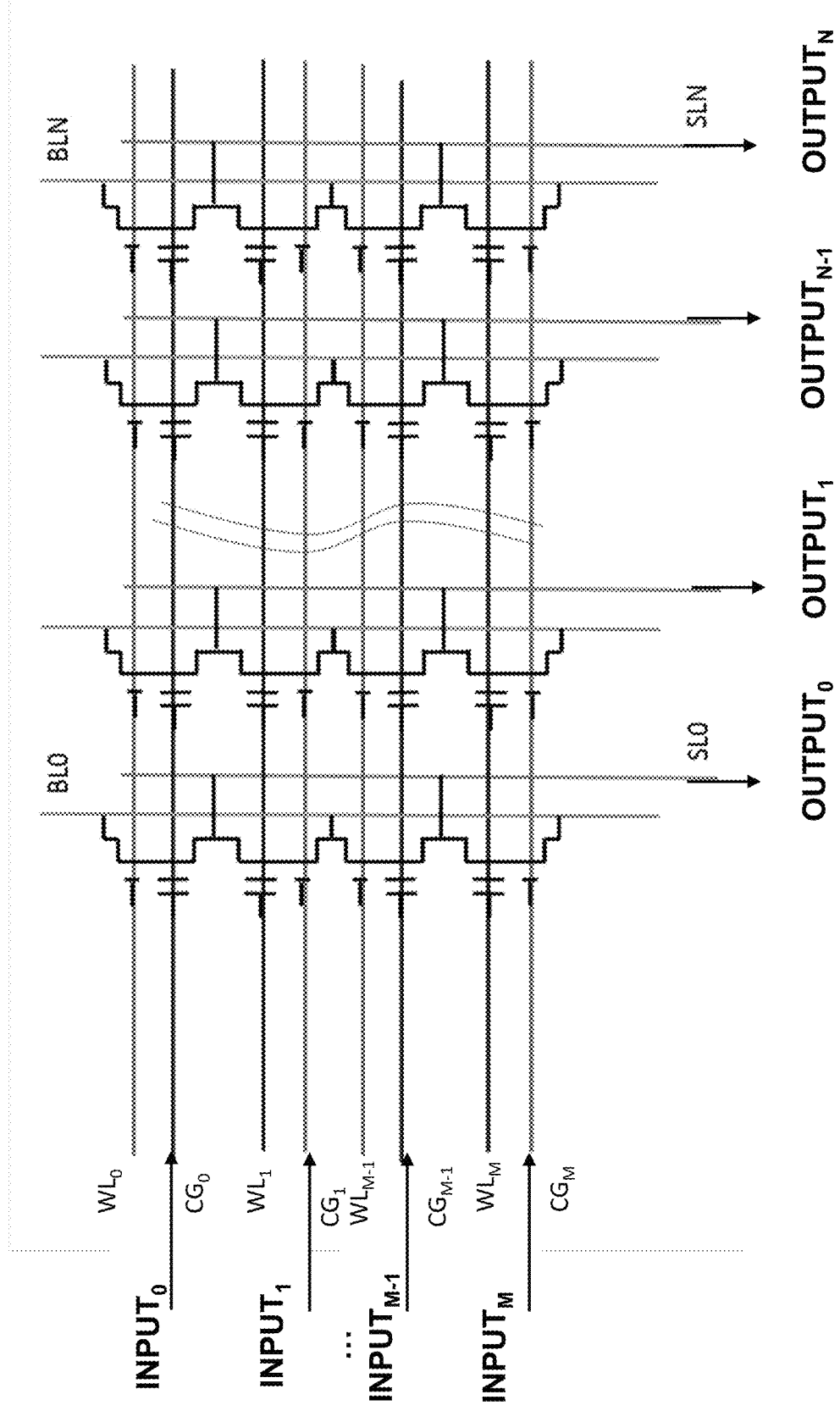
FIG. 23 depicts another embodiment of a vector-by-matrix multiplication system.

FIG. 23 depicts neuron VMM array 2300, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i.

Figure 24:
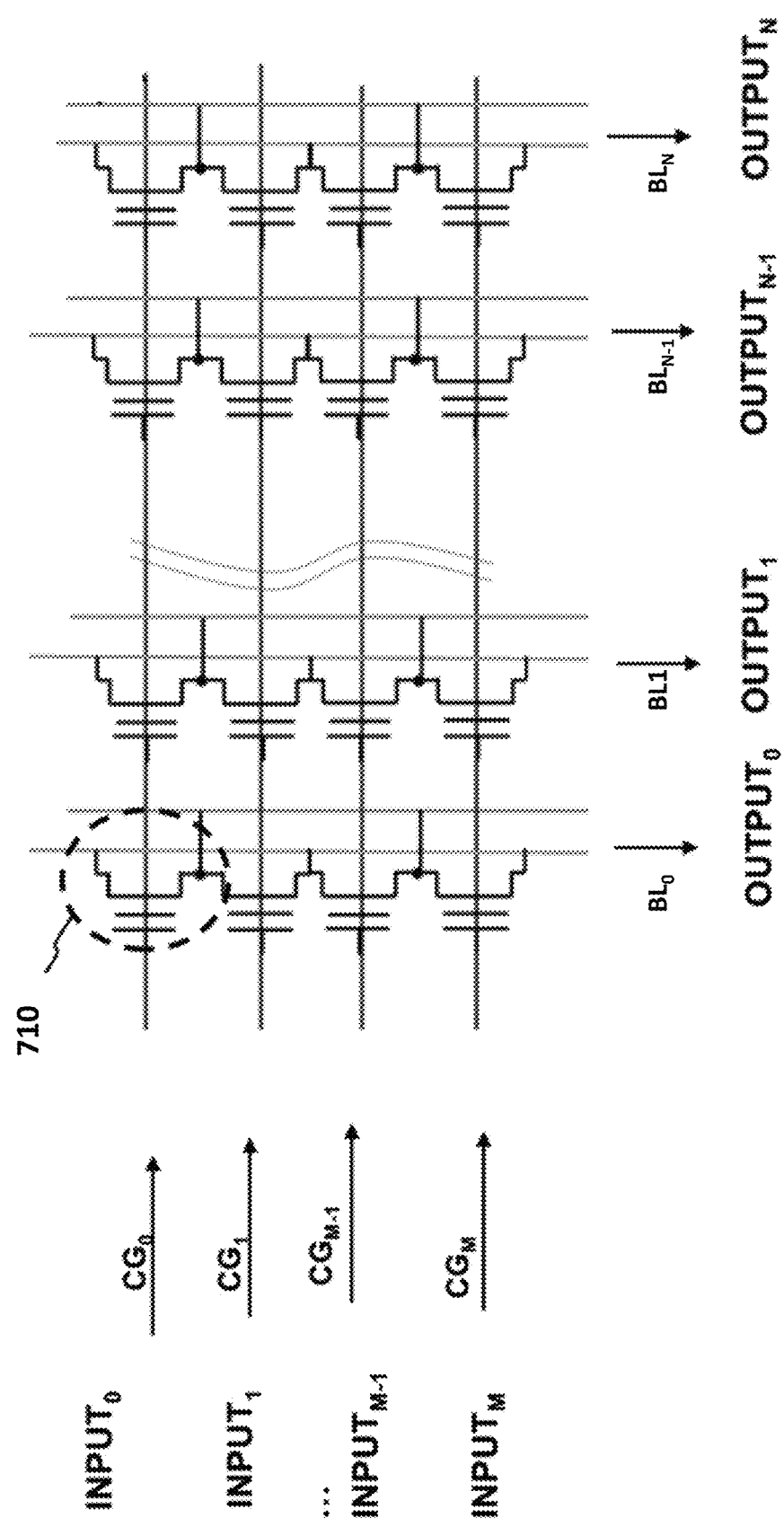
FIG. 24 depicts another embodiment of a vector-by-matrix multiplication system.

FIG. 24 depicts neuron VMM array 2400, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTMs often are used in artificial neural networks. LSTM allows an artificial neural network to remember information over predetermined arbitrary time intervals and to use that information in subsequent operations. A conventional LSTM comprises a cell, an input gate, an output gate, and a forget gate. The three gates regulate the flow of information into and out of the cell and the time interval that the information is remembered in the LSTM. VMMs are particularly useful in LSTMs.

Figure 25:
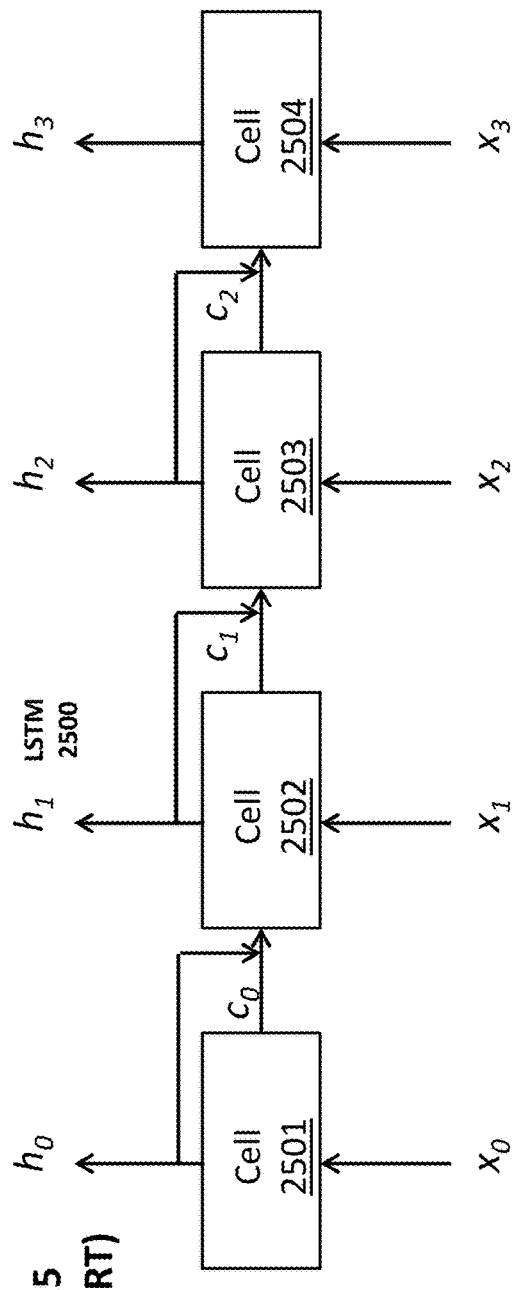
FIG. 25 depicts a prior art long short-term memory system.

FIG. 25 depicts an exemplary LSTM 2500. LSTM 2500 in this example comprises cells 2501, 2502, 2503, and 2504. Cell 2501 receives input vector $x_0$ and generates output vector $h_0$ and cell state vector $c_0$. Cell 2502 receives input vector $x_1$, the output vector (hidden state) $h_0$ from cell 2501, and cell state $c_0$ from cell 2501 and generates output vector $h_1$ and cell state vector $c_1$. Cell 2503 receives input vector $x_2$, the output vector (hidden state) $h_1$ from cell 2502, and cell state $c_1$ from cell 2502 and generates output vector $h_2$ and cell state vector $c_2$. Cell 2504 receives input vector $x_3$, the output vector (hidden state) $h_2$ from cell 2503, and cell state $c_2$ from cell 2503 and generates output vector 113. Additional cells can be used, and an LSTM with four cells is merely an example.

Figure 26:
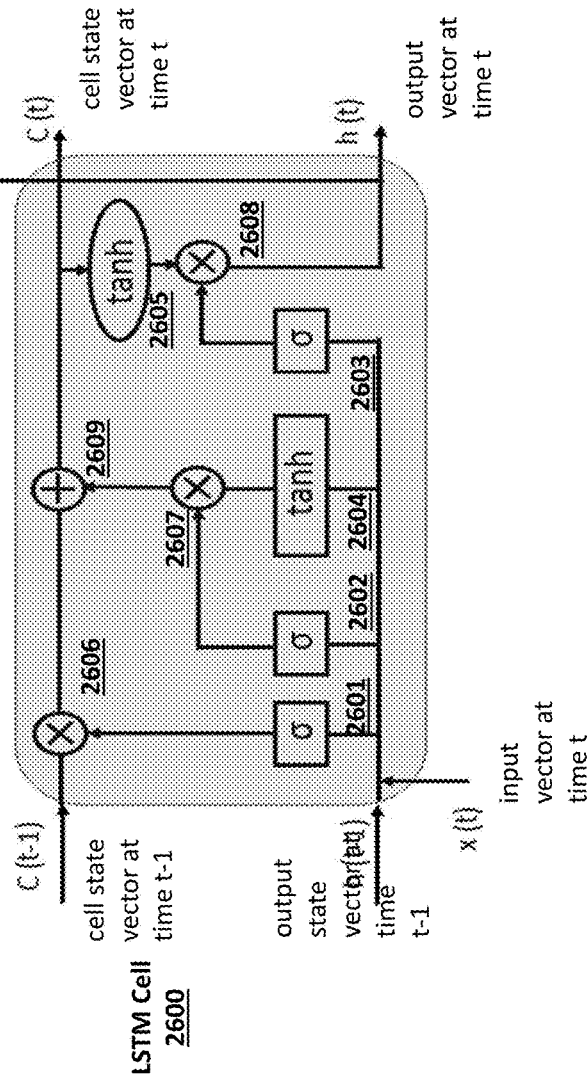
FIG. 26 depicts an exemplary cell for use in a long short-term memory system.

FIG. 26 depicts an exemplary implementation of an LSTM cell 2600, which can be used for cells 2501, 2502, 2503, and 2504 in FIG. 25. LSTM cell 2600 receives input vector x(t), cell state vector c(t−1) from a preceding cell, and output vector (t−1) from a preceding cell, and generates cell state vector c(t) and output vector h(t).

LSTM cell 2600 comprises sigmoid function devices 2601, 2602, and 2603, each of which applies a number between 0 and 1 to control how much of each component in the input vector is allowed through to the output vector. LSTM cell 2600 also comprises tanh devices 2604 and 2605 to apply a hyperbolic tangent function to an input vector, multiplier devices 2606, 2607, and 2608 to multiply two vectors together, and addition device 2609 to add two vectors together. Output vector h(t) can be provided to the next LSTM cell in the system, or it can be accessed for other purposes.

Figure 27:
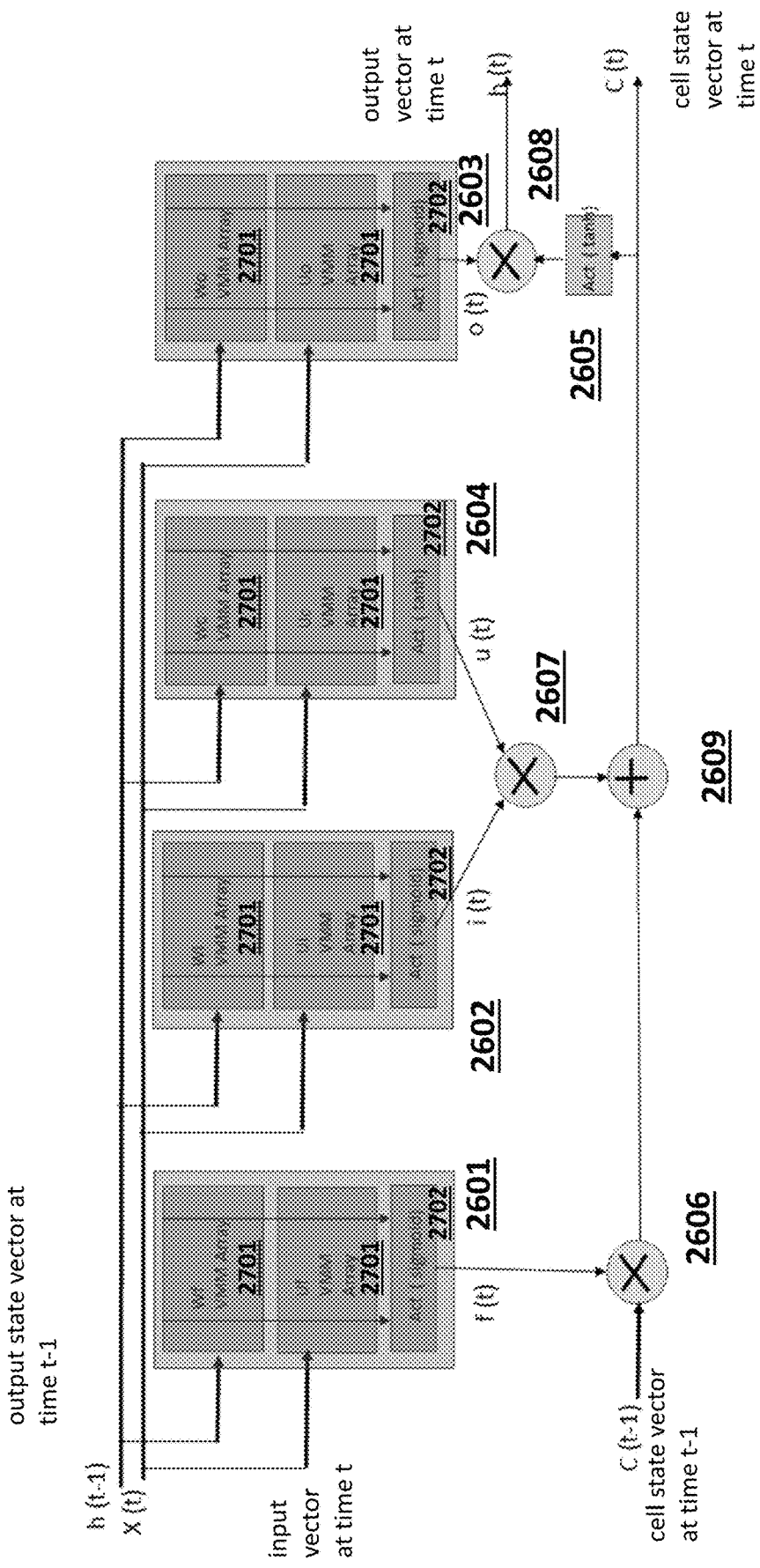
FIG. 27 depicts an embodiment of the exemplary cell of FIG. 26.

FIG. 27 depicts an LSTM cell 2700, which is an example of an implementation of LSTM cell 2600. For the reader's convenience, the same numbering from LSTM cell 2600 is used in LSTM cell 2700. Sigmoid function devices 2601, 2602, and 2603 and tanh device 2604 each comprise multiple VMM arrays 2701 and activation circuit blocks 2702. Thus, it can be seen that VMM arrays are particular useful in LSTM cells used in certain neural network systems.

Figure 28:
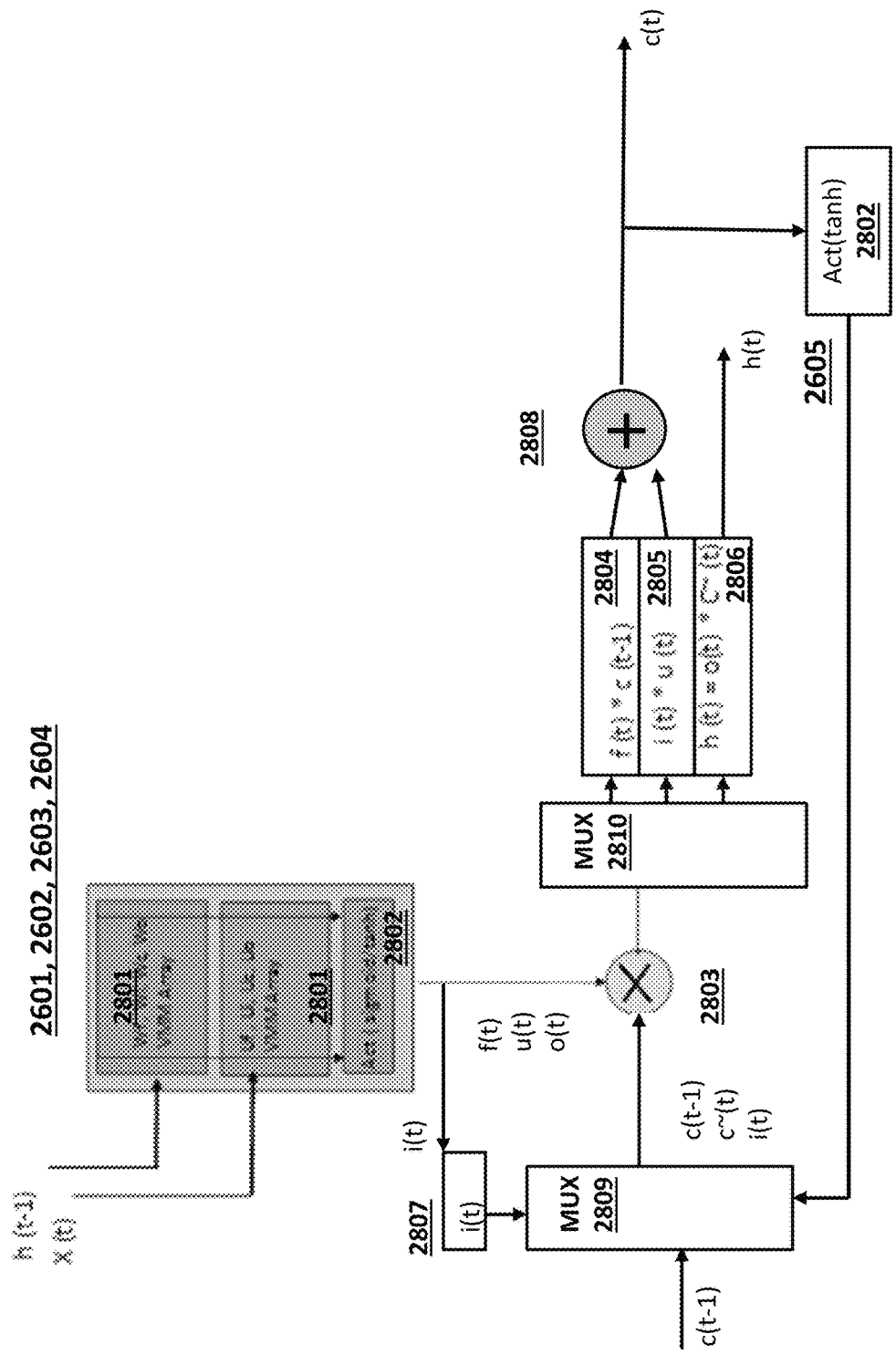
FIG. 28 depicts another embodiment of the exemplary cell of FIG. 26.

An alternative to LSTM cell 2700 (and another example of an implementation of LSTM cell 2600) is shown in FIG. 28. In FIG. 28, sigmoid function devices 2601, 2602, and 2603 and tanh device 2604 may share the same physical hardware (VMM arrays 2801 and activation function block 2802) in a time-multiplexed fashion. LSTM cell 2800 also comprises multiplier device 2803 to multiply two vectors together, addition device 2808 to add two vectors together, tanh device 2605 (which comprises activation circuit block 2802), register 2807 to store the value i(t) when i(t) is output from sigmoid function block 2802, register 2804 to store the value f(t)*c(t−1) when that value is output from multiplier device 2803 through multiplexor 2810, register 2805 to store the value i(t)*u(t) when that value is output from multiplier device 2803 through multiplexor 2810, and register 2806 to store the value o(t)*c~(t) when that value is output from multiplier device 2803 through multiplexor 2810, and multiplexor 2809.

Whereas LSTM cell 2700 contains multiple sets of VMM arrays 2701 and respective activation function blocks 2702, LSTM cell 2800 contains only one set of VMM arrays 2801 and activation function block 2802, which are used to represent multiple layers in the embodiment of LSTM cell 2800. LSTM cell 2800 will require less space than LSTM 2700, as LSTM cell 2800 will require ¼ as much space for VMMs and activation function blocks compared to LSTM cell 2700.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit). GRUs are a gating mechanism in recurrent artificial neural networks. GRUs are similar to LSTMs, except that GRU cells generally contain fewer components than an LSTM cell.

Figure 29:
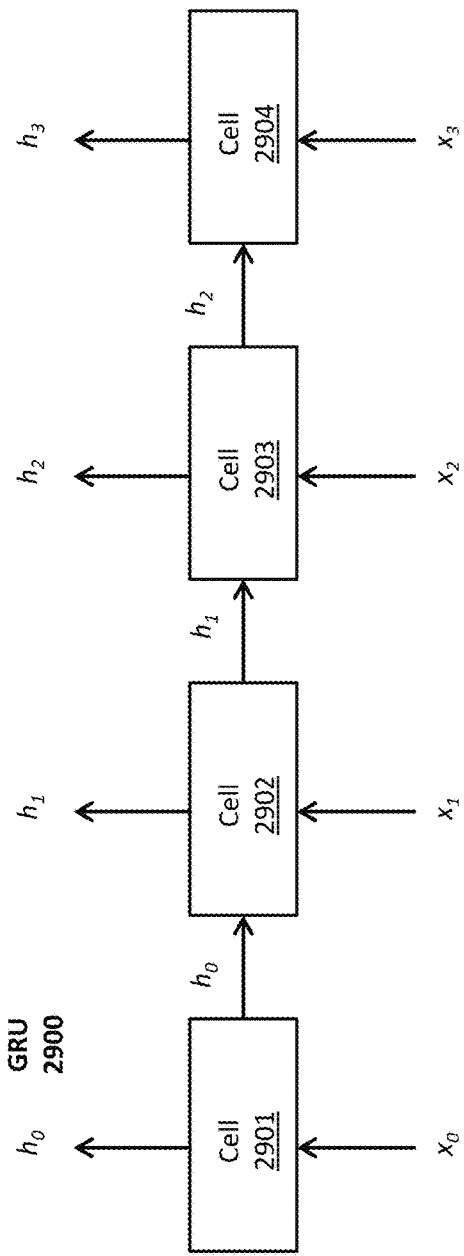
FIG. 29 depicts a prior art gated recurrent unit system.

FIG. 29 depicts an exemplary GRU 2900. GRU 2900 in this example comprises cells 2901, 2902, 2903, and 2904. Cell 2901 receives input vector $x_0$ and generates output vector $h_0$. Cell 2902 receives input vector $x_1$, the output vector $h_0$ from cell 2901 and generates output vector $h_1$. Cell 2903 receives input vector $x_2$ and the output vector (hidden state) $h_1$ from cell 2902 and generates output vector $h_2$. Cell 2904 receives input vector $x_3$ and the output vector (hidden state) $h_2$ from cell 2903 and generates output vector $h_3$. Additional cells can be used, and an GRU with four cells is merely an example.

Figure 30:
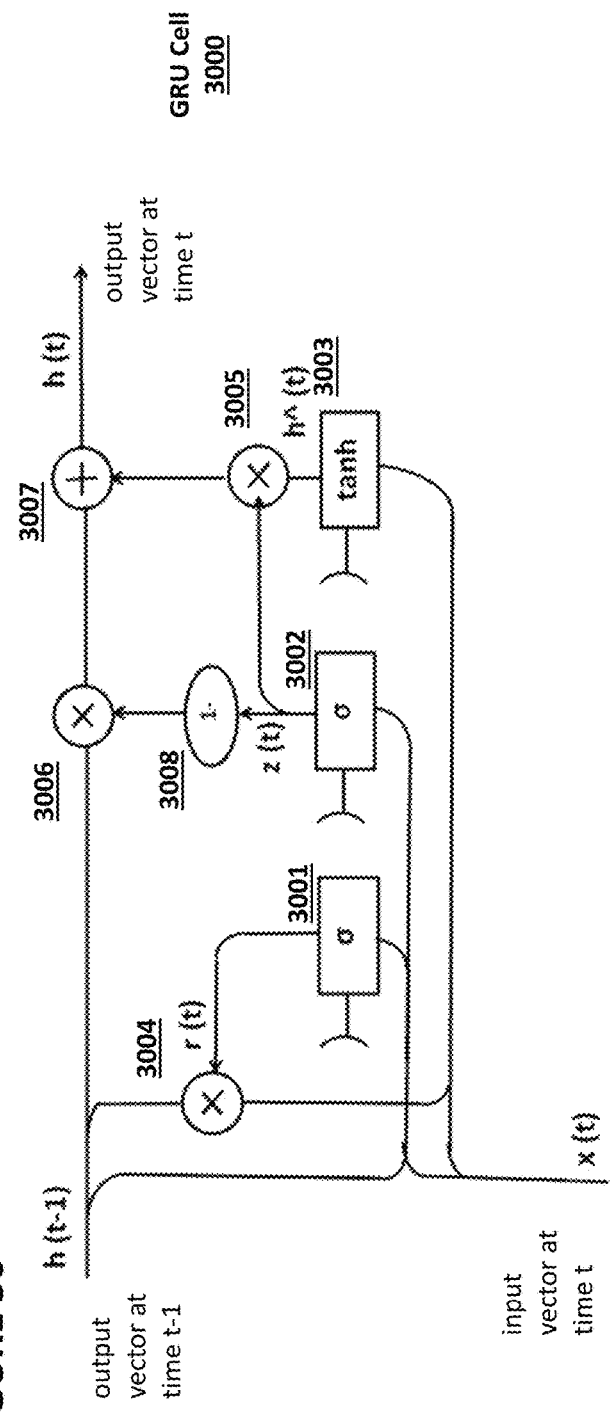
FIG. 30 depicts an exemplary cell for use in a gated recurrent unit system.

FIG. 30 depicts an exemplary implementation of a GRU cell 3000, which can be used for cells 2901, 2902, 2903, and

Figure 31:
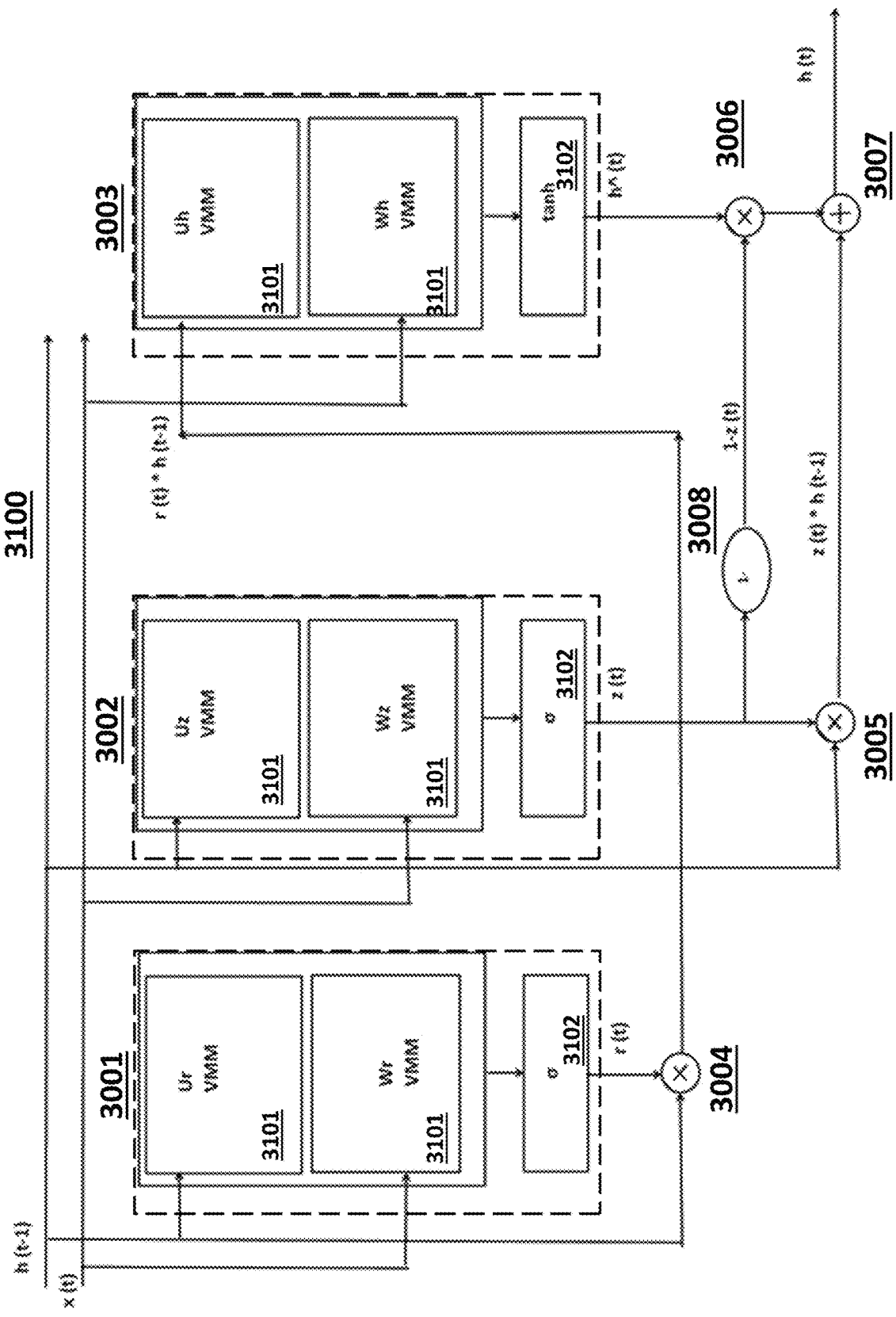
FIG. 31 depicts an embodiment of the exemplary cell of FIG. 30.

2904 of FIG. 29. GRU cell 3000 receives input vector x(t) and output vector h(t−1) from a preceding GRU cell and generates output vector h(t). GRU cell 3000 comprises sigmoid function devices 3001 and 3002, each of which applies a number between 0 and 1 to components from output vector h(t−1) and input vector x(t). GRU cell 3000 also comprises a tanh device 3003 to apply a hyperbolic tangent function to an input vector, a plurality of multiplier devices 3004, 3005, and 3006 to multiply two vectors together, an addition device 3007 to add two vectors together, and a complementary device 3008 to subtract an input from 1 to generate an output, FIG. 31 depicts a GRU cell 3100, which is an example of an implementation of GRU cell 3000. For the reader's convenience, the same numbering from GRU cell 3000 is used in GRU cell 3100. As can be seen in FIG. 31, sigmoid function devices 3001 and 3002, and tanh device 3003 each comprise multiple VMM arrays 3101 and activation function blocks 3102. Thus, it can be seen that VMM arrays are of particular use in GRU cells used in certain neural network systems.

Figure 32:
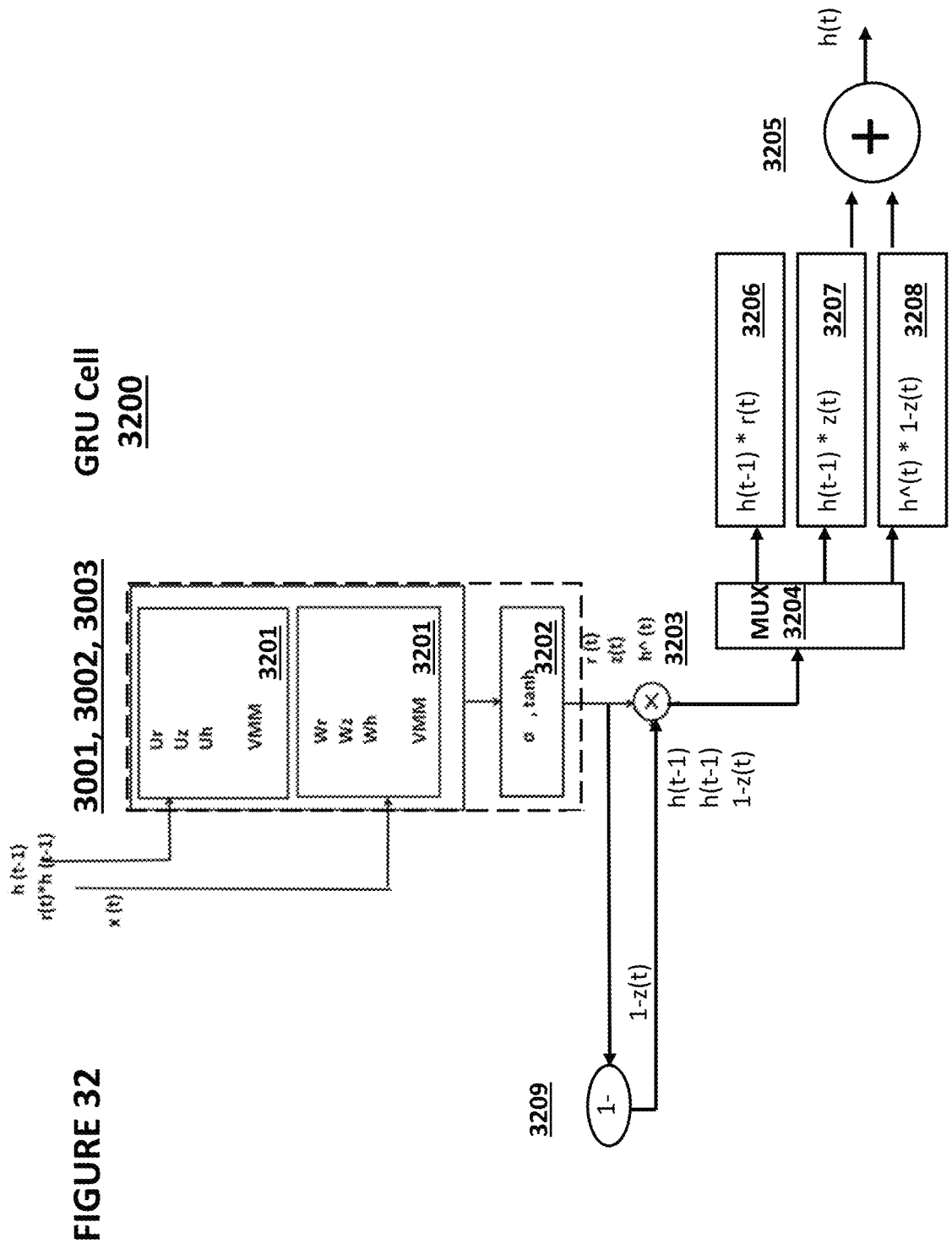
FIG. 32 depicts another embodiment of the exemplary cell of FIG. 30.

An alternative to GRU cell 3100 (and another example of an implementation of GRU cell 3000) is shown in FIG. 32. In FIG. 32, GRU cell 3200 utilizes VMM arrays 3201 and activation function block 3202, which when configured as a sigmoid function applies a number between 0 and 1 to control how much of each component in the input vector is allowed through to the output vector. In FIG. 32, sigmoid function devices 3001 and 3002 and tanh device 3003 share the same physical hardware (VMM arrays 3201 and activation function block 3202) in a time-multiplexed fashion. GRU cell 3200 also comprises multiplier device 3203 to multiply two vectors together, addition device 3205 to add two vectors together, complementary device 3209 to subtract an input from 1 to generate an output, multiplexor 3204, register 3206 to hold the value h(t−1)*r(t) when that value is output from multiplier device 3203 through multiplexor 3204, register 3207 to hold the value h(t−1)*z(t) when that value is output from multiplier device 3203 through multiplexor 3204, and register 3208 to hold the value h^(t)*(1−z(t)) when that value is output from multiplier device 3203 through multiplexor 3204.

Whereas GRU cell 3100 contains multiple sets of VMM arrays 3101 and activation function blocks 3102, GRU cell 3200 contains only one set of VMM arrays 3201 and activation function block 3202, which are used to represent multiple layers in the embodiment of GRU cell 3200. GRU cell 3200 will require less space than GRU cell 3100, as GRU cell 3200 will require ⅓ as much space for VMMs and activation function blocks compared to GRU cell 3100.

It can be further appreciated that systems utilizing GRUs will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight w can be implemented by a single memory cell or by a differential cell or by two blend memory cells (average of 2 or more cells). In the differential cell case, two memory cells are needed to implement a weight w as a differential weight (w=w+−w−). In the two blend memory cells, two memory cells are needed to implement a weight w as an average of two cells.

Embodiments for Precise Programming of Cells in a VMM

Embodiments for precisely programming memory cells within a VMM by incrementing or decrementing the programming voltages applied to different terminals of the memory cells will now be described.

Figure 33A:
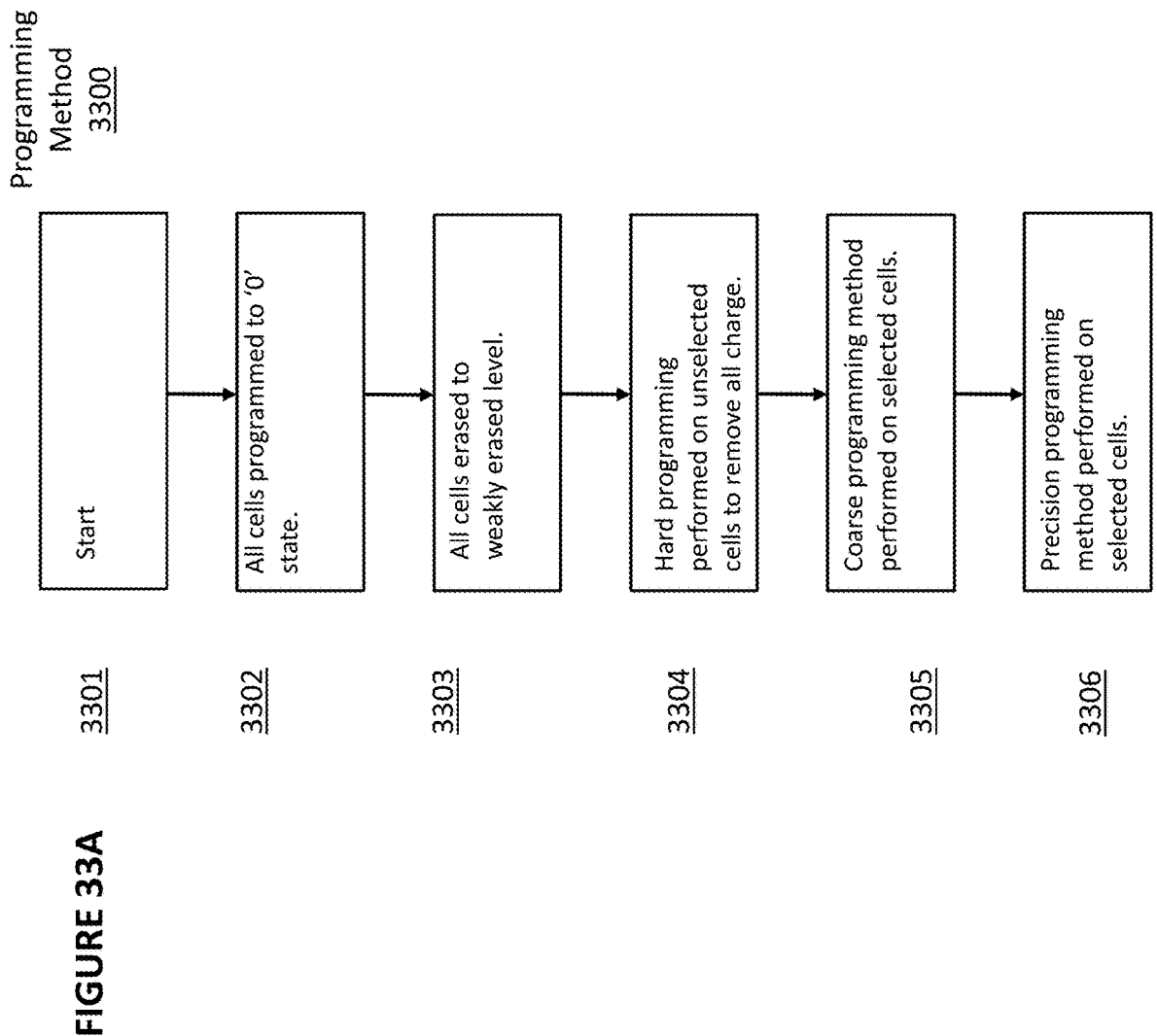
FIG. 33A depicts an embodiment of a method of programming a non-volatile memory cell.

FIG. 33A depicts programming method 3300. First, the method starts (step 3301), which typically occurs in response to a program (tuning) command being received. Next, a mass program operation programs all cells to a '0' state (step 3302). Then a soft erase operation erases all cells to an intermediate weakly erased level such that each cell would draw current of, for example, approximately 3-5 µA during a read operation (step 3303). This is in contrast to a deeply erased maximum level where each cell would draw current of approximately ~20-30 µA during a read operation. The soft erase is, for example, done by applying incremental erase voltage pulses until an intermediate cell current is reached. The incremental erase voltage pulses are done to limit the degradation to memory cells experienced from hard erase (i.e., maximum erase level). Then, a hard program is performed on all unselected cells to a very deep programmed state to add electrons to the floating gates of the cells (step 3304) to ensure that those cells are really "off," meaning that those cells will draw a negligible amount of current during a read operation, for example un-used memory cells. The hard program is performed for example with higher incremental program voltage pulses and/or longer program time.

A coarse programming method (to get the cell much closer to the target, for example 2×-100× the target) is then performed on the selected cells (step 3305), followed by a precision programming method on the selected cells (step 3306) to program the precise value desired for each selected cell.

Figure 33B:
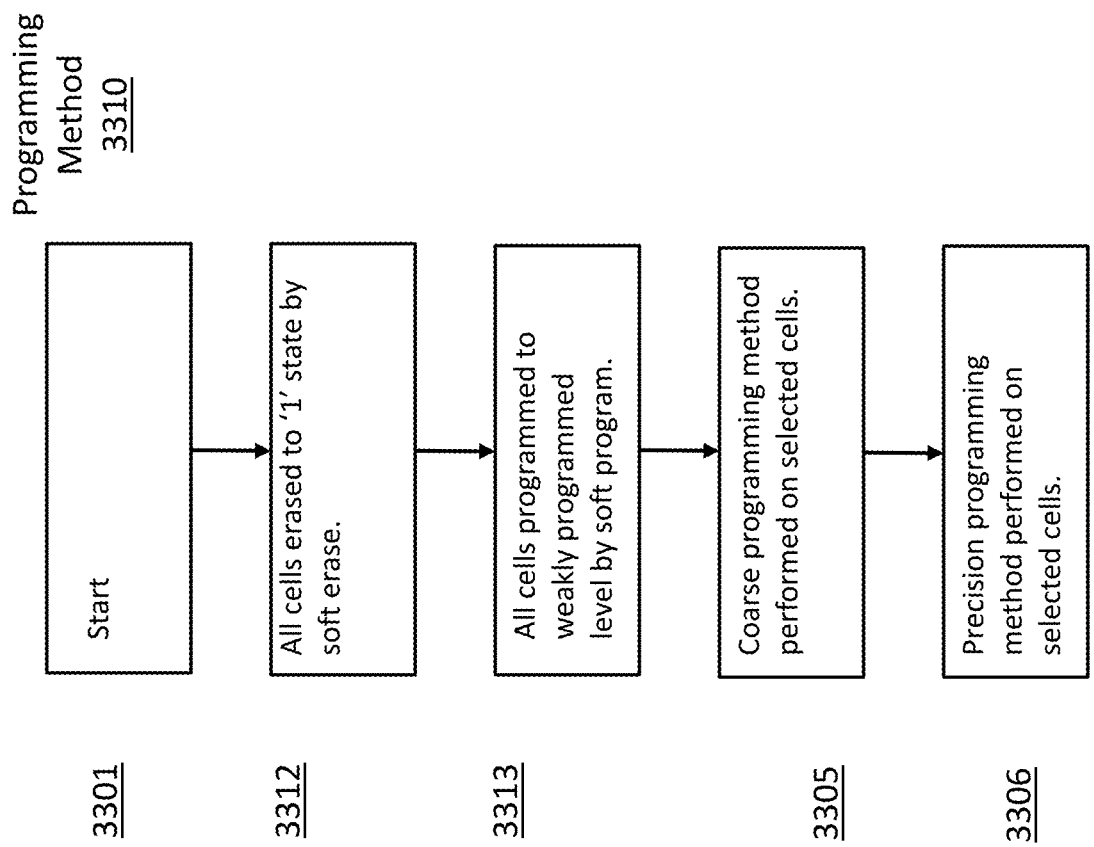
FIG. 33B depicts another embodiment of a method of programming a non-volatile memory cell.

FIG. 33B depicts another programming method 3310, which is similar to programming method 3300. However, instead of a program operation to program all cells to a '0' state as in step 3302 of FIG. 33A, after the method start (step 3301), a soft erase operation is used to erase all cells to a '1' state (step 3312). Then a soft program operation (step 3313) is used to program all cells to an intermediate level such that each cell would draw current of approximately 3-5 uA during a read operation. Afterward, coarse programming method 3305 and precision programming method 3306 are performed as in FIG. 33A. A variation of the embodiment of FIG. 33B would remove the soft program operation (step 3313) altogether. Multiple coarse programming methods can be used to speed up the programming such as by targeting multiple gradually smaller coarse targets before executing the precision (fine) programming step 3306. The precision programming method 3306 is done for example with fine (precision) incremental program voltage pulses or constant program timing pulses.

Different terminals of the memory cell can be used for coarse programming method 3305 and precision programming method 3306. That is, during coarse programming method 3305, the voltage applied to one of the terminals of the memory cell (which can be referred to as a coarse programming terminal) will be altered until the desired voltage level is achieved within floating gate 20, and during precision programming method 3306, the voltage applied to one of the terminals of the memory cell (which can be referred to as a precision programming terminal) will be altered until the desired level is achieved. The various combinations of terminals that can be used as the coarse programming terminal and the precision programming terminal are shown in Table 9:

TABLE NO. 9

Memory Cell Terminals Used for Coarse and Precision Programming Methods

| Programming Sequence Name | Coarse Programming Terminal | Precision Programming Terminal | Applicable Memory Cell Types |
|---|---|---|---|
| CG-CG | Control Gate 28 (CG) | Control Gate 28 (CG) | 310, 410, 510, 710 |
| CG-EG | Control Gate 28 (CG) | Erase Gate 30 (EG) | 410 |
| CG-EG | Control Gate 28 (CG) | Control Gate 28 (CG) and Erase Gate 30 (EG) or Source Line 14 (SL) | 410 |
| EG-EG | Erase Gate 30 (EG) | Erase Gate 30 (EG) | 410, 610 |
| EG-CG | Erase Gate 30 (EG) | Control Gate 28 (CG) | 410 |
| CG-SL | Control Gate 28 (CG) | Source Line 14 (SL) | 310, 410, 510, 710 |
| SL-CG | Source Line 14 (SL) | Control Gate 28 (CG) | 310, 410, 510, 710 |
| SL-EG | Source Line 14 (SL) | Erase Gate 30 (EG) | 410, 610 |

Other combinations of terminals are possible for the coarse programming and precision programming steps.

Figure 34:
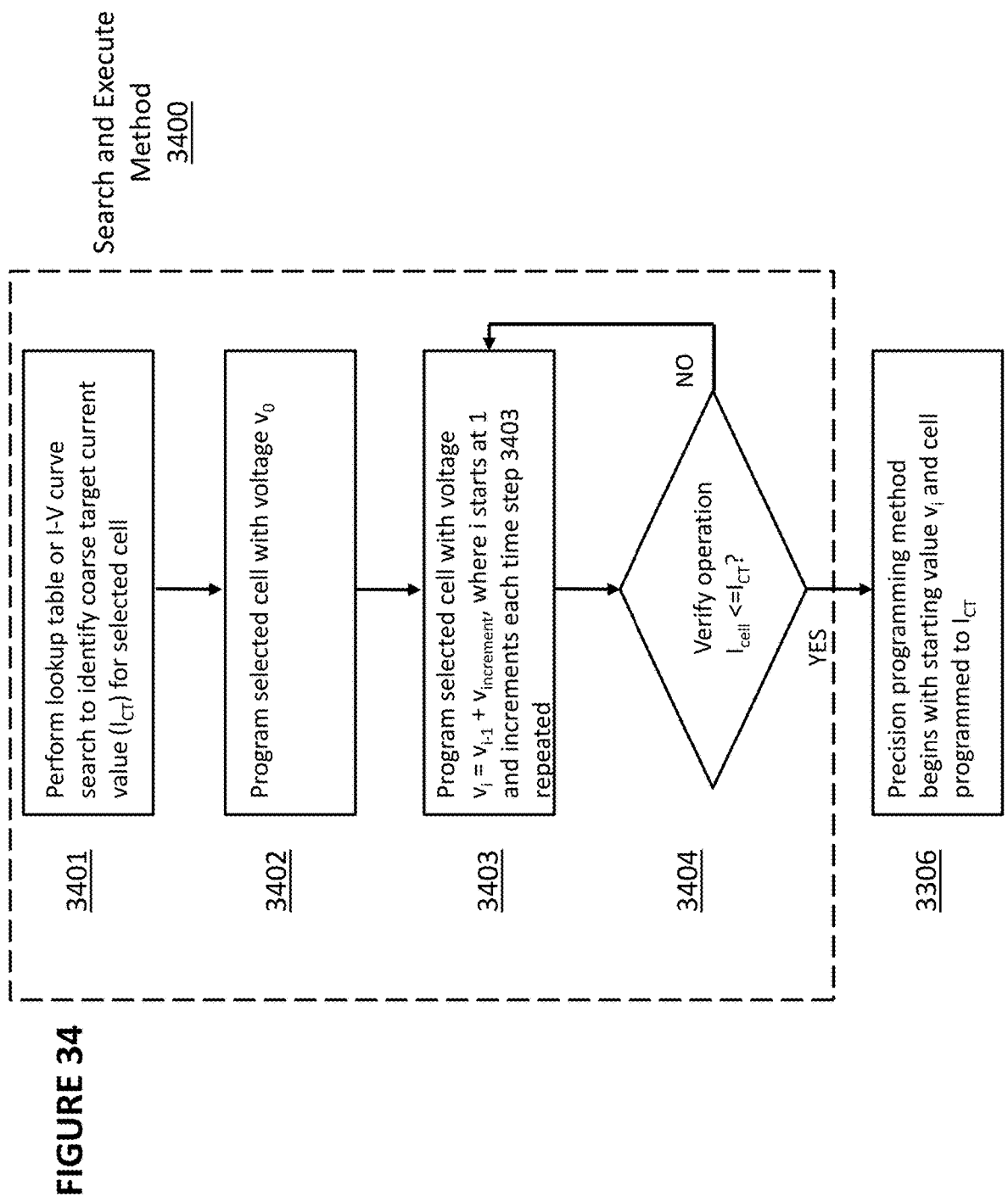
FIG. 34 depicts an embodiment of a coarse programming method.

FIG. 34 depicts a first embodiment of coarse programming method 3305, which is search and execute method 3400. First, a lookup table search or a function (I-V curve) is performed to determine a coarse target current value ($I_{CT}$) for the selected cell based on the value that is intended to be stored in that selected cell (step 3401). This table is, for example, created by silicon characterization or from calibration from wafer testing. The selected cell can be programmed to store one of N possible values (e.g., 128, 64, 32, etc.). Each of the N values correspond to a different desired current value (ID) that is drawn by the selected cell during a read operation. In one embodiment, a look-up table might contain M possible current values to use as the coarse target current value $I_{CT}$ for the selected cell during search and execute method 3400, where M is an integer less than N. For example, if N is 8, then M might be 4, meaning that there are 8 possible values that the selected cell can store, and one of 4 coarse target current values will be selected as the coarse target for search and execute method 3400. That is, search and execute method 3400 (which again is an embodiment of coarse programming method 3305) is intended to quickly program the selected cell to a value ($I_{CT}$) that is somewhat close to the desired value ($I_D$), and then the precision programming method 3306 is intended to more precisely program the selected cell to achieve or be extremely close to the desired value ($I_D$).

Examples of cell values, desired current values, and coarse target current values are depicted in Tables 10 and 11 for the simple example of N=8 and M=4:

TABLE NO. 10

Example of N Desired Current Values for N = 8

| Value to be Stored in Selected Cell | Desired Current Value ($I_D$) |
|---|---|
| 000 | 0.5 nA |
| 001 | 1 nA |
| 010 | 1.5 nA |
| 011 | 2 nA |
| 100 | 2.5 nA |
| 101 | 3 nA |
| 110 | 3.5 nA |
| 111 | 4 nA |

TABLE NO. 11

Example of M Target Current Values for M = 4

| Coarse Target Current Value ($I_{CT}$) | Associated Cell Values |
|---|---|
| 4 nA + $I_{CTOFFSET1}$ | 000, 001 |
| 8 nA + $I_{CTOFFSET2}$ | 010, 011 |
| 12 nA + $I_{CTOFFSET3}$ | 100, 101 |
| 16 nA + $I_{CTOFFSET4}$ | 110, 111 |

The offset values $I_{CTOFFSETx}$ are used to prevent overshooting the desired current value during coarse tuning.

Once the coarse target current value $I_{CT}$ is selected, in step 3402 the selected cell is programmed by applying an initial voltage $v_0$ to the coarse programming terminal of the selected cell according to one of the sequences listed in Table 9, above. (The value of initial voltage $v_0$ and appropriate coarse programming terminal, optionally can be determined from a voltage look up table that stores $v_0$ vs. coarse target current value $I_{CT}$):

TABLE NO. 12

Initial Voltage $v_0$ Applied to Coarse Programming Terminal

| Programming Sequence Name | Coarse Programming Terminal | Initial Voltage $v_o$ Applied to Coarse Programming Terminal |
|---|---|---|
| CG-CG | Control Gate 28 (CG) | 3-6 V |
| CG-EG | Control Gate 28 (CG) | 3-6 V |
| EG-EG | Erase Gate 30 (EG) | 0-3 V |

TABLE NO. 12-continued

Initial Voltage $v_0$ Applied to Coarse Programming Terminal

| Programming Sequence Name | Coarse Programming Terminal | Initial Voltage $v_o$ Applied to Coarse Programming Terminal |
|---|---|---|
| CG-SL | Control Gate 28 (CG) | 3-6 V |
| SL-CG | Source Line 14 (SL) | 3-4 V |
| SL-EG | Source Line 14 (SL) | 3-4 V |

Next, in step 3403, the selected cell is programmed by applying the voltage $v_i=v_{i-1}+v_{increment}$, to the coarse programming terminal, where i starts at 1 and increments each time this step is repeated, and where $v_{increment}$ is an increment of coarse voltage that will cause a degree of programming that is appropriate for the granularity of change desired. Thus, the first time step 3403 is performed, i=1, and $v_1$ will be $v_0+v_{increment}$. Then a verify operation occurs (step 3404), wherein a read operation is performed on the selected cell and the current drawn through the selected cell ($I_{cell}$) is measured. If $I_{cell}$ is less than or equal to $I_{CT}$ (which here is a first threshold value), then search and execute method 3400 is complete and precision programming method 3306 can begin. If $I_{cell}$ is not less than or equal to $I_{CT}$, then step 3403 is repeated, and i is incremented.

Thus, at the point when coarse programming method 3305 ends and precision programming method 3306 begins, the voltage $v_i$ will be the last voltage applied to the coarse programming terminal to program the selected cell, and the selected cell will be storing a value associated with the coarse target current value $I_{CT}$, particularly less than or equal to $I_{CT}$. The goal of precision programming method 3306 is to program the selected cell to the point where during a read operation it draws current $I_D$ (plus or minus an acceptable margin of deviation, such as +/−30% or less), which is the desired current value that is associated with the value that is intended to be stored in the selected cell.

Figure 35:
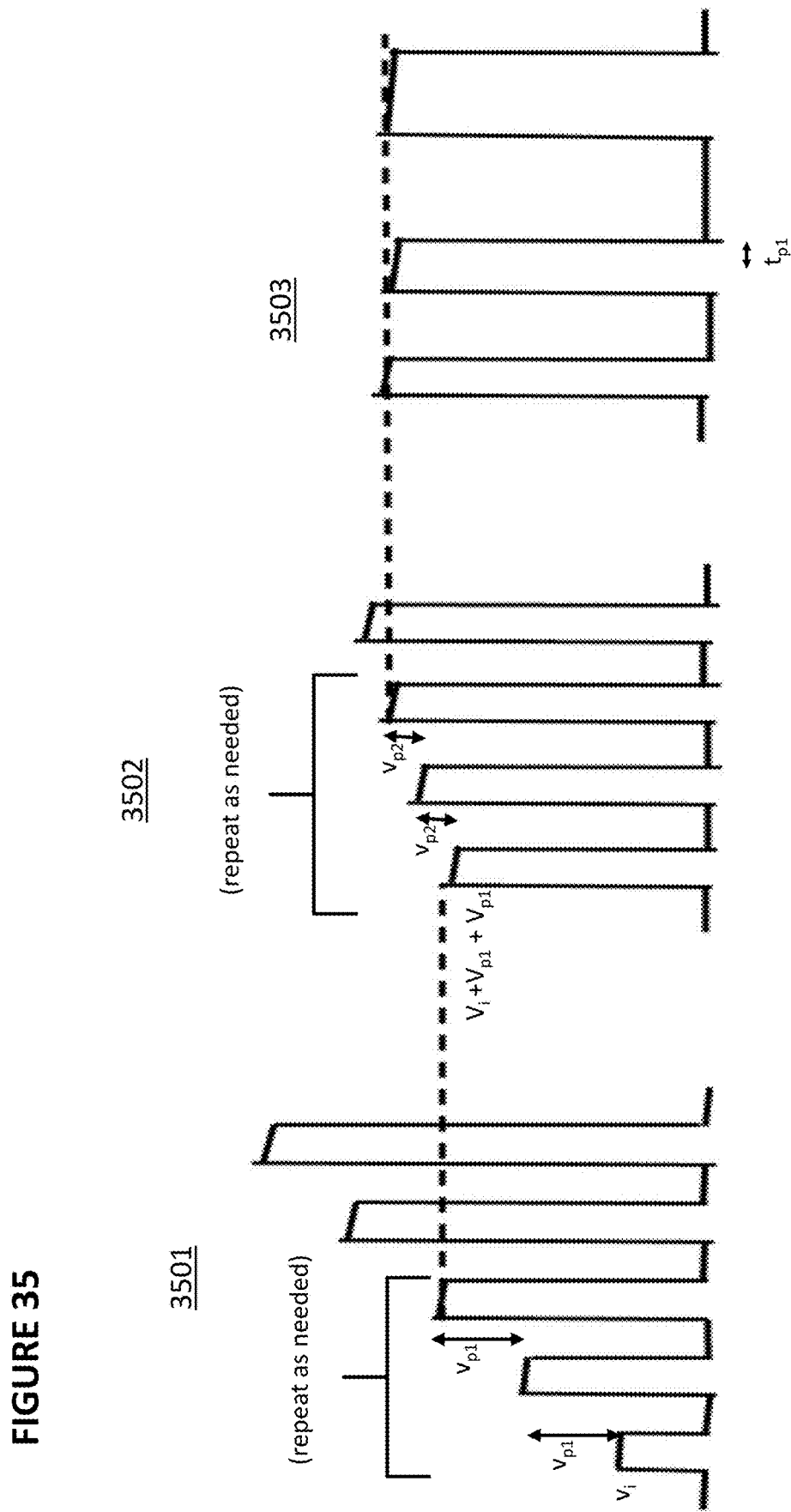
FIG. 35 depicts exemplary pulses used in the programming of a non-volatile memory cell.

FIG. 35 depicts examples of different voltage progressions that can be applied to the coarse programming terminal of a selected memory cell according to Table No. 9 during coarse programming method 3305 and/or the precision programming terminal of the selected memory cell during precision program method 3306.

Under a first approach, increasing voltages are applied in progression to the coarse programming terminal and/or the precision programming terminal to further program the selected memory cell. The starting point is $v_i$, which is the last voltage applied during coarse programming method 3305. An increment of $v_{p1}$ is added to $v_i$ and the voltage $v_i+v_{p1}$ is then used to program the selected cell (indicated by the second pulse from the left in progression 3501). $v_{p1}$ is an increment that is smaller than $v_{increment}$ (the voltage increment used during coarse programming method 3305). After each programming voltage is applied to programming terminal, a verify step (similar to step 3404) is performed, where a determination is made if Icell is less than or equal to $I_{PT1}$ (which is the first precision target current value and here is a second threshold value), where $I_{PT1}=I_D+I_{PT1OFFSET}$, where $I_{PT1OFFSET}$ is an offset valued added to prevent program overshoot. If it is not, then another increment $v_{p1}$ is added to the previously-applied programming voltage, and the process is repeated. This repeats until the point where $I_{cell}$ is less than or equal to $I_{PT1}$, at which point this portion of the programming sequence stops. Optionally, if $I_{PT1}$ is equal to $I_D$, or almost equal to $I_D$ with sufficient allowed precision, then the selected memory cell has been successfully programmed.

Figure 36A:
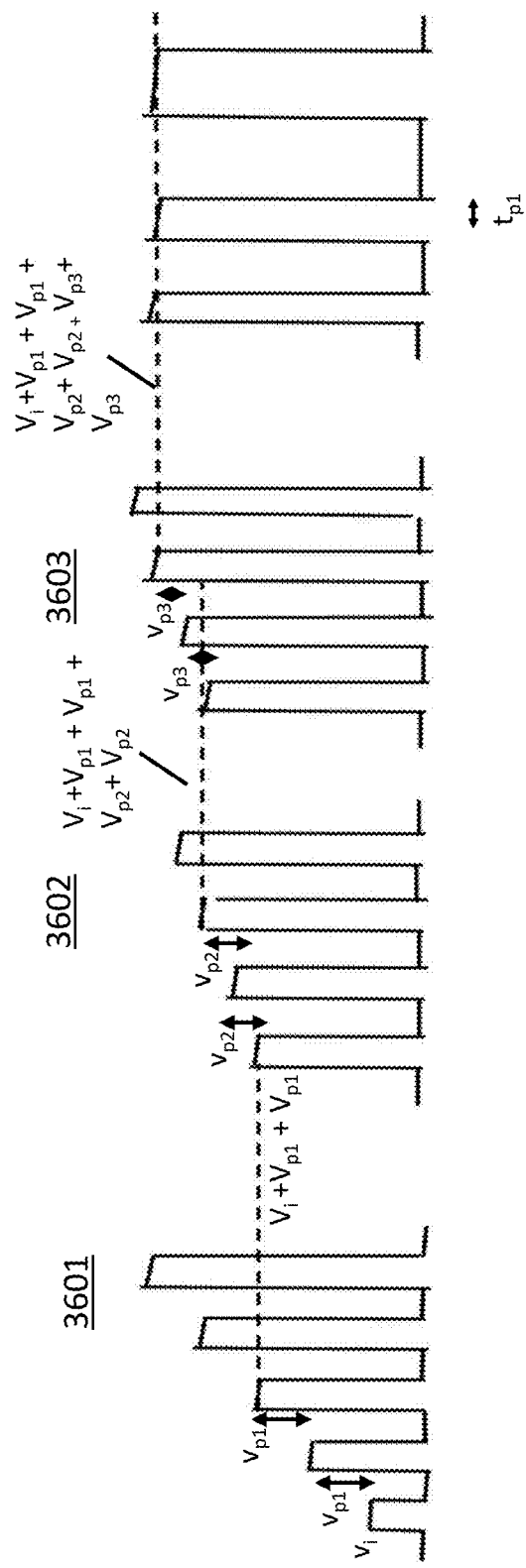
FIG. 36A depicts exemplary pulses used in the programming of a non-volatile memory cell.

If $I_{PT1}$ is not close enough to $I_D$, then further programming of a smaller granularity can occur. Here, progression 3502 is now used. The starting point for progression 3502 is the last voltage used for programming under progression 3501. An increment of $V_{p2}$ (which is smaller than $v_{p1}$) is added to that voltage, and the combined voltage is applied to the precision programming terminal to program the selected memory cell. After each programming voltage is applied, a verify step (similar to step 3404) is performed, where a determination is made if $I_{cell}$ is less than or equal to $I_{PT2}$ (which is the second precision target current value and here is a third threshold value), where $I_{PT2}=I_D+I_{PT2OFFSET}$, $I_{PT2OFFSET}$ is an offset value added to prevent program overshoot. If it is not, then another increment $V_{p2}$ is added to the previously-applied programming voltage, and the process is repeated. This repeats until the point where $I_{cell}$ is less than or equal to $I_{PT2}$, at which point this portion of the programming sequence stops. Here, it is assumed that $I_{PT2}$ is equal to $I_D$ or close enough to $I_D$ that the programming can stop, since the target value has been achieved with sufficient allowed precision. One of ordinary skill in the art can appreciate that additional progressions can be applied with smaller and smaller programming increments used. For example, in FIG. 36A, three progressions (3601, 3602, and 3603) are applied instead of just two.

A second approach is shown in progression 3503. Here, instead of increasing the voltage applied during the programming of the selected memory cell, the same voltage (such as $V_i$, or $V_i+V_{p1}+V_{p1}$, or $V_i+V_{p2}+V_{p2}$) is applied for durations of increasing period. Instead of adding an incremental voltage, such as $v_{p1}$ in progression 3501 and $v_{p2}$ in progression 3502, an additional increment of time $t_{p1}$ is added to the programming pulse such that each applied pulse is longer than the previously-applied pulse by $t_{p1}$. After each programming pulse is applied to the precision programming terminal, the same verify step is performed as described previously for progression 3501. Optionally, additional progressions can be applied where the additional increment of time added to the programming pulse is of a smaller duration than the previous progression used.

Optionally, additional program cycle progressions can be applied where the programming pulse is of same duration as the previous program cycle progression used. Although only one temporal progression is shown, one of ordinary skill in the art will appreciate that any number of different temporal progressions can be applied. That is, instead of altering the voltage magnitude used during programming or altering the period of a voltage pulse used during programming, the system instead can alter the number of programming cycles used.

Figure 36B:
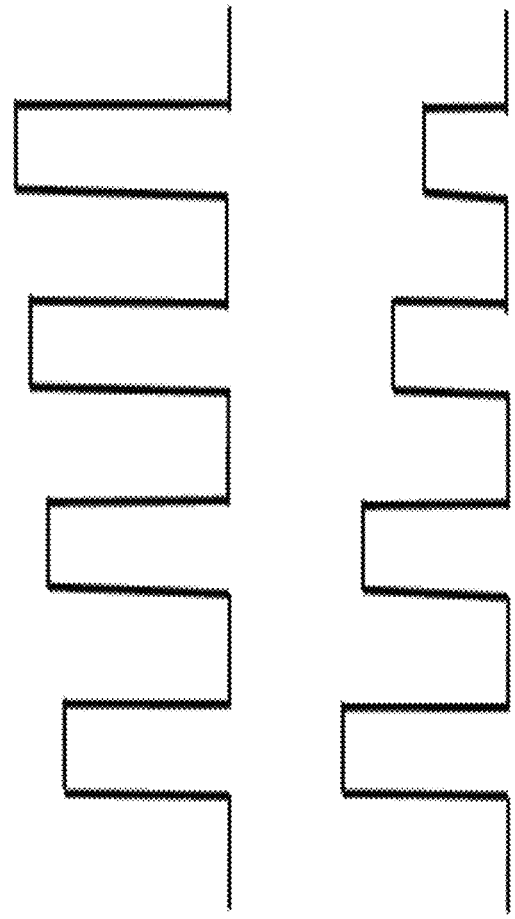
FIG. 36B depicts exemplary complementary increment and decrement pulses used in the programming of a non-volatile memory cell.

FIG. 36B shows a diagram of complementary pulse program progression in which the voltage applied to one precision programming terminal increases while the voltage applied to another precision programming terminal decreases. For example, an increasing voltage progression can be applied to the control gate of the selected cell and a decreasing voltage progression applied to the erase gate or source line of the selected cell. Or in the alternative, an increasing voltage progression can be applied to the erase gate or source line of the selected cell and a decreasing voltage progression applied to the control gate of the selected cell. These complementary progressive program pulses result in greater precision in programming. For example, in a programming pulse cycle with CG increments of 10 mV and EG decrements of 20 mV, the resulting voltage in the FG after a precision programming pulse cycle is 10 mV*40%−20 mV*15%=~1 mV, assuming a 40% CG coupling ratio and a 10% EG coupling ratio to FG. This complementary pulses program method can be used in precision program step 3306 after coarse program step 3305, as coarse program step 3305 typically will use only CG increments or EG increments during its programming operations.

Additional detail will now be provided for second and third embodiments of coarse programming method 3305.

Figure 37:
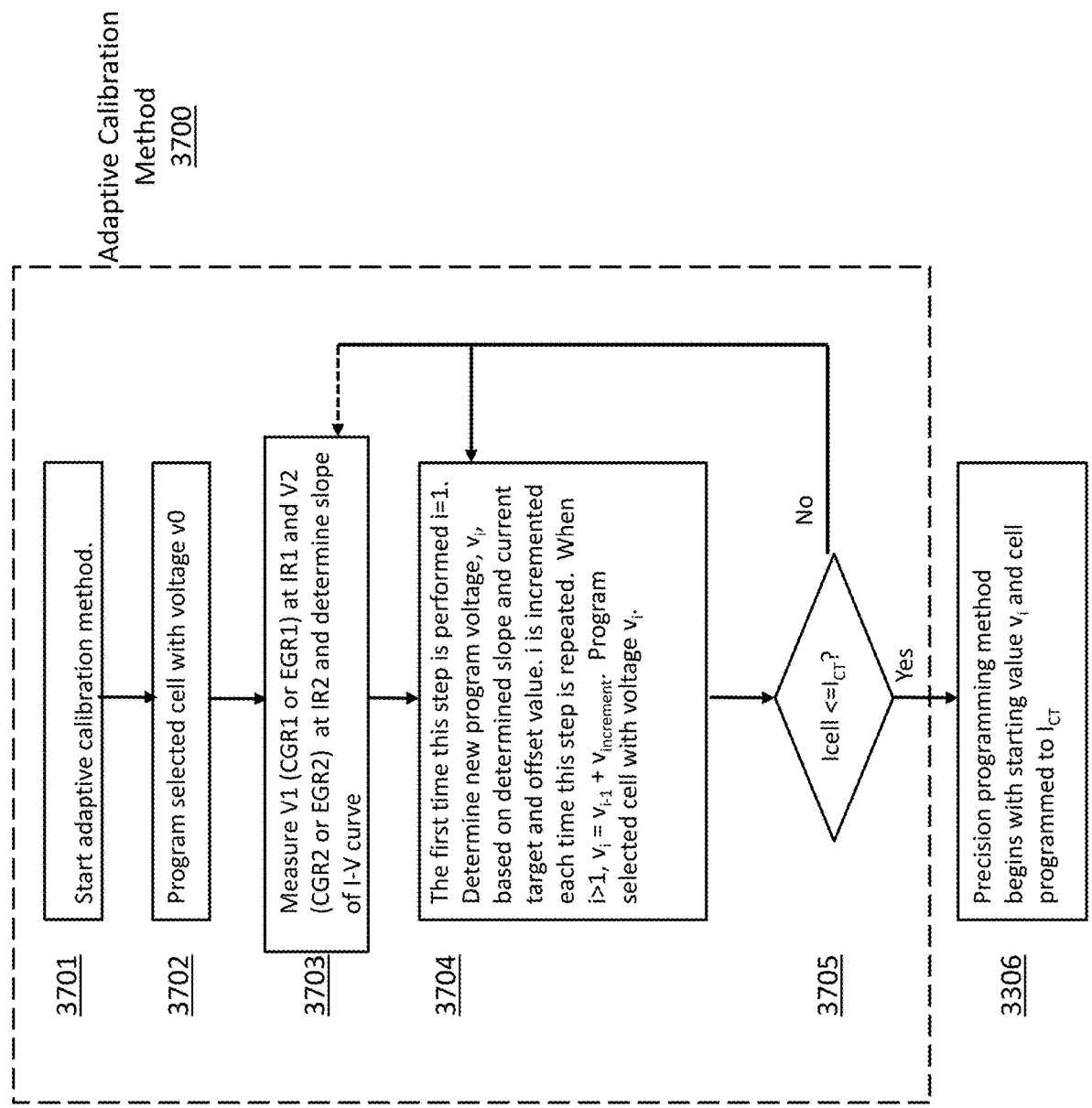
FIG. 37 depicts a calibration algorithm for the programming of a non-volatile memory cell that adjusts the programming parameters based on slope characteristics of the cell.

FIG. 37 depicts a second embodiment of coarse programming (tuning) method 3305, which is adaptive calibration method 3700. The method starts (step 3701). The cell is programmed by applying an initial voltage $v_0$ to the coarse programming terminal according to one of the sequences shown in Table No. 9 (step 3702). Unlike in search and execute method 3400, here $v_0$ is not derived from a lookup table, and instead can be a relatively small pre-determined initial value. The control gate (or erase gate) voltage of the cell (which can be referred to as CG1 or EG1) is measured at a first current value IR1 (e.g., 100 na), and the voltage on the same gate (which can be referred to as CG2 or EG2) is measured at a second current value IR2 (e.g., 10 na), i.e. in a non-limiting embodiment where IR2 is 10% of IR1, and a sub-threshold I-V slope is determined based on those measurements (e.g., 360 mV/dec of current or dV/d LOG (I)) and stored (step 3703). An I-V slope in the linear region would be dV/dI.

A new program voltage, $v_i$, is determined. The first time this step is performed, i=1, and program voltage $v_1$ is determined based on the stored sub-threshold slope value and a current target and offset value using a sub-threshold equation, such as the following:

$$vi = v_{i-1} + v_{increment},$$

$v_{increment}$ is proportional to slope of Vg $$Vg = n*Vt*\log [Ids/wa*Io]$$

Here, wa is w of a memory cell, Ids is the cell current, Io is the cell current when Vg=Vth, Vt is thermal voltage, and utilizing g from 1 to 2, where V1 is determined at current IR1 and V2 is determined at current IR2.

$$\text{slope} = (V1-V2)/(\text{LOG}(IR1)-\text{LOG}(IR2))$$

where $v_{increment}$=alpha*slope*(LOG (IR1)−LOG ($I_{CT}$)), where $I_{CT}$ is the target current and alpha is a pre-determined constant <1 (programming offset value) to prevent overshoot, e.g., 0.9.

If the stored slope value is relatively steep, then a relatively small current offset value can be used. If the stored slope value is relatively flat, then a relatively high current offset value can be used. Thus, determining the slope information will allow for a current offset value to be selected that is customized for the particular cell in question. This will generally make the programming process shorter. When step 3704 is repeated, i is incremented, and $v_i = v_{i-1} + v_{increment}$. The cell is then programmed by applying $v_i$ to the coarse adaptive programming terminal. $v_{increment}$ can also be determined from a lookup table storing values of $v_{increment}$ vs. target current value.

Next, a verify operation occurs, wherein a read operation is performed on the selected cell and the current drawn through the selected cell ($I_{cell}$) is measured (step 3705). If $I_{cell}$ is less than or equal to $I_{CT}$ (which here is a coarse target threshold value), where $I_{CT} = I_D + I_{CTOFFSET}$, where $I_{CTOFFSET}$ is an offset value added to prevent program overshoot, then adaptive calibration method 3700 is complete and precision programming method 3306 can begin. If $I_{cell}$ is not less than or equal to $I_{CT}$, then steps 3704-3705 (where a new slope measurement is measured with new data points) or steps 3703-3705 (where the same slope used previously is re-used) are repeated, and i is incremented.

Figure 38:
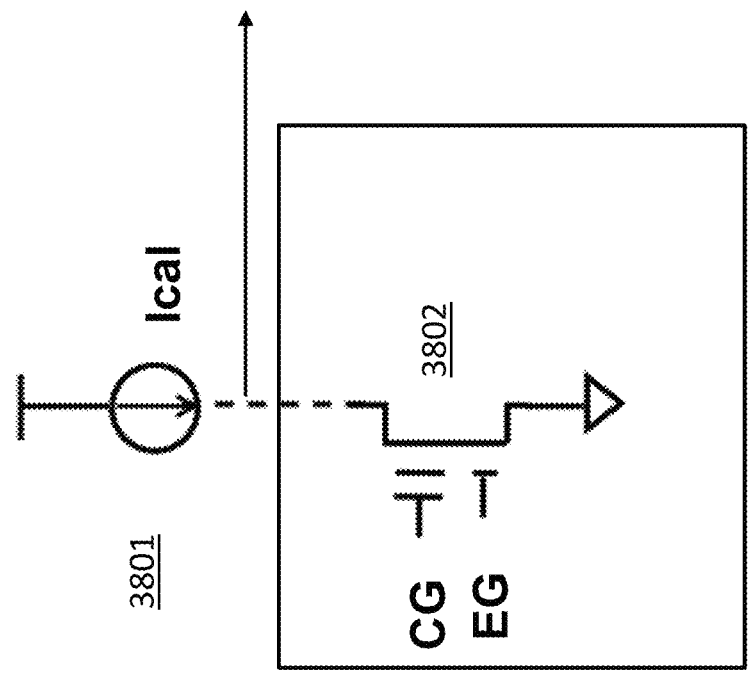
FIG. 38 depicts a circuit used in the calibration algorithm of FIG. 37.

FIG. 38 depicts a high level block diagram of a circuit for implementation of method 3703. Current source 3801 is used to apply the exemplary current values IR1 and IR2 to the selected cell (here, memory cell 3802), and the voltage (V1 (VCGR1 or VEGR1) for IR1 and V2 (VCGR2 or VEGR2) for IR2) at the coarse programming terminal of memory cell 3802 is then measured, with the coarse programming terminal selected according to Table No. 9. The linear slope will be (V1-V2)/decade of cell current on LOG I-V curve, or equivalently equals to (V1−V2)/(LOG (IR1)−LOG (IR2))

Figure 39:
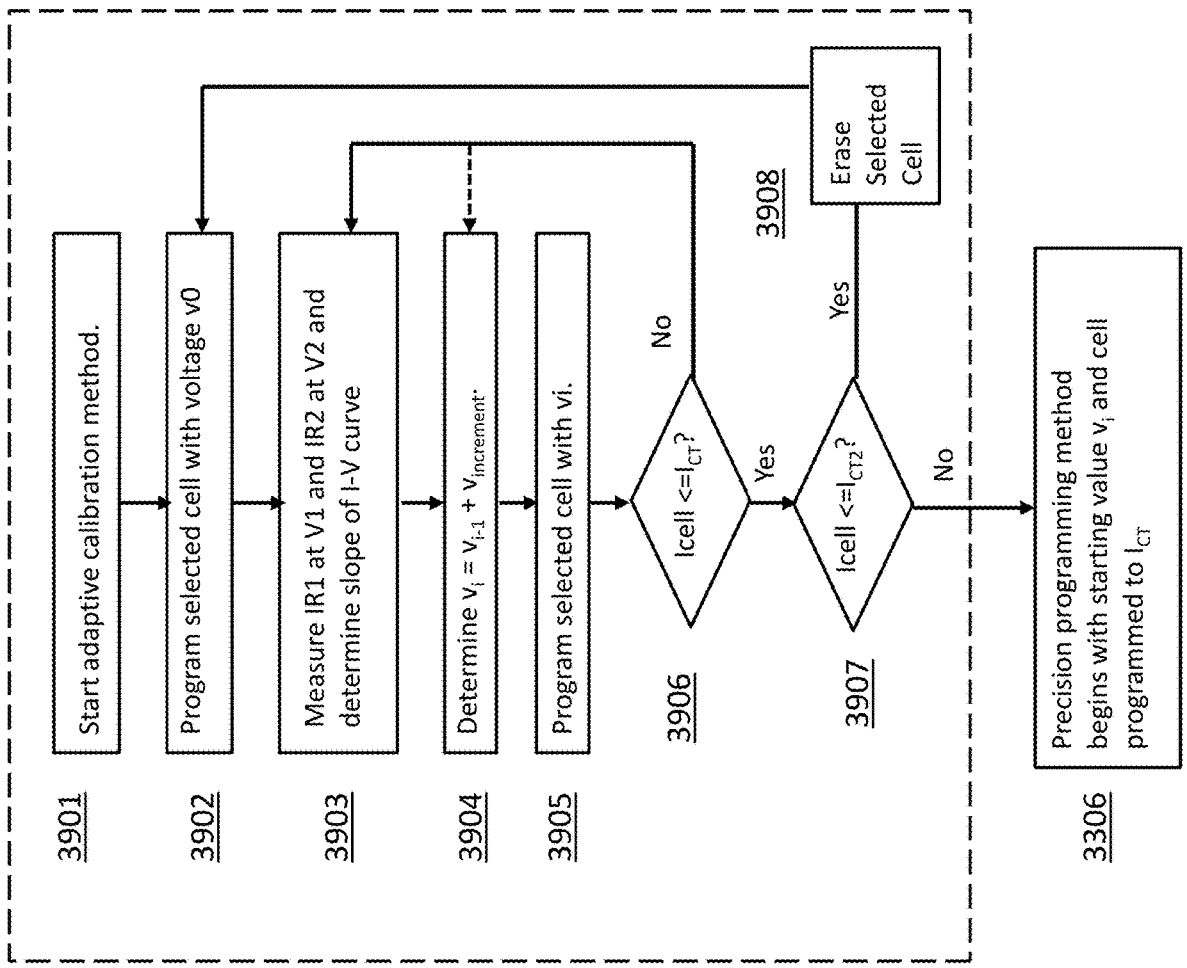
FIG. 39 depicts a calibration algorithm for the programming of a non-volatile memory cell.

FIG. 39 depicts a third embodiment of programming method 3305, which is adaptive calibration method 3900. The method starts (step 3901). The cell is programmed at a default start value $v_0$ (step 3902) by applying $v_0$ to the coarse adaptive programming terminal of the cell. $v_0$ is derived from a lookup table such as created from silicon characterization, and the table value is offset such as not to overshoot the programmed target. Examples of $v_0$ are shown in Table No. 13:

TABLE NO. 13

Initial Voltage $v_0$ Applied to Coarse Adaptive Programming Terminal During Adaptive Calibration Method 3900

| Programming Sequence Name | Coarse Adaptive Programming Terminal | Initial Voltage $v_o$ Applied to Coarse Programming Terminal | V1 | V2 |
| --- | --- | --- | --- | --- |
| CG-CG | Control Gate 28 (CG) | ~5-7 V | ~1.3 | ~1.5 V |
| CG-EG | Control Gate 28 (CG) | ~5-7 V | ~1.3 | ~1.5 V |
| EG-EG | Erase Gate 30 (EG) | ~0-2 V | ~1.3 | ~1.5 V |
| CG-SL | Control Gate 28 (CG) | ~5-7 V | ~1.3 | ~1.5 V |
| SL-CG | Source Line 14 (SL) | ~3-3.5 V | ~1.3 | ~1.5 V |
| SL-EG | Source Line 14 (SL) | ~3-3.5 V | ~1.3 | ~1.5 V |

In step 3903 an I-V slope parameter is created which is used in predicting the next programming voltage. A first voltage, V1, is applied to the control gate or erase gate of the selected cell, and the resulting cell current, $IR_1$, is measured. Then a second voltage, V2, is applied to the control gate or erase gate of the selected cell, and the resulting cell current, IR2, is measured. A slope is determined based on those measurements and stored, for example as according to the equation in sub-threshold region (cell operating in sub-threshold):

$$\text{slope} = (V1-V2)/(\text{LOG}(IR1)-\text{LOG}(IR2))$$

(step 3903). Examples of values for V1 and V2 are shown in Table No. 13, above.

Determining the I-V slope information allows for a $v_{increment}$ value to be selected that is customized for the particular cell in question. This generally will make the programming process shorter.

Each time step 3904 is performed, i is incremented, with an initial value of 0, to determine a desired programming voltage, $v_i$, based on the stored slope value and a current target and offset value using an equation such as the following:

$$v_i = v_{i-1} + v_{increment},$$

where $v_{increment} = \text{alpha} * \text{slope} * (\text{LOG}(IR_1) - \text{LOG}(I_{CT}))$, where $I_{CT}$ is the target current and alpha is a pre-determined constant <1 (programming offset value) to prevent overshoot, e.g., 0.9.

The selected cell is then programmed using $v_i$. (step 3905)

Next, a verify operation occurs, wherein a read operation is performed on the selected cell and the current drawn through the selected cell ($I_{cell}$) is measured (step 3906). If $I_{cell}$ is less than or equal to $I_{CT}$ (which here is a coarse target threshold value), where $I_{CT} = I_D + I_{CTOFFSET}$, where $I_{CTOFFSET}$ is an offset value added to prevent program overshoot, then the process proceeds to the step 3907. If not, then the process returns to step 3903 (new slope measurement) or 3904 (previous slope re-used) and i is incremented.

In step 3907, $I_{cell}$ is compared against a threshold value, $I_{CT2}$, that is smaller than $I_{CT}$. The purpose of this is to see if an overshoot has occurred. That is, although the goal is for $I_{cell}$ to be below $I_{CT}$, if it falls too far below $I_{CT}$, then an overshoot has occurred and the stored value may actually correspond to the wrong value. If $I_{cell}$ is not less than or equal to $I_{CT2}$, then no overshoot has occurred, and adaptive calibration method 3900 has completed, as which point the process progresses to precision programming method 3306. If $I_{cell}$ is less than or equal to $I_{CT2}$, then an overshoot has occurred. The selected cell is then erased (step 3908), and the programming process starts over at step 3902. Optionally, if step 3908 is performed more than a predetermined number of times, the selected cell can be deemed a bad cell that should not be used, and an error signal is output, or a flag set, identifying the cell.

The precision program method 3306 may consist of multiple verify and program cycles, in which the program voltage is incremented by a constant fine voltage with a fixed pulse width or in which the program voltage is fixed and the program pulse width is varied for each additional programming pulse.

Optionally, step 3906 of determining if the current through the selected non-volatile memory cell during a read or verify operation is less than or equal to the first threshold current value can be performed by applying fixed biases to terminals of the non-volatile memory cell, measuring and digitizing the current drawn by the selected non-volatile memory cell to generate digital output bits, and comparing the digital output bits to digital bits representing the first threshold current, $I_{CT}$.

Optionally, step 3907 of determining if the current through the selected non-volatile memory cell during a read or verify operation is less than or equal to the second threshold current value can be performed by applying fixed biases to terminals of the non-volatile memory cell, measuring and digitizing the current drawn by the selected non-volatile memory cell to generate digital output bits, and comparing the digital output bits to digital bits representing the second threshold current, $I_{CT2}$.

Optionally, each of step 3906, 3907 of determining if the current through the selected non-volatile memory cell during a read or verify operation is less than or equal to the first, or second threshold current value, respectively, can be performed by applying an input to a terminal of the non-volatile memory cell, modulating the current drawn by the selected non-volatile memory cell with an output pulse to generate a modulated output, digitizing the modulated output to generate digital output bits, and comparing the digital output bits to digital bits representing the first or second threshold current value, respectively.

Measuring cell current for the purpose of verifying or reading the current can be done by averaging over multiple times, e.g., 8-32 times, to reduce the impact of noise.

Figure 40:
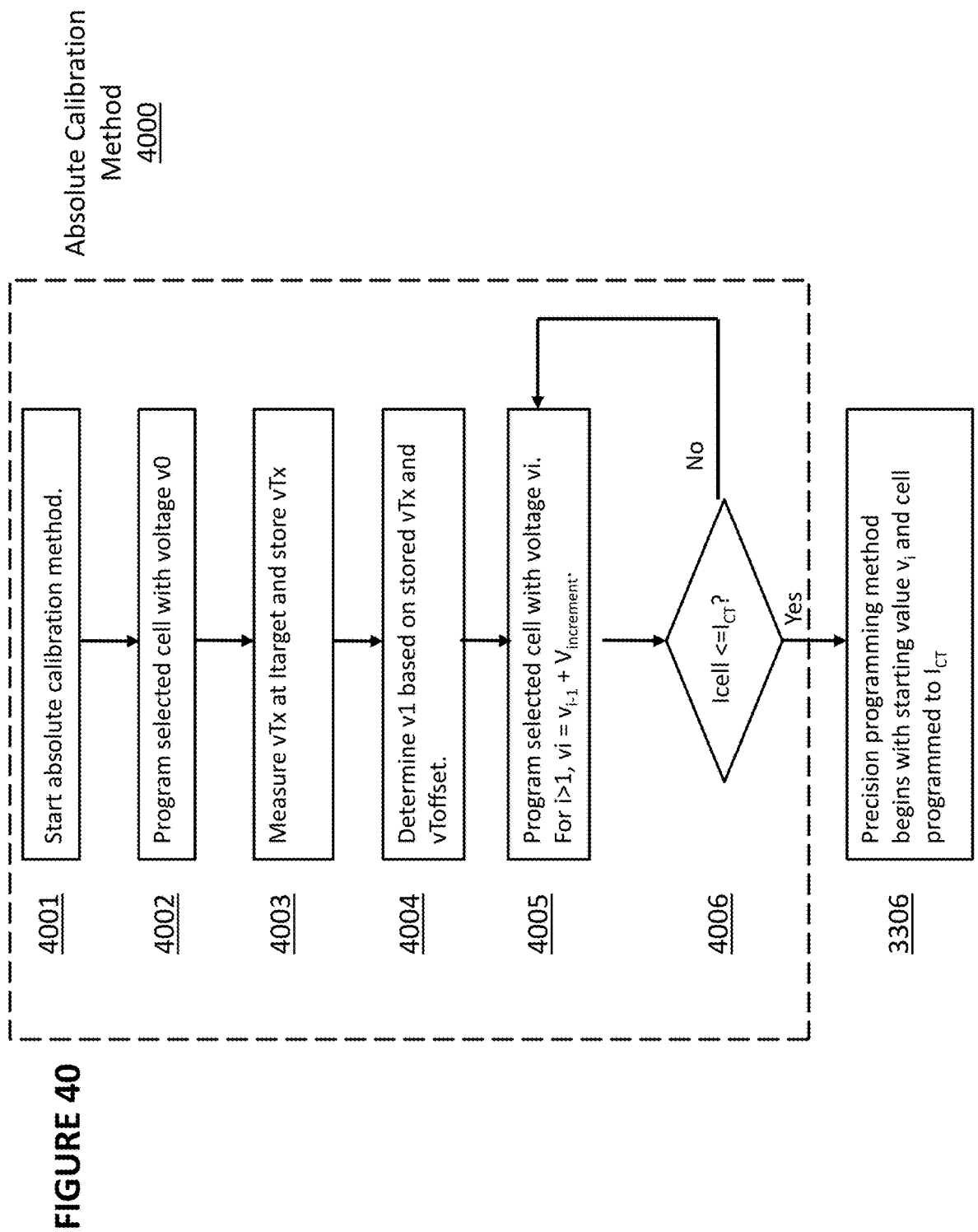
FIG. 40 depicts a calibration algorithm for the programming of a non-volatile memory cell.

FIG. 40 depicts a fourth embodiment of coarse programming method 3305, which is absolute calibration method 4000. The method starts (step 4001). The relevant terminal of the cell is programmed at a default starting value $v_0$ (step 4002). Examples of $v_0$ are shown in Table No. 14:

TABLE NO. 14

| Initial Voltage $v_0$ Applied to Memory Cell Terminal During Absolute Calibration Method 4000 | | |
|---|---|---|
| Programming Sequence Name | Coarse Programming Terminal | Initial Voltage $v_o$ Applied to Coarse Programming Terminal |
| CG-CG | Control Gate 28 (CG) | ~5-7 V |
| CG-EG | Control Gate 28 (CG) | ~5-7 V |
| EG-EG | Erase Gate 30 (EG) | ~0-2 V |
| CG-SL | Control Gate 28 (CG) | ~5-7 V |
| SL-CG | Source Line 14 (SL) | ~3-3.5 V |
| SL-EG | Source Line 14 (SL) | ~3-3.5 V |

The voltage vTx on the coarse programming terminal is measured at a current value Itarget driven through the cell as described above in relation to FIG. 38, and stored (step 4003). A new coarse programming voltage, $v_1$, is determined based on the stored voltage vTx and offset value, vToffset (which corresponds to a Ioffset) (step 4004). For example, the new desired voltage, $v_1$, can be calculated as follows: $v_1 = v_0 + (\text{VTBIAS} - \text{vTx}) - \text{vToffset}$, where VTBIAS for example=~1.5V, which is the default terminal voltage at a maximum target current (meaning the maximum current level that the memory cell allows). Basically the new target voltage is adjusted by the amount that is the difference from the current voltage vTx at target current and the maximum voltage and the offset.

The cell is then programmed using $v_i$ (step 4005). When i=1, the voltage $v_1$ from step 4004 is used. When i>=2, the voltage $v_i = v_{i-1} + v_{increment}$ is used. $v_{increment}$ can be determined from a lookup table storing values of $v_{increment}$ vs. target current value. Next, a verify operation occurs, wherein a read operation is performed on the selected cell and the current drawn through the selected cell ($I_{cell}$) is compared to $I_{CT}$ (step 4006). If $I_{cell}$ is less than or equal to $I_{CT}$ (which here is a threshold value), then absolute calibration method 4000 is complete and precision programming method 3306 can begin. If $I_{cell}$ is not less than or equal to $I_{CT}$, then steps 4005-4006 are repeated, and i is incremented.

Figure 41:
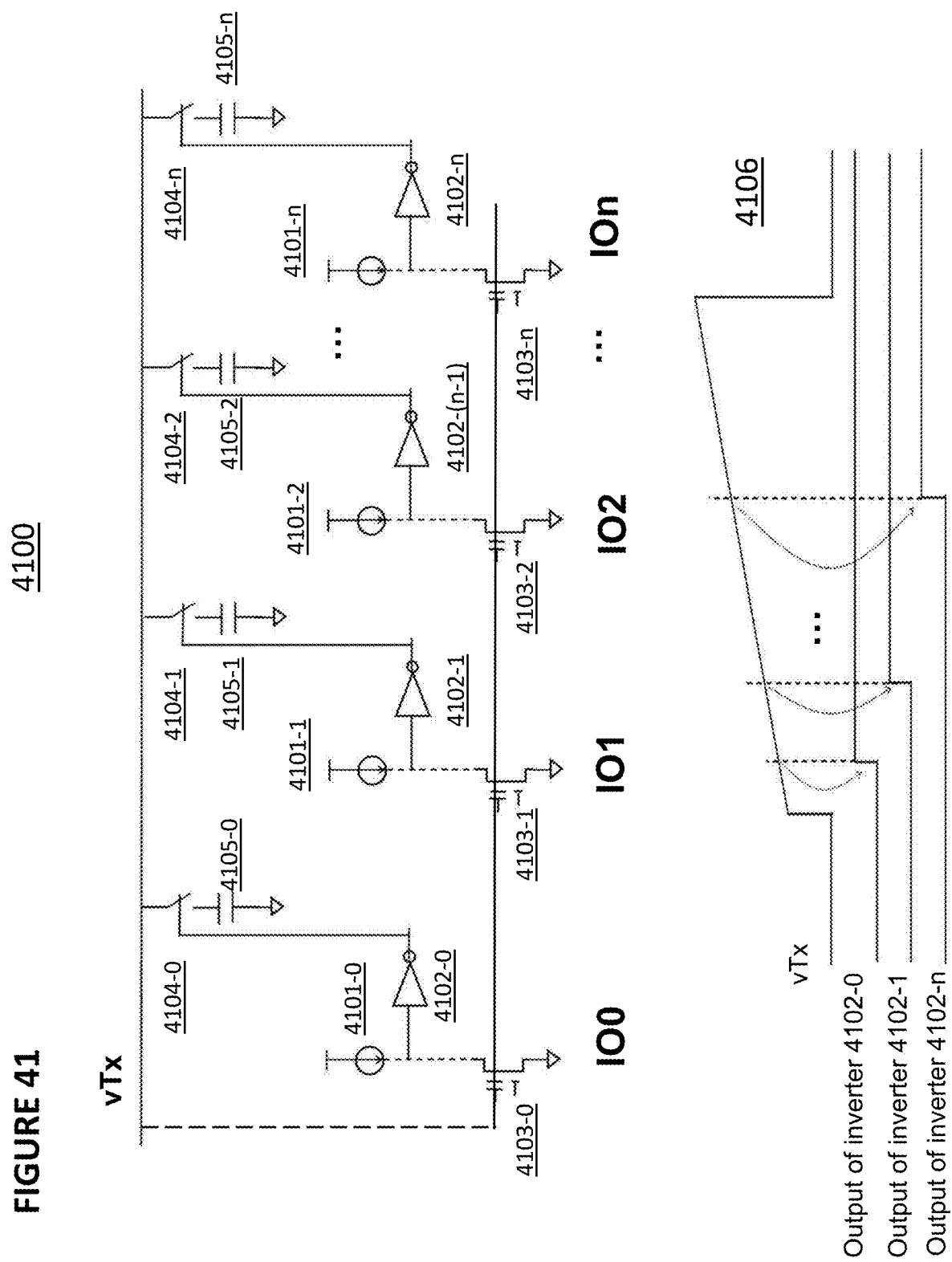
FIG. 41 depicts a circuit used in the calibration algorithm of FIG. 41.

FIG. 41 depicts circuit 4100 for measuring vTx in step 4003 of absolute calibration method 4000. vTx is measured on each memory cell 4103 (4103-0, 4103-1, 4103-2, . . . 4103-*n*). Here, n+1 different current sources 4101 (4101-0, 4101-1, 4101-2, . . . , 4101-*n*) generate different currents IO0, IO1, IO2, . . . IOn of increasing magnitude. Each current source 4101 is connected to a respective inverter 4102 (4102-0, 4102-1, 4102-2, . . . , 4102-*n*) and memory cell 4103 (4103-0, 4103-1, 4103-2, . . . 4103-*n*). The input to each inverter 4102 (4102-0, 4102-1, 4102-2, . . . , 4102-*n*) initially is high, and the output of each inverter initially is low. Because IO0<IO1<IO2< . . . <IOn, the output of inverter 4102-0 will switch from low to high first because memory cell 4103-0 will draw current from current source 4101-0 and also from the input node of inverter 4102-0, causing the input voltage to inverter 4102-0 to drop to low before the input voltages to the other inverters 4102. The output of inverter 4102-1 will switch from low to high next, then the output of inverter 4102-2, and so on, until the output of inverter 4102-$n$ switches from low to high. Each inverter 4102 controls a respective switch 4104 (4104-0, 4104-1, 4104-2, . . . , 4104-$n$), such that when the output of inverter 4102 is high, switch 4104 is closed, which will cause vTx to be sampled by capacitor 4105 (4105-0, 4105-1, 4105-2, . . . , 4105-$n$). Thus, switch 4104 and capacitor 4105 form a sample-and-hold circuit. In this manner, vTx is measured using the sample-and-hold circuit.

Figure 42:
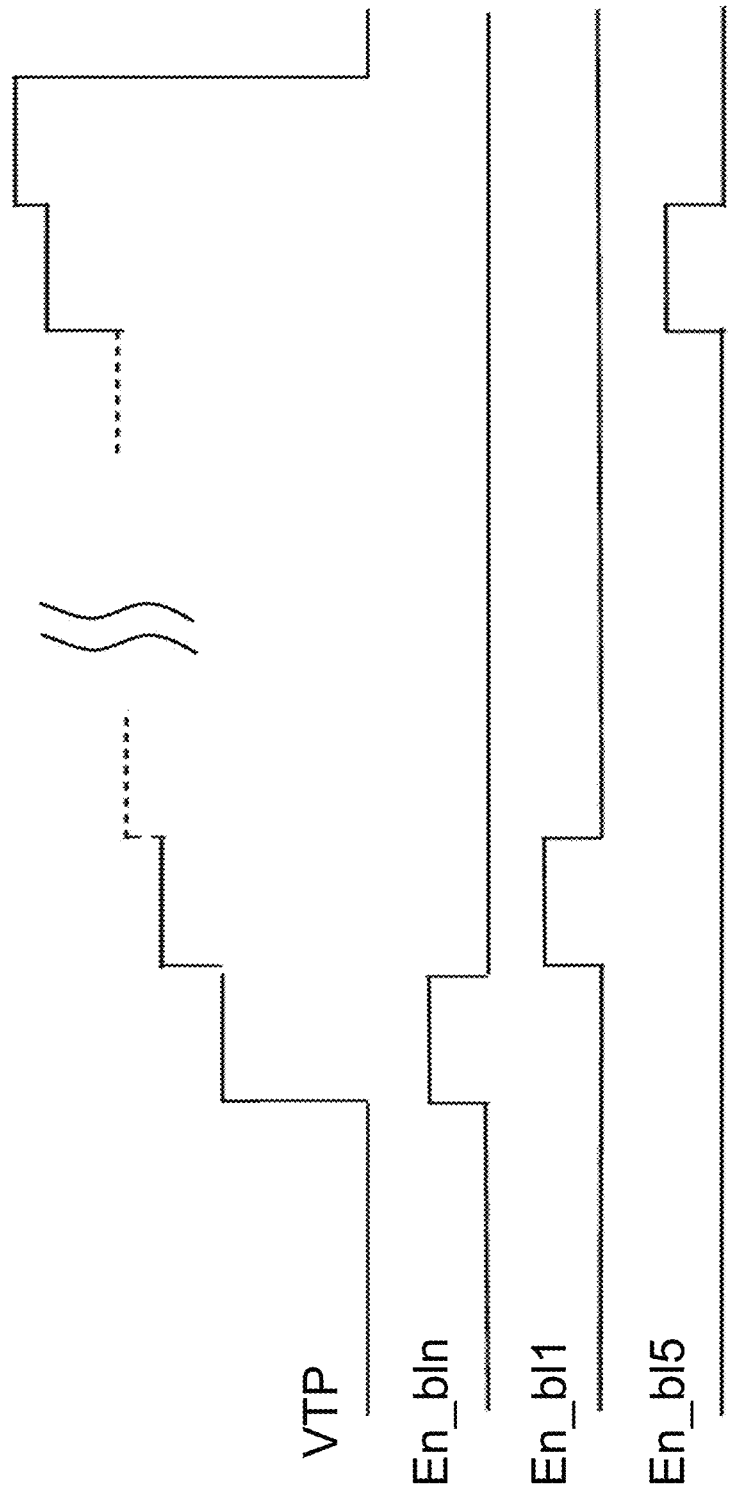
FIG. 42 depicts an exemplary progression of voltages applied to the control gate of a non-volatile memory cell during a programming operation.

FIG. 42 depicts an exemplary progression 4200 for programming a selected cell during adaptive calibration method 3700 or absolute calibration method 4000. The voltage VTP (which is a programming voltage applied to CG or EG terminal, and which corresponds to vi in step 3704 of FIG. 37 and vi in step 4005 of FIG. 40) is applied to the terminal of a selected memory cell using a bitline enable signal En_blx (where x varies between 1 and n, where n is the number of bit lines).

Figure 43:
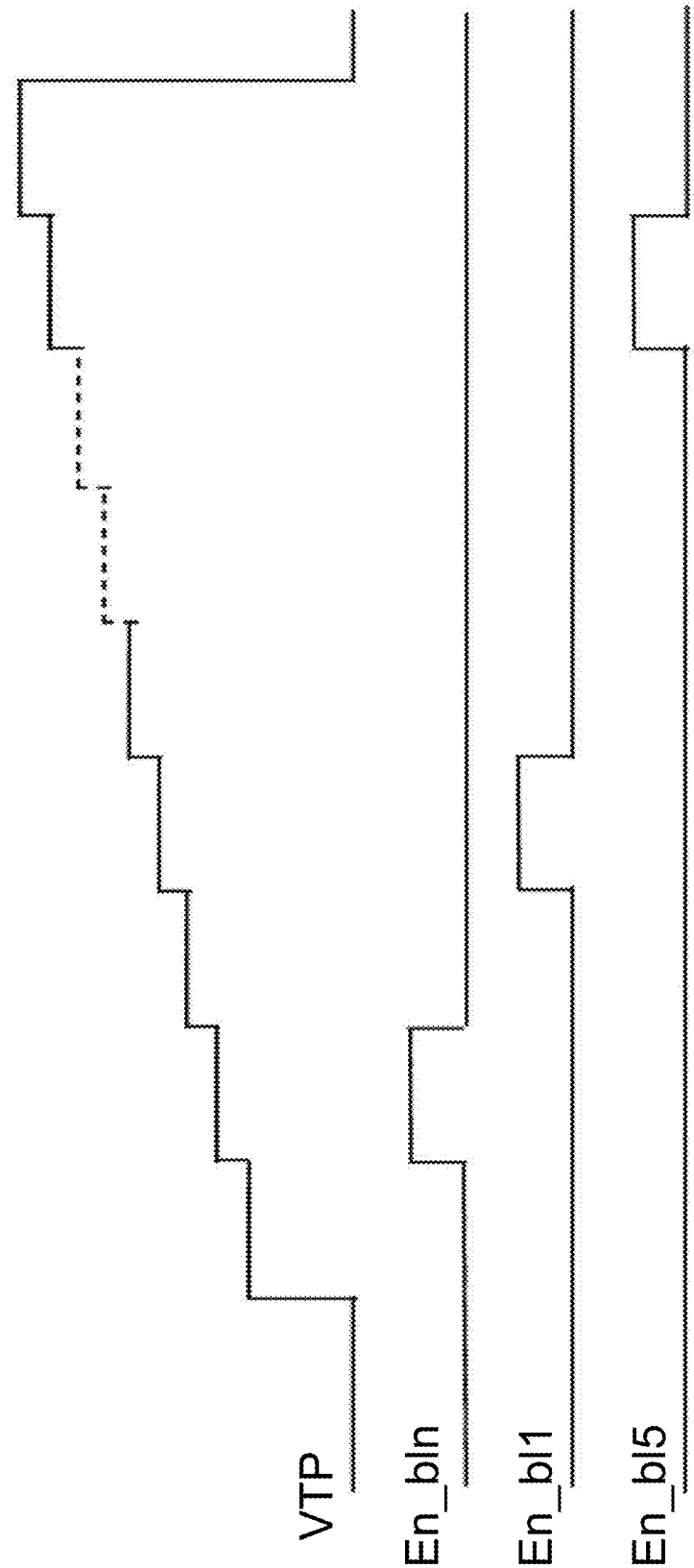
FIG. 43 depicts an exemplary progression of voltages applied to the control gate of a non-volatile memory cell during a programming operation.

FIG. 43 depicts another exemplary progression 4300 for programming a selected cell during adaptive calibration method 3700 or absolute calibration method 4000. The voltage VTP (which is a programming voltage applied to CG or EG terminal, and which corresponds to vi in step 3704 of FIG. 37 and vi in step 4005 of FIG. 40) is applied to the terminal of a selected memory cell using a bitline enable signal En_blx (where x varies between 1 and n, where n is the number of bit lines).

In another embodiment, the voltage applied to the control gate terminal is incremented and the voltage applied to the erase gate terminal is also incremented.

In another embodiment, the voltage applied to the control gate terminal is incremented and the voltage applied to the erase gate terminal is decremented. This is illustrated in Table 15:

TABLE 15

Control Gate Terminal Increment and Erase Gate Terminal Decrement

| VCG increment mV | VEG decrement mV | CG-FG coupling ratio | delta VFG mV due to VCG increment | EG-FG coupling ratio | delta VFG mV due to VEG decrement | total delta VFG mV |
| --- | --- | --- | --- | --- | --- | --- |
| 10 | −10 | 40% | 4 | 15% | −1.5 | 2.5 |
| 10 | −20 | 40% | 4 | 15% | −3 | 1 |
| 20 | −50 | 40% | 8 | 15% | −7.5 | 0.5 |

For comparison's sake, an example of incrementing only the control gate terminal or incrementing only the erase gate terminal are contained in Table 16:

TABLE 16

Control Gate Terminal Increment; Erase Gate Terminal Increment

| veg increment mV | CG-FG coupling ratio | delta VFG mV |
| --- | --- | --- |
| Case 1: VCG increment | | |
| 10 | 40% | 4 |
| Case 2: VEG increment | | |
| 10 | 15% | 1.5 |

Figure 44:
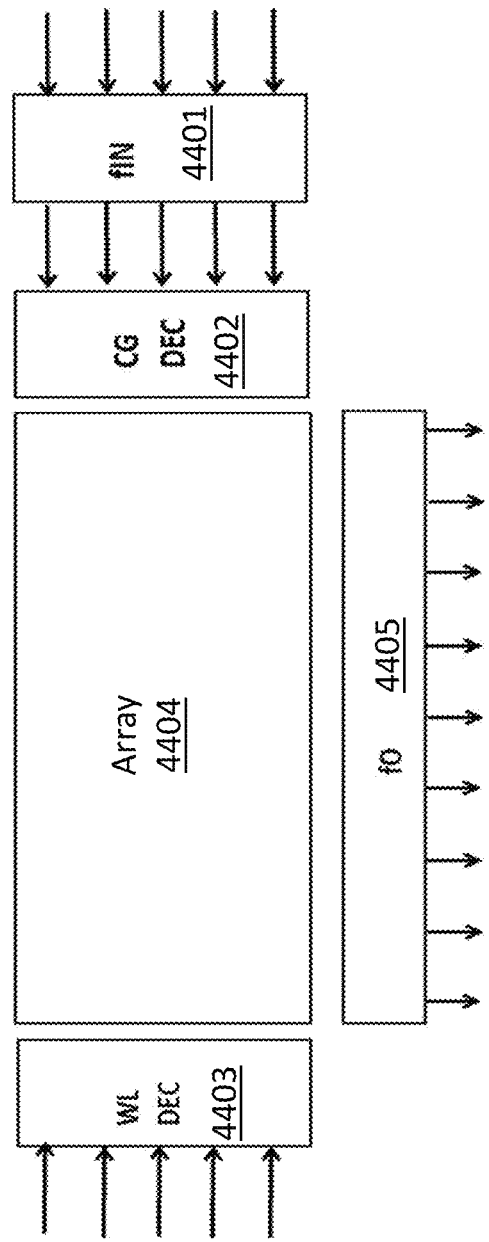
FIG. 44 depicts a system for applying programming voltages during the programming of a non-volatile memory cell within a vector-by-multiplication matrix system.

FIG. 44 depicts a system for implementing an input and output method for reading or verifying within a VMM array, after precision programming. The input function circuit 4401 receives digital bit values and converts those digital values into an analog signal that is then used to apply a voltage to the control gate of selected cells in array 4404, where the selected cells are determined through control gate decoder 4402. Meanwhile, word line decoder 4403 also is used to select the row in which the selected cell is located. Output neuron circuit block 4405 receives the output current from each column of cells in array 4404. The output circuit block 4405 can comprise an integrating analog-to-digital converter (ADC), a successive approximation (SAR) ADC, a Sigma-Delta ADC, or any other ADC schemes to provide a digital output.

In one embodiment, the digital values provided to input function circuit 4401 comprise four bits (DIN3, DIN2, DIN1, and DIN0), or any number of bits, and the digital value represented by those bits corresponds to the number of input pulses to be applied to the control gate during a programming operation. A greater number of pulses will cause a greater value to be stored in the cell, which will cause a larger output current when the cell is read. An example of input bit values and pulse values is shown in Table No. 17:

TABLE NO. 17

Digital Bit Inputs v. Pulses Generated

| DIN3 | DIN2 | DIN1 | DIN0 | Input Pulses Generated |
| --- | --- | --- | --- | --- |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |

TABLE NO. 17-continued

Digital Bit Inputs v. Pulses Generated

| DIN3 | DIN2 | DIN1 | DIN0 | Input Pulses Generated |
| --- | --- | --- | --- | --- |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |

In the above example, there are a maximum of 15 pulses for 4 bit input digital. Each pulse is equal to one unit cell value (current), i.e. the precision programmed current. For example, if Icell unit=1 nA, then for DIN[3-0]=0001, Icell=1*1 nA=1 nA; and for DIN[3-0]=1111, Icell=15*1 nA=15 nA.

In another embodiment, the digital bit input uses digital bit position summation to read out the cell or neuron (e.g., precisely programmed value on bitline output) value as shown in Table 18. Here, only 4 pulses or 4 fixed same bias inputs (for example input on wordline or control gate) are needed to evaluate the 4 bit digital value. For example, a first pulse or a first fixed bias is used to evaluate DIN0, a second pulse or a second fixed bias with same value as the first one is used to evaluate DIN1, a third pulse or a third fixed bias with same value as the first one is used to evaluate DIN2, and a fourth pulse or a fourth fixed bias with same value as the first one is used to evaluate DIN3. Then, the results from the four pulses are summed according to bit position with each output result multiplied (scaled) by a multiplier factor that is $2^n$, n is the digital bit position as shown in Table 19. The digital bit summation equation realized is the following:
Output=$2^0$*DIN0+$2^1$*DIN1+$2^2$*DIN2+$2^3$*DIN3)
*Icell unit, where Icell unit represent the precision programmed current.

For example, if Icell unit=1 nA, then for DIN[3-0]=0001, Icell total=0+0+0+1*1 nA=1 nA; and for DIN[3-0]=1111, Icell total=8*1 nA+4*1 nA+2*1 nA+1*1 nA=15 nA.

TABLE NO. 18

Digital Bit Input Summation

| $2^3$ * DIN3 | $2^2$ * DIN2 | $2^1$ * DIN1 | $2^0$ * DIN0 | Total values |
|---|---|---|---|---|
| 0 | 0 | 0 | 0 | 0 |
| 0 | 0 | 0 | 1 | 1 |
| 0 | 0 | 2 | 0 | 2 |
| 0 | 0 | 2 | 1 | 3 |
| 0 | 4 | 0 | 0 | 4 |
| 0 | 4 | 0 | 1 | 5 |
| 0 | 4 | 2 | 0 | 6 |
| 0 | 4 | 2 | 1 | 7 |
| 8 | 0 | 0 | 0 | 8 |
| 8 | 0 | 0 | 1 | 9 |
| 8 | 0 | 2 | 0 | 10 |
| 8 | 0 | 2 | 1 | 11 |
| 8 | 4 | 0 | 0 | 12 |
| 8 | 4 | 0 | 1 | 13 |
| 8 | 4 | 2 | 0 | 14 |
| 8 | 4 | 2 | 1 | 15 |

TABLE 19

Digital input bit Dn summation with $2^n$ output multiplication factor

| DIN3 | DIN2 | DIN1 | DIN0 | Output X factor |
|---|---|---|---|---|
|  |  |  | Y | X1 |
|  |  | Y |  | X2 |
|  | Y |  |  | X4 |
| Y |  |  |  | X8 |

Another embodiment with a hybrid input with multiple digital input pulse ranges and input digital range summations is shown in Table 20 for an exemplary 4-bit digital input. In this embodiment, DINn-0 can be divided into m different groups, where each group is evaluated and the output is scaled by a multiplication factor by the group binary position. As example, for 4-bit DIN3-0, the groups can be DIN3-2 and DIN1-0, where the output for DIN1-0 is scaled by one (×1) and the output for DIN3-2 is scaled by 4 (×4).

TABLE 20

Hybrid input-output summation with multiple input ranges

| DIN3 | DIN2 | DIN1 | DIN0 | input pulses (or equivalent pulsewidth) | Output X factor |
|---|---|---|---|---|---|
|  |  | 0 | 0 | 0 | X1 |
|  |  | 0 | 1 | 1 | X1 |
|  |  | 1 | 0 | 2 | X1 |
|  |  | 1 | 1 | 3 | X2 |
| 0 | 0 |  |  | 0 | X4 |
| 0 | 1 |  |  | 1 | X4 |
| 1 | 0 |  |  | 2 | X4 |
| 1 | 1 |  |  | 3 | X4 |

Another embodiment combines a hybrid input range with a hybrid supercell. A hybrid super cells includes multiple physical x-bit cells to implement a logical n-bit cell with the x-cell output scaled by the $2^n$ binary position. For example, to implement an 8-bit logical cell, two 4-bit cells (cell1, cell0) are used. The output for cell0 is scaled by one (×1) and the output for cell1 is scaled by four (X, $2^2$). Other combinations of physical x-cells to implement n-bit logical cell are possible such as two 2-bit physical cell and one 4-bit physical cell to implement an 8-bit logical cell.

Figure 45:
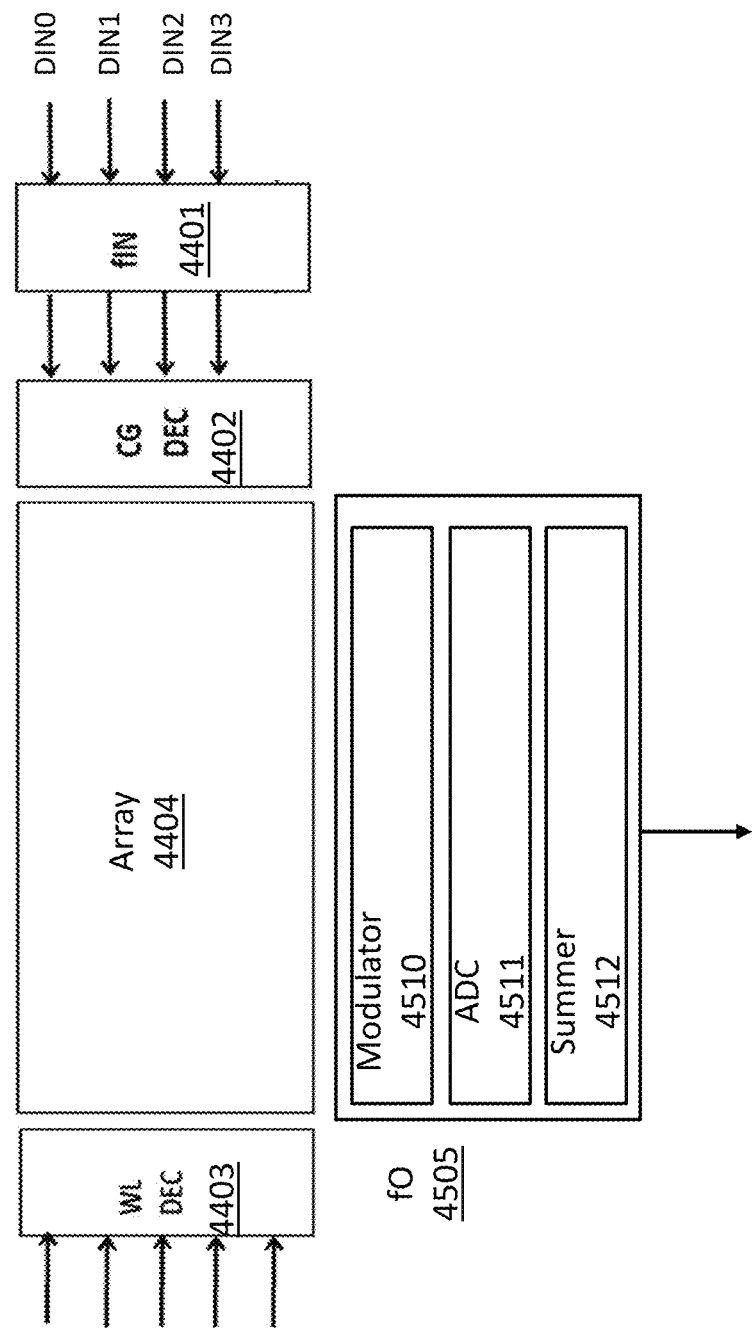
FIG. 45 depicts a vector-by-multiplication matrix system with an output block comprising a modulator, analog-to-digital converter, and a summer.

FIG. 45 depicts another embodiment, similar to the system of FIG. 44, except that the digital bit input uses digital bit position summation to read out the cell or neuron (e.g., value on bitline output) current modulated by modulator 4510 with the output pulsewidth that is designed according to the digital input bit position (e.g. to convert current into output voltage V=Current*Pulsewidth/Capacitance). For example, a first bias (applied on the input wordline or control gate) is used to evaluate DIN0, the current (cell or neuron) output is modulated by modulator 4510 by a unit pulsewidth that is proportional to the DIN0 bit position, which is one (×1) unit, a second input bias is used to evaluate DIN1, the current output is modulated by modulator 4510 by a pulsewidth that is proportional to the DIN1 bit position, which is two (×2) units, a third input bias is used to evaluate DIN2, the current output is modulated by modulator 4510 by a pulsewidth that is proportional to the DIN2 bit position, which is four (×4) units, a fourth input bias is used to evaluate DIN3, the current output is modulated by modulator 4510 by a pulsewidth that is proportional to the DIN3 bit position, which is eight (×8) units. Each output is then converted into digital bits by ADC (Analog-to-Digital converter) 4511 for each digital input bits DIN0-DIN3. The total output is then output by summer 4512 as the summation of the four digital outputs generated from DIN0-3 inputs.

FIG. 46 depicts an example of charge summer 4600 that can be used to sum the output of a VMM, Icell, during a verify operation or during output neuron analog to digital conversion to obtain a single analog value that represents the output of the VMM, and that can optionally be then converted into digital bit values. Charge summer 4600 can be used, for example, as summer 4512. Charge summer 4600 comprises current source 4601 (which here represents the current Icell output by the VMM) and a sample-and-hold circuit comprising switches 4602 and sample-and-hold (S/H) capacitors 4603. The example shown utilizes a 4-bit digital value for the output, although other numbers of bits can be used instead. There are 4 S/H circuits to hold the value generated from 4 evaluation pulses, where the values are summed up at the end of the process. S/H capacitors 4603 are selected with ratios that are associated with the 2^n*DINn bit position for that S/H capacitor. For example, switch 4602 for C_DIN3 is closed when Icell>8×Current Threshold, switch 4602 for C_DIN2 is closed when Icell>4× Current Threshold, switch 4602 for C_DIN1 is closed when Icell>2×Current Threshold, and switch 4602 for C_DIN0 is closed when Icell>Current Threshold. Thus, the digital values stored by sample-and-hold capacitors 4603 will reflect the value of Icell 4601.

FIG. 47 depicts current summer 4700 that can be used to sum the output of a VMM, Icell, during a verify operation or during output neuron analog to digital conversion. Charge summer 4700 can be used, for example, as summer 4512. Current summer 4700 comprises current source 4701 (which here represents Icell output from the VMM), switch 4702, switches 4703 and 4704, and transistors 4705. The example shown utilizes a 4-bit digital value for the output, where the bit values are represented by the currents I_DIN0, I_DIN1, I_DIN2, and I_DIN3. The bit position of each transistor 4705 affects the value represented by that bit. Switch 4703 for I_DIN3 is closed when Icell>8×Current Threshold, switch 4703 for I_DIN2 is closed when Icell>4×Current Threshold, switch 4704 for I_DIN1 is closed when Icell>2× Current Threshold, and switch 4703 for I_DIN0 is closed when Icell>Current Threshold. Thus, the digital values output by transistors 4705 (where a "1" is represented by a positive current and a "0" is represented by no current, or vice-versa) will reflect the value of Icell 4601.

Figure 48:
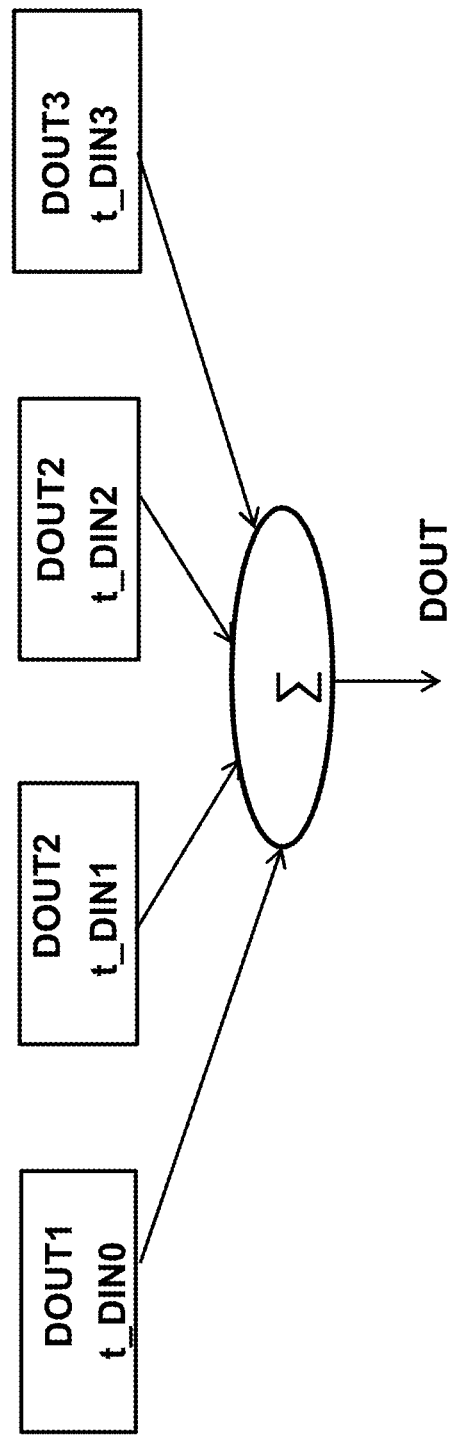
FIG. 48 depicts a digital summer circuit.

FIG. 48 depicts digital summer 4800, which receives a plurality of digital values, sums them together and generates an output DOUT representing the sum of the inputs. Digital summer 4600 can be used, for example, as summer 4512. Digital summer 4800 can be used during a verify operation or during output neuron analog to digital conversion. As shown for an example of a 4-bit digital value, there are digital output bits to hold the value from 4 evaluation pulses, where the values are summed up at the end of the process. The digital outputs are digitally scaled based on the 2^n*DINn bit position; for example, DOUT3=×8 DOUT0, DOUT2=×4 DOUT1, I_DOUT1=×2 DOUT0, I_DOUT0=DOUT0.

Figure 49A:
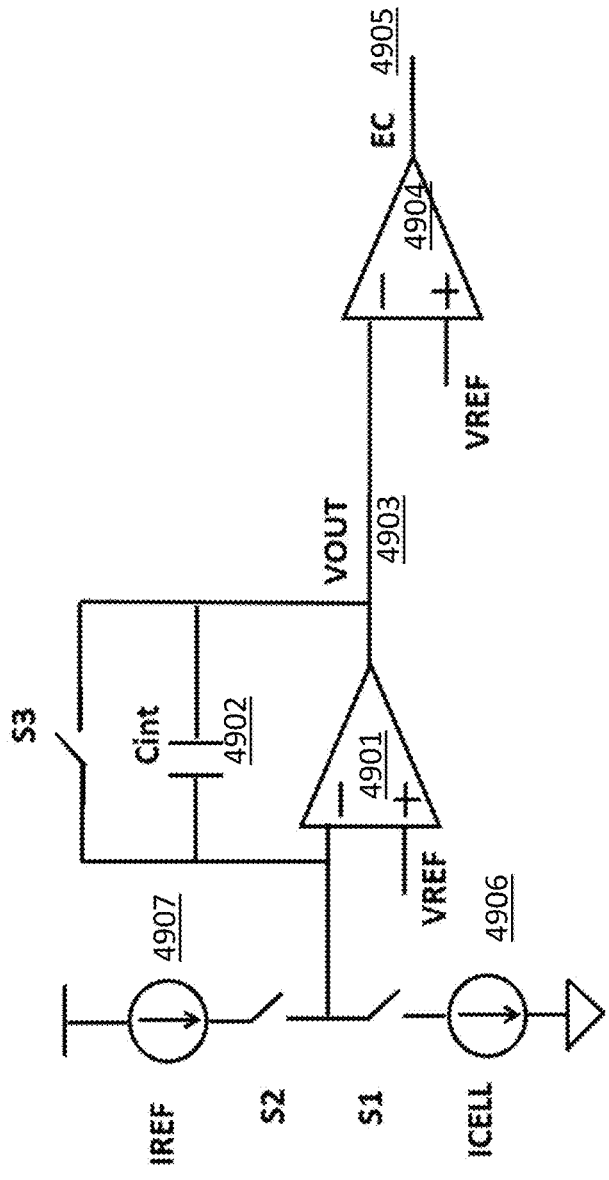
FIG. 49A depicts an embodiment of an integrating analog-to-digital converter for a neuron output.
Figure 49B:
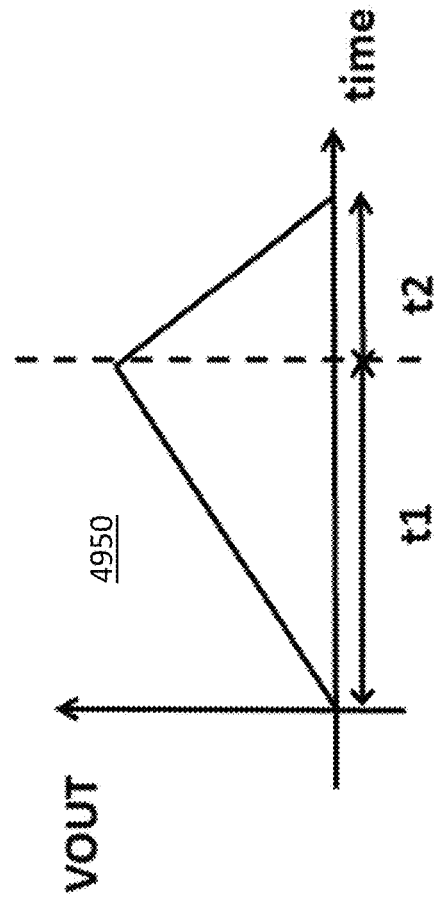
FIG. 49B depicts a graph showing the voltage output over time of the integrating analog-to-digital converter of FIG. 49A.

FIG. 49A shows an integrating dual-slope ADC 4900 applied to an output neuron to convert the cell current into digital output bits. An integrator consisting of integrating op-amp 4901 and integrating capacitor 4902 integrates a cell current ICELL versus a reference current IREF. As shown in FIG. 49B, during a fixed time t1, switch S1 is closed and switch S2 is open, and the cell current is up integrated (Vout rises in waveform 4950), and then switch S1 is opened and switch S2 is closed so that reference current IREF is applied to down integrate for a time t2 (Vout falls in waveform 4950). The value of current Icell is determined=t2/t1*IREF. For example, for t1, for 10 bit digital bits resolution, 1024 cycles are used, and the cycle number for t2 varies from 0 to 1024 cycles depending on the Icell value. With a target value applied as VREF to comparator 4904, the output EC 4905 of comparator 4904 may be used as a trigger to determine the number of cycles that IREF was applied until VOUT falls to below VREF.

Figure 49C:
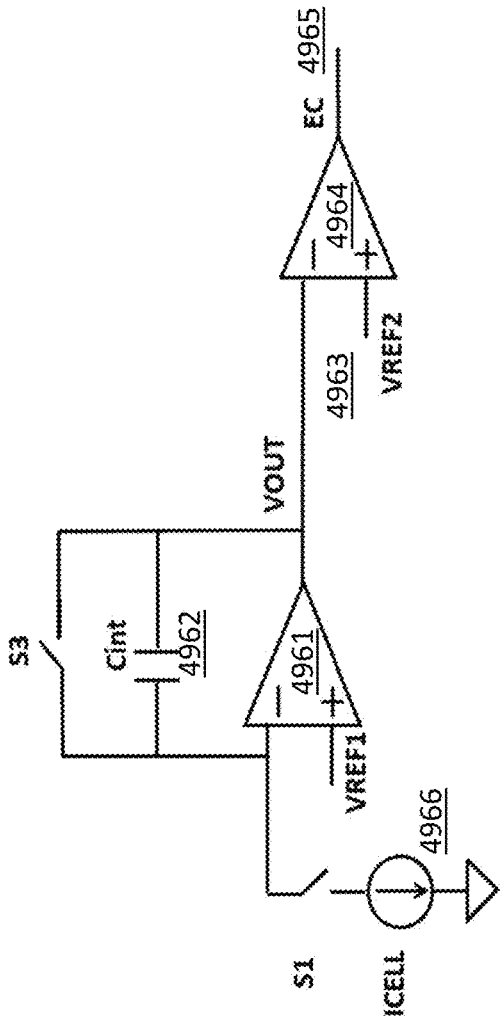
FIG. 49C depicts another embodiment of an integrating analog-to-digital converter for a neuron output.
Figure 49D:
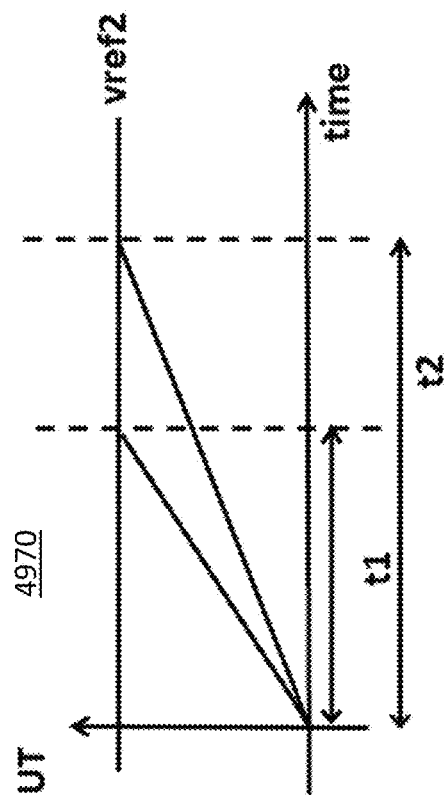
FIG. 49D depicts a graph showing the voltage output over time of the integrating analog-to-digital converter of FIG. 49C.

FIG. 49C shows integrating single slope ADC 4960 applied to an output neuron 4966, ICELL, to convert the cell current into digital output bits. ADC 4960 integrating op-amp 4961, integrating capacitor 4962, op-amp 4964, and switches S1 and S3. Integrating op-amp 4961 and integrating capacitor 4962 integrate the output neuron current, ICELL. As shown in FIG. 49D, during a time t1, a cell current is up-integrated (Vout rises until it reaches Vref2), and during time t2, which begins at the same time as time t1, but is greater than time t1, a cell current of a reference cell is up-integrated. The cell current ICELL is determined as =Cint*Vref2/t. A pulse counter coupled to the output of comparator 4965 is used to count the number of pulses (digital output bits) during the respective integration times t1, t2. For example as shown digital output bits for t1 is less than that of t2, meaning the cell current during t1 is larger the cell current during t2. An initial calibration is done to calibrate the integrating capacitor value with a reference current and a fixed time, Cint=Tref*Iref/Vref2.

FIG. 49E shows integrating dual slope ADC 4980 applied to an output neuron 4984, ICELL, to convert the cell current into digital output bits. Integrating dual-slope ADC 4980 comprises switches S1, S2, and S3, op-amp 4981, capacitor 4982, and reference current source 4983. The integrating dual slope ADC 4980 does not utilize an integrating op-amp. The cell current or the reference current is integrated directly on the capacitor 4982. A pulse counter is used to count pulses (digital output bits) during integration time. The current Icell is =t2/t1*IREF.

FIG. 49F shows integrating single slope ADC 4990 applied to an output neuron 4994, ICELL, to convert the cell current into digital output bits. Integrating single slope ADC 4990 comprises switches S2 and S3, op-amp 4991, and capacitor 4992. The integrating single slope ADC 4980 does not utilize an integrating op-amp. The cell current is integrated directly on the capacitor 4992. A pulse counter is used to count pulses (digital output bits) during integration time. The cell current I cell=Cint*Vref2/t.

Figure 50A:
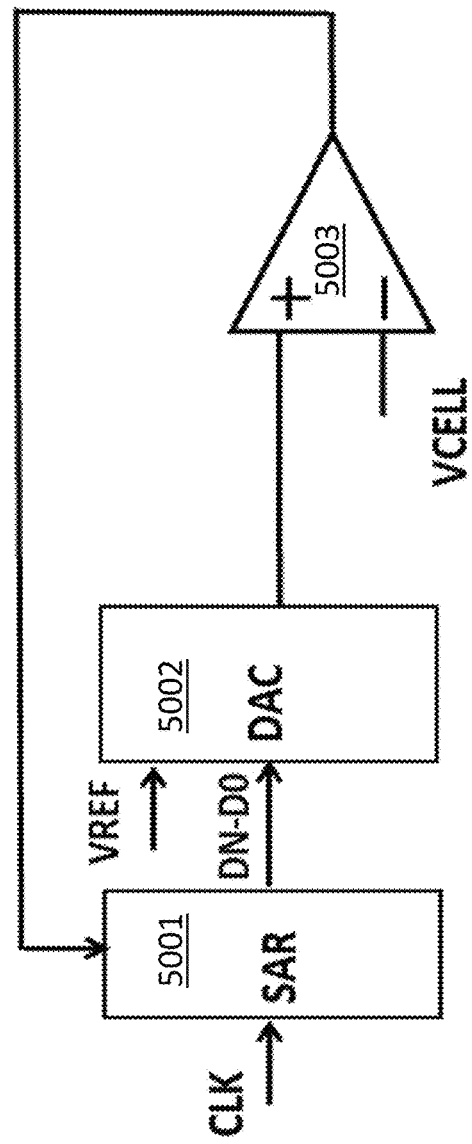
FIGS. 50A and 50B depict a successive approximation analog-to-digital converter for a neuron output.
Figure 50B:
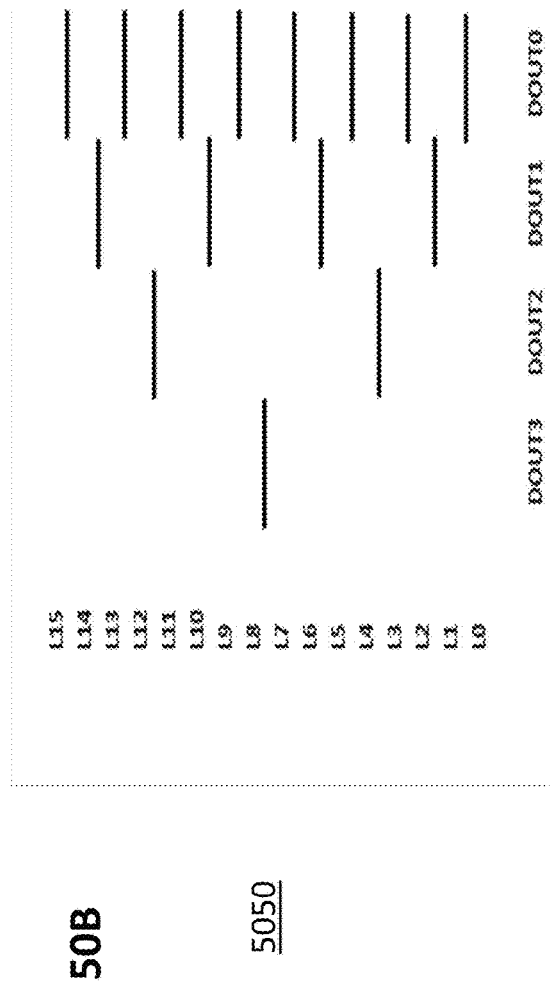

FIG. 50A shows a SAR (Successive Approximation Register) ADC applied to an output neuron to convert a cell current into digital output bits. Cell current can be dropped across a resistor to convert into a voltage VCELL. Alternatively, the cell current can charge up a S/H capacitor to convert the cell current into a voltage VCELL. VCELL is provided to the inverting input of comparator 5003, whose output is fed to a select input of an SAR 5001. A clock input CLK is further provided to SAR 5001. A binary search is used to compute the bit starting from MSB bit (most significant bit). Basing on the digital bits DN-D0 output from SAR 5001 and received as an input to a DAC 5002, the output of DAC 5002 is used to set the non-inverting input of comparator 5003, i.e. an appropriate analog reference voltage to comparator 5003. The output of the comparator 5003 in turns feedback to SAR 5001 to choose the next analog level. As shown in FIG. 50B, for the example of 4-bit digital output bits, there are 4 evaluation periods: a first pulse to evaluate DOUT3 by setting an analog level half-way, then a second pulse to evaluate DOUT2 by setting an analog level half way of the top-half or half way of the bottom-half, without limitation.

A Modified Binary Search such as a cyclic (algorithmic) ADC can be used for the cell tuning (e.g., programming) verification or the output neuron conversion. A Modified Binary Search such as a switched cap (SC) charge re-distribution ADC can be used for the cell tuning (e.g., programming) verification or the output neuron conversion.

Figure 51:
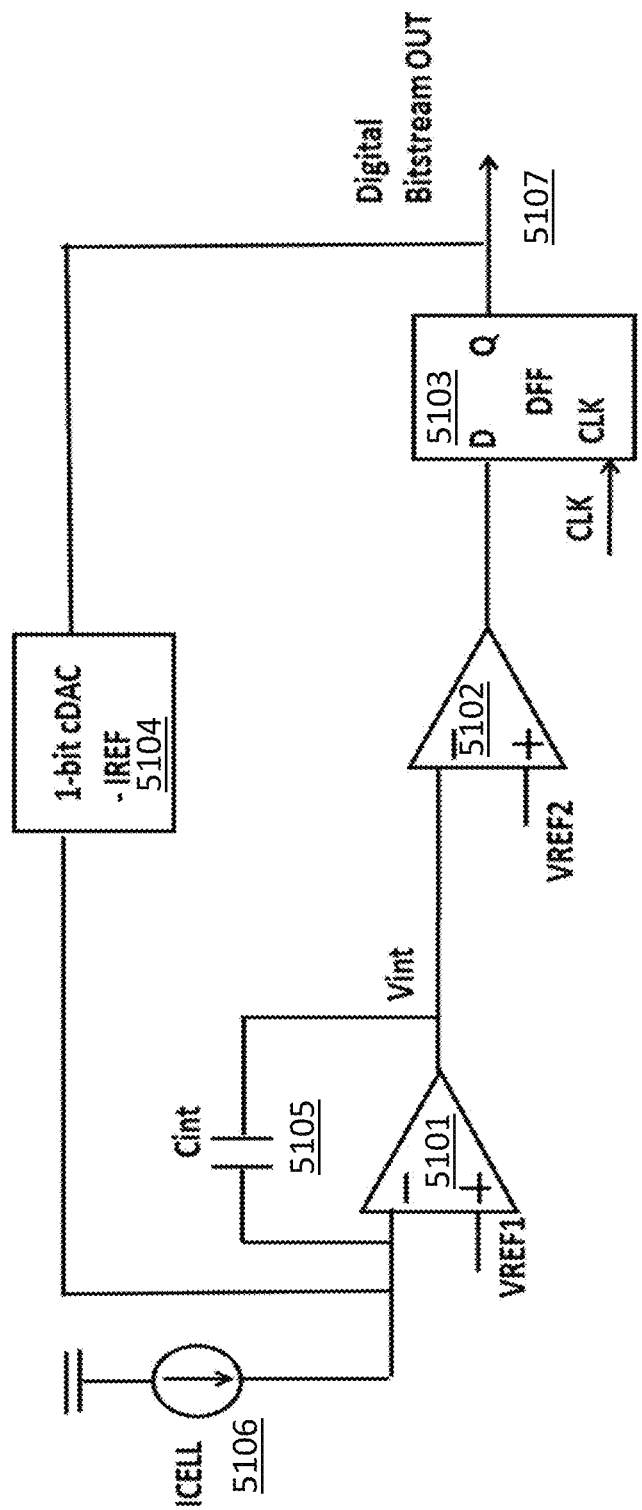
FIG. 51 depicts an embodiment of a sigma delta analog-to-digital converter.

FIG. 51 shows sigma delta ADC 5100 applied to an output neuron to convert a cell current into digital output bits. An integrator consisting of op-amp 5101 and capacitor 5105 integrates the summation of current ICELL from a selected cell current 5106 and a reference current IREF resulting from 1-bit current cDAC 5104. A comparator 5102 compares the integrated output voltage of op-amp 5101 versus a reference voltage, VREF 2. The clocked DFF 5103 provides digital output streams depending on the output of the comparator 5102, which is received at the D input of DFF 5103. The digital output stream typically goes to a digital filter before being outputting as digital output bits.

FIG. 52A depicts ramp analog-to-digital converter 5200, which comprises current source 5201 (which represents a received neuron current, ICELL), switch 5202, variable configurable capacitor 5203, and comparator 5204, which receives the voltage developed across variable configurable capacitor 5203, denoted Vneu, as the non-inverting input and configurable reference voltage Vreframp as the inverting input and generates output Cout. Vreframp is ramped up in discrete levels with each comparison clock cycle. Comparator 5204 compares Vneu against Vreframp, and as a result output Cout will be "1" when Vneu>Vreframp and will be "0" otherwise. Thus, output Cout will be a pulse, whose width varies in response to Ineu. A larger Ineu will cause Cout to be "1" for a longer period of time, resulting in a wider pulse for output Cout. A digital counter 5220 converts each pulse of pulses 522 of output Cout into count value 5221, which are digital output bits, as shown in FIG. 52B for two different ICELL currents, denoted OT1A and OT2A, respectively.

Alternatively, ramp voltage Vreframp is a continuous ramp voltage 5255 as shown in graph 5250 of FIG. 52B.

Alternatively, a multi-ramp embodiment is shown in FIG. 52C for reducing the conversion time by utilizing a coarse-fine ramp conversion algorithm. First, coarse reference ramp reference voltage 5271 is ramped in a fast manner to figure out the sub range for each ICELL. Next, fine reference ramp reference voltages 5272, i.e. Vreframp1 and Vreframp2, are used respectively for each sub-range for converting ICELL currents within the respective sub-range. As shown there are two sub-ranges for fine reference ramp voltages. More than two coarse/fine steps or two sub-ranges are possible.

Figure 53:
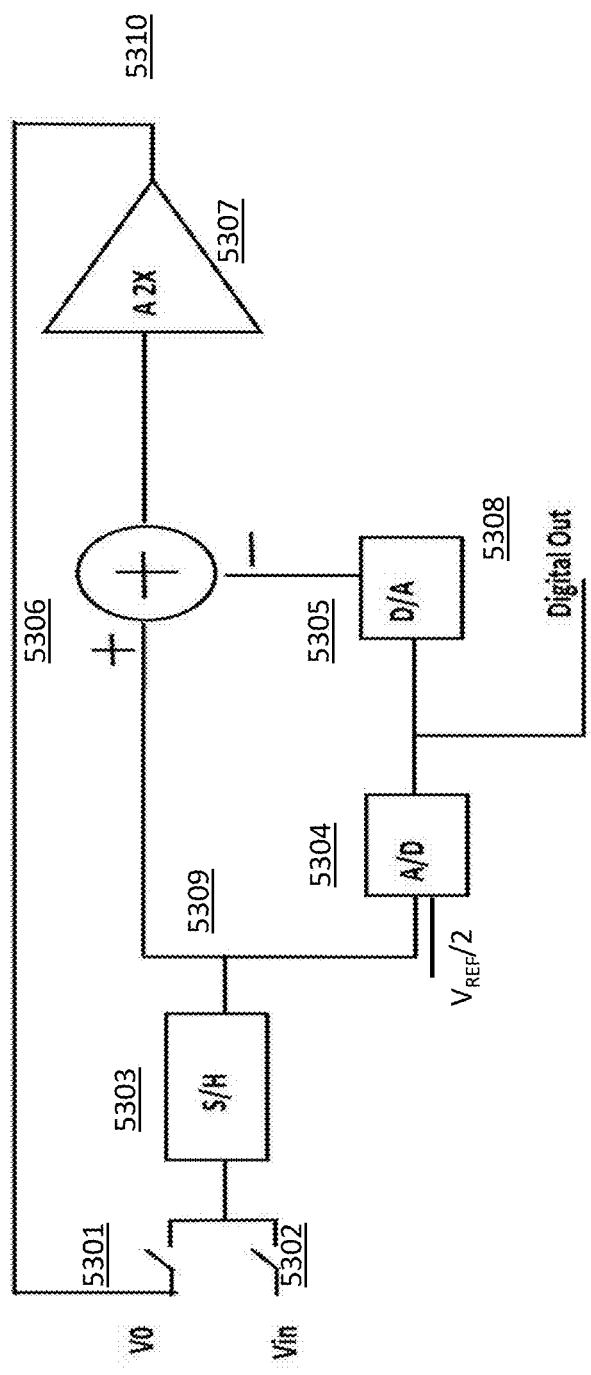
FIG. 53 depicts an embodiment of an algorithmic analog-to-digital converter.

FIG. 53 depicts an algorithmic analog-to-digital output converter 5300, which comprises switch 5301, switch 5302, sample-and-hold (S/H) circuit 5303, 1 bit analog-to-digital converter (ADC) 5304, 1 bit digital-to-analog converter (DAC) 5305, summer 5306, and gain of two residue operational amplifier (2× opamp) 5307. Algorithmic analog-to-digital output converter 5300 generates conversion digital output 5308 in response to analog input Vin and control signals applied to switches 5302 and 5302. An input received at analog input Vin (e.g. Vneu of FIG. 52) is sampled first by the S/H circuit 5303 responsive to the switch 5302, then conversion is performed in N clock cycles for N bits. For each conversion clock cycle, the 1-bit ADC 5304 compares the S/H voltage 5309 against a reference voltage VREF/2 and outputs a digital bit (e.g., a "0" if input <=VREF/2 and a "1" if input >VREF/2). This digital output bit, which is the Digital Output signal 5308, is in turn converted into an analog voltage by the 1-bit DAC 5305 (e.g. to either VREF/2 or 0V) and feed to the summer 5306 to be subtracted from the S/H voltage 5309. The 2× residue opamp 5307 then amplifies the summer difference voltage output into a conversion residue voltage 5310 which is fed to the S/H circuits 5303 through the switch 5301 for next clock cycle. Instead of this 1-bit (i.e., 2 levels) algorithmic ADC, a 1.5-bit (i.e., 3 levels) algorithmic ADC can be used to reduce the effect of offset such as from ADC 5304 and residue op-amp 5307. A 1.5-bit or 2-bit (i.e., 4 levels) DAC is preferred for use with the 1.5-bit algorithmic ADC.

In another embodiment, a hybrid ADC can be used. For example, for a 9-bit ADC, the first 4 bits can be generated by a SAR ADC and the remaining 5 bits can be generated using a slope ADC or a ramp ADC.

Programming and Verifying Multiple Physical Cells as a Single Logical Multi-Bit Cell The programming and verifying devices and methods described above can operate concurrently upon multiple physical cells as a logical multi-bit cell.

Figure 54:
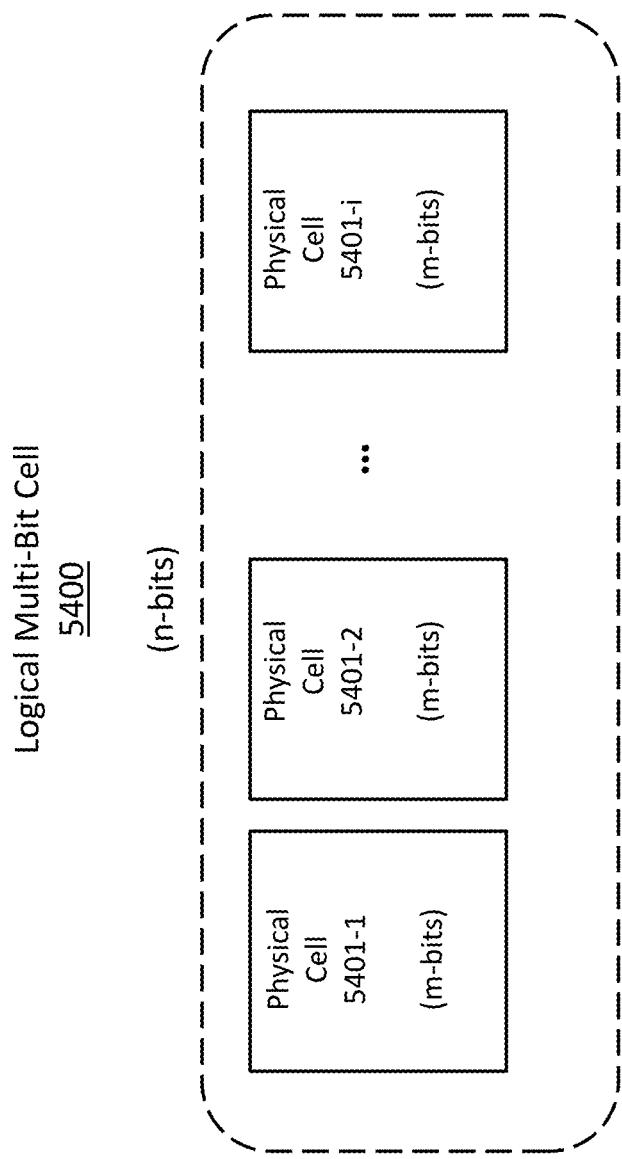
FIG. 54 depicts a logical multi-bit cell.

FIG. 54 depicts logical multi-bit cell 5400, which comprises i physical cells, labeled physical cells 5401-1, 5401-2, . . . , 5401-$i$. In one embodiment, physical cells 5401 have a uniform diffusion width (transistor width). In another embodiment, physical cells 5401 have a non-uniform diffusion width (different transistor widths, where a transistor with a larger width can store a larger number of levels and therefore can store a larger number of bits). In both embodiments, physical cells 5401 are programmed, verified, and read as a unit, specifically, as a single logical n-bit cell that can store a larger number of levels than each of the m-bit cells. For example, in if m=2, then each physical cell 5401 can hold one of four levels (L0, L1, L2, L3). Two such cells can be treated as a single logical cell with n=3, such that the single logical cell can hold one of eight levels (L0, L1, L2, L3, L4, L5, L6, L7). As another example, if m=3, then each physical cell 5401 can hold one of 8 levels (L0, . . . , L7). Four such cells can be treated as a single logical cell with n=5, such that the single logical cell can hold one of 32 levels (L0, . . . , L31).

FIG. 55 depicts a method 5500 of programming logical multi-bit cell 5400. First, j of the i physical cells 5401-1, . . . , 5401-$i$ (where j<=i) are programmed and verified using any of the coarse programming methods 3305 until a coarse current target for the j physical cells is achieved (step 5501). Next, k of the j physical cells (where k<=j) are programmed and verified using any of the precision programming methods 3306 until a precision current target for the k physical cells is achieved (step 5502).

Method 5500 can be performed on more than one subset of the i physical cells 5401-1, . . . 5401-$i$ to achieve the desired overall level for logical multi-bit cell 5400.

For example, if i=4, then there will be four cells, 5401-1, 5401-2, 5401-3, and 5401-4. If one assumes that each cell can hold one of 8 different levels, then logical multi-bit cell 5400 can hold one of 32 different levels. If the desired programming value is L27, then that level (which corresponds to a desired read current) can be achieved in any number of different ways.

For example, method 5500 can be performed on cells 5401-1, 5401-2, and 5401-3 until those cells collectively hold L23 (the 24th level), and then method 5500 can be performed on cell 5401-4 to program that cell to its fourth level so that the logical multibit cell 5400 achieves L27 (the 28th level).

As another example, method 5500 can be performed on cells 5401-1, 5401-2, 5401-3, and 5401-4 until those cells collectively hold L25 (the 26th level), and then method 5500 can be performed only on cell 5401-4 until it stores a value that causes the entirety of logical multi-bit cell 5400 to achieve L27 (the 28th level).

Other approaches are possible, and method 5500 can be performed on different subsets of the i physical cells until the desired level is achieved.

In another embodiment, in the situation where the i physical cells have a non-uniform diffusion width, a coarse programming step 3305 can be performed on the j1 physical cells with the wider transistor width until the j1 physical cells collectively achieve a coarse current target, and then a precision programming step 3306 can be performed on the j2 physical cells with the smallest transistor width until the j1+j2 physical cells collectively achieve a precision current target.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
   performing a first programming process comprising multiple program-verify cycles, wherein a programming voltage of increasing magnitude is applied to a terminal of a selected non-volatile memory cell in program-verify cycles after the first program-verify cycle, wherein each program-verify cycle comprises:
   applying a first voltage to one of an erase gate terminal and a control gate terminal of the selected non-volatile memory cell;
   measuring a first current that results through the selected non-volatile memory cell;
   applying a second voltage to the one of the erase gate terminal and the control gate terminal of the selected non-volatile memory cell;
   measuring a second current that results through the selected non-volatile memory cell;
   determining a slope value based on the first voltage, the second voltage, the first current, and the second current; and
   determining a next programming voltage of the programming voltages of increasing magnitude for the next program-verify cycle based on the determined slope value.

2. The method of claim 1, further comprising:
   programming the selected non-volatile memory cell using the next programming voltage.

3. The method of claim 2, further comprising:
   repeating the steps of determining a next programming voltage and programming the non-volatile memory cell using the next programming voltage until a current through the selected non-volatile memory cell during a read or verify operation is less than or equal to a first threshold current value.

4. A method comprising:
   performing a first programming process comprising multiple program-verify cycles, wherein a programming voltage of increasing magnitude is applied to a terminal of a selected non-volatile memory cell in each program-verify cycle after the first program-verify cycle, wherein the step of performing a first programming process further comprises: when a current through the selected non-volatile memory cell is less than or equal to a third threshold current value, erasing the selected non-volatile memory cell and repeating the first programming process.

5. The method of claim 4, further comprising:
   performing a third programming process until a current through the selected non-volatile memory cell during a read or verify operation is less than or equal to a fourth threshold current value.

6. The method of claim 4, wherein the selected non-volatile memory cell is a split-gate flash memory cell.

7. The method of claim 4, wherein the selected non-volatile memory cell is in a vector-by-matrix multiplication array in an analog neural network.

8. A method comprising:
   performing a first programming process comprising multiple program-verify cycles, wherein a programming voltage of increasing magnitude is applied to a terminal of a selected non-volatile memory cell in each program-verify cycle after the first program-verify cycle and wherein each program-verify cycle comprises verifying that a current through the selected non-volatile memory cell during a read or verify operation is less than or equal to a first threshold current value;
   wherein when the current through the selected non-volatile memory cell during the read or verify operation is less than or equal to the first threshold current value, performing a second programming process until a current through the selected non-volatile memory cell during a read or verify operation is less than or equal to a second threshold current value, wherein the second programming process comprises applying voltage pulses of increasing magnitude to a control gate of the selected non-volatile memory cell, wherein the second programming process further comprises applying voltage pulses of decreasing magnitude to an erase gate of the selected non-volatile memory cell.

9. A method of programming a selected non-volatile memory cell to store one of N possible values, where N is an integer greater than 2, the selected non-volatile memory cell comprising a floating gate, a control gate terminal, an erase gate terminal, and a source line terminal, the method comprising:
   performing a first programming process comprising multiple program-verify cycles, wherein a first programming voltage of increasing magnitude is applied to the control gate of the selected non-volatile memory cell and a second programming voltage of decreasing magnitude is applied to the erase gate of the selected non-volatile memory cell during the programming process.

10. The method of claim 9, wherein each program-verify cycle comprises verifying that a current through the selected non-volatile memory cell during a read or verify operation is less than or equal to a first threshold current value.

11. The method of claim 9, wherein each program-verify cycle comprises:
   applying a first voltage to one of the erase gate and the control gate of the selected non-volatile memory cell;
   measuring a first current that results through the selected non-volatile memory cell;
   applying a second voltage to the one of the erase gate and the control gate of the selected non-volatile memory cell;

measuring a second current that results through the selected non-volatile memory cell;

determining a slope value based on the first voltage, the second voltage, the first current, and the second current;

determining a next programming voltage of the programming voltages of increasing and decreasing magnitude, respectively, based on the slope value;

programming the non-volatile memory cell with the next programming voltage;

repeating the steps of determining a next programming voltage and programming the non-volatile memory cell with the next programming voltage until a current through the selected non-volatile memory cell during a read or verify operation is less than or equal to a first threshold current value.

12. The method of claim 9, further comprising:

performing a second programming process until a current through the selected non-volatile memory cell during a read or verify operation is less than or equal to a second threshold current value.

13. The method of claim 12, further comprising:

performing a third programming process until a current through the selected non-volatile memory cell during a read or verify operation is less than or equal to a fourth threshold current value.

14. The method of claim 9, wherein the step of performing a first programming process further comprises:

when a current through the selected non-volatile memory cell is less than or equal to a third threshold current value, erasing the selected non-volatile memory cell and repeating the first programming process.

15. A method of programming a selected non-volatile memory cell to store one of N possible values, where N is an integer greater than 2, the selected non-volatile memory cell comprising a first gate, a first terminal, and a second terminal, the method comprising:

performing a plurality of program-verify cycles on a selected split-gate memory cell comprising a source line terminal, a control gate terminal, and a floating gate, wherein during each of the program-verify cycles a first programming voltage is applied to the source line terminal and the first programming voltage decreases with each subsequent cycle and a second programming voltage is applied to the control gate terminal and the second programming voltage increases with each subsequent cycle.

* * * * *